(12) United States Patent
Kim et al.

(10) Patent No.: US 12,069,877 B2
(45) Date of Patent: Aug. 20, 2024

(54) COMPOSITION FOR MANUFACTURING LIGHT-EMITTING DEVICE, LIGHT-EMITTING DEVICE MANUFACTURED BY THE SAME, AND METHOD OF MANUFACTURING THE LIGHT-EMITTING DEVICE

(71) Applicant: Samsung Display Co., Ltd., Yongin-si (KR)

(72) Inventors: Heunggyu Kim, Yongin-si (KR); Sehun Kim, Yongin-si (KR); Taeheon Kang, Yongin-si (KR); Hyeran Mun, Yongin-si (KR); Juyon Lee, Yongin-si (KR); Jaekook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 421 days.

(21) Appl. No.: 17/445,666

(22) Filed: Aug. 23, 2021

(65) Prior Publication Data
US 2022/0216444 A1 Jul. 7, 2022

(30) Foreign Application Priority Data
Jan. 5, 2021 (KR) .......................... 10-2021-0000984

(51) Int. Cl.
*H10K 85/60* (2023.01)
*H10K 50/11* (2023.01)
(Continued)

(52) U.S. Cl.
CPC .......... *H10K 50/11* (2023.02); *H10K 85/626* (2023.02); *H10K 85/631* (2023.02);
(Continued)

(58) Field of Classification Search
CPC .......... H10K 2101/30; H10K 2101/40; H10K 71/12; H10K 85/626; H10K 85/631;
(Continued)

(56) References Cited

U.S. PATENT DOCUMENTS

2015/0340636 A1* 11/2015 Kroeber ............... H10K 85/624
257/40
2020/0373489 A1 11/2020 Jung et al.

FOREIGN PATENT DOCUMENTS

KR 10-2015-0077588 A 7/2015
KR 10-2020-0012470 A 2/2020

OTHER PUBLICATIONS

Aizawa, Naoya et al., "Solution-processed multilayer small-molecule light-emitting devices with high-efficiency white-light emission", Nature Communications, (2014), 5:5756; DOI: 10.1038/ncomms6756, 7pp.
(Continued)

*Primary Examiner* — Evan G Clinton
(74) *Attorney, Agent, or Firm* — Lewis Roca Rothgerber Christie LLP

(57) ABSTRACT

A composition for manufacturing a light-emitting device includes: a solvent; and a first compound and a second compound, each dispersed in the solvent; wherein a molecular weight of the first compound is 750 g/mol or less, a molecular weight of the second compound is greater than 750 g/mol, a lowest unoccupied molecular orbital (LUMO) energy level of the second compound is greater than −2.4 eV, a highest occupied molecular orbital (HOMO) energy level of the second compound is less than −5.6 eV, and a bandgap energy of the second compound is greater than 3.2 eV.

19 Claims, 3 Drawing Sheets

(51) Int. Cl.
 *H10K 50/16* (2023.01)
 *H10K 71/00* (2023.01)
 *H10K 71/12* (2023.01)
 *H10K 101/30* (2023.01)
 *H10K 101/40* (2023.01)

(52) U.S. Cl.
 CPC ....... *H10K 85/636* (2023.02); *H10K 85/6576* (2023.02); *H10K 50/16* (2023.02); *H10K 71/00* (2023.02); *H10K 71/12* (2023.02); *H10K 85/6574* (2023.02); *H10K 2101/30* (2023.02); *H10K 2101/40* (2023.02)

(58) Field of Classification Search
 CPC ............. H10K 85/636; H10K 85/6576; H10K 85/6574; H10K 85/622; H10K 85/615; H10K 85/654; H10K 85/6572
 See application file for complete search history.

(56) References Cited

OTHER PUBLICATIONS

Albrecht, K. et al., "A dendrimer emitter doped in a dendrimer host: efficient thermally activated delayed fluorescence OLEDs with fully-solution processed organic-layers", Mater. Chem. Front, (2018), 2, pp. 1097-1103; DOI: 10.1039/c7qm00579b.

Kim, Kyeong Heon et al., "Small molecule host system for solution processed red phosphorescent OLEDs", Synthetic Metals, (2010), 160, pp. 631-635.

Soh, Mui Siang et al., "Solution Processable High Band Gap Hosts Based on Carbazole Functionalized Cyclic Phosphazene Cores for Application in Organic Light-Emitting Diodes", Journal of Polymer Science Part B: Polymer Physics, (2011), 49, pp. 531-539; DOI: 10.1002/polb.22197.

* cited by examiner

COMPOSITION FOR MANUFACTURING LIGHT-EMITTING DEVICE, LIGHT-EMITTING DEVICE MANUFACTURED BY THE SAME, AND METHOD OF MANUFACTURING THE LIGHT-EMITTING DEVICE

CROSS-REFERENCE TO RELATED APPLICATION

This application claims priority to and the benefit of Korean Patent Application No. 10-2021-0000984, filed on Jan. 5, 2021, in the Korean Intellectual Property Office, the entire content of which is hereby incorporated by reference.

BACKGROUND

1. Field

One or more embodiments of the present disclosure relate to a composition for manufacturing a light-emitting device, a light-emitting device manufactured by utilizing the composition, and a method of manufacturing the light-emitting device.

2. Description of the Related Art

Light-emitting devices are devices that convert electrical energy into light energy. Examples of such light-emitting devices include organic light-emitting devices in which a light-emitting material is an organic material, and quantum dot light-emitting devices in which the light-emitting material is a quantum dot.

A light-emitting device may have a structure in which a first electrode, a hole transport region, an emission layer, an electron transport region, and a second electrode are sequentially formed. Holes provided from the first electrode may move toward the emission layer through the hole transport region, and electrons provided from the second electrode may move toward the emission layer through the electron transport region. The holes and the electrons may then recombine in the emission layer to produce excitons. These excitons transition from an excited state to a ground state to thereby generate light.

SUMMARY

One or more aspects of embodiments of the present disclosure are directed towards are a composition for manufacturing a light-emitting device, a light-emitting device manufactured by the same, and a method of manufacturing the light-emitting device.

Additional aspects will be set forth in part in the description, which follows and, in part, will be apparent from the description, or may be learned by practice of the presented embodiments of the disclosure.

According to one or more embodiments, a composition for manufacturing a light-emitting device includes a solvent, and
 a first compound and a second compound, each dispersed in the solvent,
 wherein a molecular weight of the first compound may be 750 g/mol or less,
 a molecular weight of the second compound may be greater than 750 g/mol,
 a lowest unoccupied molecular orbital (LUMO) energy level of the second compound may be greater than −2.4 eV,
 a highest occupied molecular orbital (HOMO) energy level of the second compound may be less than −5.6 eV, and
 a bandgap energy of the second compound may be greater than 3.2 eV.

In one or more embodiments, a molecular weight of the first compound may be 700 g/mol or less.

In one or more embodiments, a molecular weight of the second compound may be greater than 800 g/mol.

In one or more embodiments, a band gap energy of the second compound may be greater than 3.3 eV.

In one or more embodiments, the first compound and the second compound may each be a non-dendrimeric compound.

In one or more embodiments, an average molecular weight of the first compound and the second compound may be 500 g/mol or more.

In one or more embodiments, the first compound may be greater than or equal to in amount than the second compound.

In one or more embodiments, the first compound may be greater in amount than the second compound.

In one or more embodiments, a weight ratio of the first compound to the second compound may be from 5:5 to 9:1.

In one or more embodiments, a weight ratio of the first compound to the second compound may be from 6:4 to 9:1.

In one or more embodiments, the composition for manufacturing a light-emitting device may further include a dopant.

In one or more embodiments, a sum of the first compound and the second compound may be greater in amount than the dopant.

In one or more embodiments, the dopant may include a phosphorescent dopant, a fluorescent dopant, a delayed fluorescence material, or any combination thereof.

In one or more embodiments, the solvent may include an alcohol-based solvent, an ether-based solvent, an aliphatic hydrocarbon solvent, an aromatic hydrocarbon solvent, or any combination thereof.

In one or more embodiments, the solvent may include n-octane, n-nonane, n-decane, n-undecane, n-dodecane, n-tridecane, n-tetradecane, n-pentadecane, n-hexadecane, 2-methylheptane, 3-methylheptane, 4-methylheptane, 2,2-dimethylhexane, 2,3-dimethylhexane, 2,4-dimethylhexane, 2,5-dimethylhexane, 3,3-dimethylhexane, 3-ethylhexane, 2,2,4-trimethylpentane, 2-methyloctane, 2-methylnonane, 2-methyldecane, 2-methylundecane, 2-methyldodecane, 2-methyltridecane, methylcyclohexane, ethylcyclohexane, 1,1-dimethylcyclohexane, 1,2-dimethylcyclohexane, cycloheptane, methylcycloheptane, bicyclohexyl, decalin, toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, propylanisole, 1-ethylnaphthalene, 2-ethylnaphthalene, 2-ethylbiphenyl, octylbenzene, 1,3-dipropoxybenzene, 4-methoxybenzaldehyde-dimethyl-acetal, 4,4'-difluorodiphenylmethane, diphenylether, 1,2-dimethoxy-4-(1-propenyl)benzene, 2-phenoxytoluene, diphenylmethane, 2-phenylpyridine, dimethyl benzyl ether, 3-phenoxytoluene, 3-phenylpyridine, 2-phenylanisole, 2-phenoxytetrahydrofuran, 1-propyl-4-phenyl benzene, 2-phenoxy-1,4-dimethyl benzene, ethyl-2-naphthyl-ether, dodecylbenzene, 2,2,5-tri-methyl diphenyl ether, dibenzylether, 2,3,5-tri-methyl diphenyl ether, N-methyldiphenylamine, 4-isopropylbiphenyl, α,α-dichlorodiphenylmethane, 4-(3-phenylpropyl)pyridine, methyl benzoate, ethyl benzoate, n-propyl benzoate, isopropyl benzoate, t-butyl benzoate, benzyl-benzoate, 1,1-bis(3,4-dimethylphenyl)ethane, diethyleneglycol butylmethylether (DEGBME), diethyleneglycol monomethylether (DEGME), diethyleneglycol ethylmethylether (DEGEME), diethyleneglycol dibutylether (DEGDBE), propylene glycol methylether acetate (PGMEA), triethylene glycol monomethylether (TGME), diethyleneglycolmonobutyl ether (DGBE), cyclohexylbenzene, propylene glycol methylether acetate, triethylene glycol monomethylether, diethyleneglycol monobutyl ether, or any combination thereof.

According to one or more embodiments, a light-emitting device includes a first electrode,
  a second electrode facing the first electrode, and
  an interlayer between the first electrode and the second electrode,
  wherein the interlayer includes an emission layer, and
  at least one layer included in the interlayer is formed by a solution process by using the composition for manufacturing a light-emitting device.

In one or more embodiments, the emission layer is formed by a solution process by using the composition for manufacturing a light-emitting device.

In one or more embodiments, the emission layer may include the first compound and the second compound.

In one or more embodiments, the first compound and the second compound may each be a host.

In one or more embodiments, the interlayer may further include a hole transport region between the first electrode and the emission layer and an electron transport region between the emission layer and the second electrode.

In one or more embodiments, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In one or more embodiments, the electron transport region may include an electron transport layer, and the electron transport layer may be formed by a solution process.

According to one or more embodiments, a method of manufacturing a light-emitting device including a first electrode, a second electrode, and an interlayer located between the first electrode and the second electrode and including an emission layer includes:
  forming the emission layer by a first solution process using the composition for manufacturing a light-emitting device.

In one or more embodiments, the first solution process may be spin coating, slot coating, dip coating, bar coating, roll coating, gravure coating, microgravure coating, wire coating, spray coating, inkjet printing, nozzle printing, screen printing, flexo printing, offset printing, and/or casting.

In one or more embodiments, the method of manufacturing a light-emitting device may further include, after the forming of the emission layer, forming an electron transport layer on the emission layer by a second solution process.

In one or more embodiments, the forming of the electron transport layer may include washing the emission layer out with a solvent used in the second solution process.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
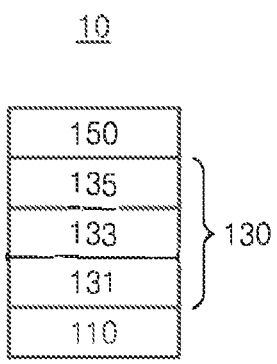
FIG. 1 shows a schematic cross-sectional view of a light-emitting device, according to one or more embodiments of the disclosure.

Reference will now be made in more detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. As used herein, expressions such as "at least one of", "one of", and "selected from", when preceding a list of elements, modify the entire list of elements and do not modify the individual elements of the list. For example, throughout the disclosure, the expression "at least one of a, b or c" indicates only a, only b, only c, both a and b, both a and c, both b and c, all of a, b, and c, or variations thereof. Further, the use of "may" when describing embodiments of the present disclosure refers to "one or more embodiments of the present disclosure".

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

It will be understood that although the terms "first," "second," etc. used herein may be used herein to describe various components, these components should not be limited by these terms. These components are only used to distinguish one component from another.

An expression used in the singular encompasses the expression of the plural, unless it has a clearly different meaning in the context.

The term "consist of" used herein refers to the existence of only the corresponding component while excluding the possibility that other components are added. For example, the wording "consist of A, B and C" refers to the existence of only A, B and C.

In the present specification, terms "include," "comprise," and/or "have" indicate that a corresponding component is present, and the possibility of adding one or more other components is not excluded. Unless defined otherwise, the terms "include," "comprise," and/or "have" may refer to both the case of consisting of the corresponding components and the case of further including other components.

It will be understood that when a layer, region, or component is referred to as being "on" or "onto" another layer, region, or component in the present specification, it may be directly formed on the other layer, region, or component (without any intervening layers, regions, or components therebetween), or indirectly formed (that is, for example, intervening layers, regions, or components may be present).

Sizes of elements in the drawings may be exaggerated for convenience of explanation. In other words, because sizes and thicknesses of components in the drawings are arbitrarily illustrated for convenience of explanation, the following embodiments are not limited thereto.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The term "molecular weight" used herein is measured using a mass spectrometer.

The terms "lowest unoccupied molecular orbital (LUMO) energy level", "highest occupied molecular orbital (HOMO) energy level", and "band gap energy" used herein may be measured by cyclic voltammetry (CV).

In one or more embodiments, an apparatus for measuring a HOMO or LUMO energy level by CV may include a cell containing a tert-butyl ammonium perchlorate or tert-butyl ammonium hexafluorophosphate solution in acetonitrile, a glassy carbon working electrode in which the sample is coated as a film, a platinum counter electrode (donor or acceptor of electrons), and a no-leak Ag/AgCl reference glass electrode. Ferrocene is added in the cell at the end of the experiment for calculation purposes.

Measurement of Potential Difference Between Ag/AgCl/Ferrocene and Sample/Ferrocene
Method and Settings:
  Glassy carbon working electrode having a diameter of 3 mm;
  Ag/AgCl no-leak reference electrode;
  Pt wire auxiliary electrode;
  0.1 M tetrabutylammonium hexafluorophosphate in acetonitrile;

$$LUMO = 4.8 - \text{ferrocene (peak to peak maximum average)} + \text{onset}$$

Sample: 1 drop of 5 mg/mL in toluene spun at 3,000 rpm
LUMO (reduction) measurement:

Excellent (or improved) reversible reduction is typically observed for thick films measured at 200 mV/s and a switching potential of −2.5 V. The reduction should be measured and compared over 10 cycles, and is, for example, measured on the third cycle. The onset is taken at the intersection of lines of best fit at the steepest part of the reduction and the baseline. HOMO and LUMO values may be measured at ambient temperature.

Composition for Manufacturing Light-Emitting Device

In the related art, when light-emitting devices are manufactured by a solution process, a hole transport region to an emission layer are formed by the solution process, and then an electron transport region (for example, an electron transport layer) on the emission layer is formed by a deposition method.

However, as the need for manufacturing large-area light-emitting devices and reducing process costs increases, research has been conducted to form not only a hole transport region and emission layer, but also an electron transport region, by a solution process.

However, there is a problem in that when layers with different compositions are stacked by a solution process, materials are mixed in an interface of each layer (for example, an interface between a hole injection layer and a hole transport layer, an interface between a hole transport layer and an emission layer, an interface between an emission layer and an electron transport layer, etc.), or in a process of forming an upper layer, a pre-formed lower layer is washed out by a solution of a composition for manufacturing the upper layer.

To solve the problem, a solvent that does not dissolve the lower layer may be used as a solvent included in a solution used in the upper layer (for example, a hole injection layer may be formed by (e.g., utilizing) an aqueous solvent and a hole transport layer may be formed by (e.g., utilizing) an organic solvent), or the lower layer may be made insoluble by performing curing by heat or UV in a process of forming the lower layer.

However, there are problems in that not only the solvent is limited, but also the process becomes complicated.

For example, in order to apply an electron transport layer by a solution process, an emission material having a certain molecular weight or more should be used to prevent or reduce a phenomenon of washing an emission layer out by a solvent of the electron transport layer, and thus a molecular weight of the emission layer material should be limited. Accordingly, a material having a large molecular weight and excellent (or suitable) organic light-emitting device (OLED) characteristics is needed. However, there are problems in that the materials satisfying such conditions are extremely limited, and a material having a small molecular weight, even with excellent OLED characteristics, may not be used.

According to the present embodiments, a composition for manufacturing a light-emitting device according to one or more embodiments of the disclosure includes: a solvent; and a first compound and a second compound, each dispersed in the solvent.

Because the first compound and the second compound are included, even when an upper layer is formed by a solution process, a problem in which a lower layer formed by the composition including the first and second compounds is washed out by a solvent of a composition for forming the upper layer may be minimized or reduced, and excellent or improved device characteristics may be exhibited.

A molecular weight of the first compound is about 750 g/mol or less.

In one or more embodiments, the first compound is not particularly limited as long as the first compound satisfies the above-described molecular weight condition among compounds suitable for utilization in (for manufacturing) a light-emitting device.

In one or more embodiments, the first compound may be a host, but embodiments of the present disclosure are not limited thereto. The host may include compounds satisfying the above-described molecular weight condition among compounds suitable for utilization as a host in an emission layer described below.

In one or more embodiments, a molecular weight of the first compound may be about 700 g/mol or less. In one or more embodiments, a molecular weight of the first compound may be about 500 g/mol or more.

A molecular weight of the second compound is greater than about 750 g/mol, a LUMO energy level of the second compound is greater than about −2.4 eV, a HOMO energy level of the second compound is less than about −5.6 eV, and a band gap energy of the second compound is greater than about 3.2 eV.

In one or more embodiments, the second compound is not particularly limited as long as the second compound satisfies the above-described molecular weight condition, a HOMO energy level range, a LUMO energy level range, and a band gap energy range among compounds suitable for utilization in (for manufacturing) a light-emitting device.

In one or more embodiments, the second compound may be a host, but embodiments of the present disclosure are not limited thereto. The host may include compounds satisfying the above-described molecular weight condition among compounds suitable for utilization as a host in an emission layer described below.

Because the second compound has a molecular weight in the range as described above, an average molecular weight of the first compound and the second compound is increased, and thus solvent resistance to an upper layer solvent may be improved, and because the second compound has a large band gap, unlike other large molecular weight compounds that do not satisfy such condition, the second compound hardly affects (e.g., does not substantially affect) electrical characteristics, and thus excellent or improved device characteristics may be exhibited.

In one or more embodiments, a molecular weight of the second compound may be greater than about 800 g/mol. In one or more embodiments, a molecular weight of the second compound may be about 1,500 g/mol or less.

In one or more embodiments, a band gap energy of the second compound may be greater than about 3.3 eV. In one or more embodiments, a band gap energy of the second compound may be about 4.0 eV or less.

In one or more embodiments, the first compound and the second compound may each be a non-dendrimeric compound. The non-dendrimeric compound is significantly different from a dendrimer in terms of a degree of branching. For example, a degree of branching of the non-dendrimeric compound is significantly lower than that of the dendrimer.

As described above, by including the non-dendrimeric compound, the composition for manufacturing a light-emitting device may exhibit an effect of reducing limitations on a structure of a composition material.

In one or more embodiments, an average molecular weight of the first compound and the second compound may be about 500 g/mol or more. In one or more embodiments, an average molecular weight of the first compound and the second compound may be about 750 g/mol or less.

In this regard, an average molecular weight of the first compound and the second compound is a sum of a value obtained by multiplying a molecular weight of the first compound by a mixing ratio (based on weight) and a value obtained by multiplying a molecular weight of the second compound by a mixing ratio (based on weight).

In one or more embodiments, an amount of the first compound may be greater than or equal to an amount of the second compound.

In one or more embodiments, an amount of the first compound may be greater than an amount of the second compound.

In one or more embodiments, a weight ratio of the first compound to the second compound may be from 5:5 to 9:1.
In one or more embodiments, a weight ratio of the first compound to the second compound may be from 6:4 to 9:1.
In one or more embodiments, a weight ratio of the first compound to the second compound may be from 5:5 to 8:2.
In one or more embodiments, a weight ratio of the first compound to the second compound may be from 7:3 to 9:1.
In one or more embodiments, a weight ratio of the first compound to the second compound may be from 5:5 to 7:3.
In one or more embodiments, a weight ratio of the first compound to the second compound may be from 5:5 to 6:4.

In one or more embodiments, the composition for manufacturing a light-emitting device may further include a dopant.

In one or more embodiments, a sum of an amount of the first compound and an amount of the second compound may be greater than an amount of the dopant.

In one or more embodiments, the dopant may include a phosphorescent dopant, a fluorescent dopant, a delayed fluorescence material, or any combination thereof. The phosphorescent dopant, the fluorescent dopant, and the delayed fluorescence material are each the same as described below.

In one or more embodiments, the solvent may include an alcohol-based solvent, an ether-based solvent, an aliphatic hydrocarbon solvent, an aromatic hydrocarbon solvent, or any combination thereof.

In one or more embodiments, the solvent may include n-octane, n-nonane, n-decane, n-undecane, n-dodecane, n-tridecane, n-tetradecane, n-pentadecane, n-hexadecane, 2-methylheptane, 3-methylheptane, 4-methylheptane, 2,2-dimethylhexane, 2,3-dimethylhexane, 2,4-dimethylhexane, 2,5-dimethylhexane, 3,3-dimethylhexane, 3-ethylhexane, 2,2,4-trimethylpentane, 2-methyloctane, 2-methylnonane, 2-methyldecane, 2-methylundecane, 2-methyldodecane, 2-methyltridecane, methylcyclohexane, ethylcyclohexane, 1,1-dimethylcyclohexane, 1,2-dimethylcyclohexane, cycloheptane, methylcycloheptane, bicyclohexyl, decalin, toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, propylanisole, 1-ethylnaphthalene, 2-ethylnaphthalene, 2-ethylbiphenyl, octylbenzene, 1,3-dipropoxybenzene, 4-methoxybenzaldehyde-dimethyl-acetal, 4,4'-difluorodiphenylmethane, diphenylether, 1,2-dimethoxy-4-(1-propenyl)benzene, 2-phenoxytoluene, diphenylmethane, 2-phenylpyridine, dimethyl benzyl ether, 3-phenoxytoluene, 3-phenylpyridine, 2-phenylanisole, 2-phenoxytetrahydrofuran, 1-propyl-4-phenyl benzene, 2-phenoxy-1,4-dimethyl benzene, ethyl-2-naphthyl-ether, dodecylbenzene, 2,2,5-tn-methyl diphenyl ether, dibenzyl-ether, 2,3,5-tri-methyl diphenyl ether, N-methyldiphenylamine, 4-isopropylbiphenyl, α,α-dichlorodiphenylmethane, 4-(3-phenylpropyl)pyridine, methyl benzoate, ethyl benzoate, n-propyl benzoate, isopropyl benzoate, t-butyl benzoate, benzyl-benzoate, 1,1-bis(3,4-dimethylphenyl)ethane, diethyleneglycol butylmethylether (DEGBME), diethyleneglycol monomethylether (DEGME), diethyleneglycol ethylmethylether (DEGEME), diethyleneglycol dibutylether (DEGDBE), propylene glycol methylether acetate (PGMEA), triethylene glycol monomethylether (TGME), diethyleneglycolmonobutyl ether (DGBE), cyclohexylbenzene, propylene glycol methylether acetate, triethylene glycol monomethylether, diethyleneglycol monobutyl ether, or any combination thereof.

Additive

The composition for manufacturing a light-emitting device may further include an additive for the purpose of controlling an energy band level, controlling charge mobility, improving coating uniformity, and/or the like.

The additive may include a dispersant, an adhesion promoter, a leveling agent, an antioxidant, an ultraviolet ray absorbent, or any combination thereof.

In one or more embodiments, the composition for manufacturing a light-emitting device may further include a dispersant to improve dispersities (e.g., dispersion) of the first compound and the second compound.

The dispersant may be used to prevent or reduce aggregation of the first compound and the second compound in the composition for manufacturing a light-emitting device and to impart a role of a protective layer of the first compound and the second compound during a soluble process (e.g., a solution process).

The dispersant may include anionic, cationic, and/or nonionic polymer materials.

An amount of the dispersant may be from about 10 wt % to about 50 wt %, for example, about 15 wt % to about 30 wt %, based on 100 wt % of the first compound and the second compound. When the amount of the dispersant is within the above-described range, the aggregation of the first compound and the second compound in the composition for manufacturing a light-emitting device may be substantially prevented or reduced, and the dispersant may perform the role of a protective layer of the first compound and the second compound.

The adhesion promoter may be added to improve adhesion to a substrate and may include a silane coupling agent having a reactive substituent selected from the group consisting of a carboxyl group, a methacryloyl group, an isocyanate group, an epoxy group, and a combination thereof, but embodiments of the present disclosure are not limited thereto. In one or more embodiments, the silane coupling agent may include trimethoxysilylbenzoic acid, γ-methacryloxypropyltrimethoxysilane, vinyltriacetoxysilane, vinyltrimethoxysilane, γ-isocyanate propyl triethoxysilane, γ-glycidoxypropyltrimethoxysilane, β-(3,4-epoxycyclohexyl)ethyltrimethoxysilane, or any combination thereof.

The leveling agent may be added to improve coating properties of the composition for manufacturing a light-emitting device. The leveling agent may include, for example, a silicon-based compound, a fluorine-based compound, a siloxane-based compound, an nonionic surfactant, an ionic surfactant, a titanate coupling agent, and/or the like, but embodiments of the present disclosure are not limited thereto. In one or more embodiments, the leveling agent may include a silicon-based compound, a fluorine-based compound, or any combination thereof.

The silicon-based compound is not particularly limited, and may include dimethyl silicon, methyl silicon, phenyl silicon, methyl phenyl silicon, alkyl modified silicon, alkoxy modified silicon, polyether modified silicon, and/or the like. In one or more embodiments, as the silicon-based compound, dimethyl silicon, methyl phenyl silicon, and/or the like may be utilized.

The fluorine-based compound is not particularly limited, and may include polytetrafluoroethylene, polyvinylidene fluoride, fluoro alkylmethacrylate, perfluoropolyether, perfluoro alkylethylene oxide, and/or the like. In one or more embodiments, as the fluorine-based compound, polytetrafluoroethylene may be utilized.

The siloxane-based compound is not particularly limited, and may include a dimethyl siloxane compound (Product name: KF96L-1, KF96L-5, KF96L-10, KF96L-100, products of Shin-Etsu Silicone).

The above-described leveling agent may be used alone or may be used in combination of two or more types (e.g., kinds) of leveling agent.

An amount of the leveling agent may vary according to a desired performance, and may be from about 0.001 wt % to about 5 wt %, for example, from about 0.001 wt % to about 1 wt %, based on the total weight of the composition for manufacturing a light-emitting device. When the amount of the leveling agent is within the above-described range, fluidity and film uniformity of the composition for manufacturing a light-emitting device may be improved.

The composition for manufacturing a light-emitting device may be utilized to manufacture a light-emitting device. The composition for manufacturing a light-emitting device has excellent or improved inkjet discharging stability, and thus, may be, for example, a composition for manufacturing a light-emitting device for inkjet printing, but is not limited thereto.

Light-Emitting Device

A light-emitting device according to one or more embodiments of the disclosure includes: a first electrode; a second electrode facing the first electrode; and an interlayer between the first electrode and the second electrode, wherein the interlayer includes an emission layer, and at least one layer included in the interlayer may be formed using the above-described composition for manufacturing a light-emitting device.

The term "interlayer" as used herein refers to a single layer and/or a plurality of layers between a first electrode and a second electrode of a light-emitting device. A material included in the "middle layer" is not limited to an organic material.

Description of FIG. 1

FIG. 1 is a schematic cross-sectional view of a light-emitting device 10 according to one or more embodiments of the disclosure. The light-emitting device 10 includes a first electrode 110, an interlayer 130 and a second electrode 150, and the interlayer 130 includes an emission layer 133.

In one or more embodiments, the emission layer 133 is formed by a solution process by using the composition for manufacturing a light-emitting device of the present embodiments.

In one or more embodiments, the emission layer 133 may include the first compound and the second compound.

In one or more embodiments, the first compound and the second compound may each be a host.

In one or more embodiments, the emission layer 133 may include a fluorescent dopant. The dopant may be the same as described in connection with a dopant in the emission layer 133, which will be described below.

In one or more embodiments, the interlayer 130 may further include a hole transport region 131 between the first electrode 110 and the emission layer 133, and an electron transport region 135 between the emission layer 133 and the second electrode 150.

In one or more embodiments, the hole transport region 131 may include a hole injection layer, a hole transport layer, an emission auxiliary layer, an electron blocking layer, or any combination thereof.

The electron transport region 135 may include a buffer layer, a hole blocking layer, an electron control layer, an electron transport layer, an electron injection layer, or any combination thereof.

In one or more embodiments, at least one layer included in the hole transport region 131 and the electron transport region 135 may be formed using the composition for manufacturing a light-emitting device.

In one or more embodiments, the electron transport region 135 may include an electron transport layer, and the electron transport layer may be formed by a solution process.

Hereinafter, the structure of the light-emitting device 10 according to one or more embodiments and a method of manufacturing the light-emitting device 10 will be described in connection with FIG. 1.

First Electrode 110

In FIG. 1, a substrate may be additionally located under the first electrode 110 or above the second electrode 150. As the substrate, a glass substrate or a plastic substrate may be used. In one or more embodiments, the substrate may be a flexible substrate, and may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode.

The first electrode 110 may have a single-layered structure including (e.g., consisting of) a single layer or a multilayer structure including a plurality of layers. For example, the first electrode 110 may have a three-layered structure of ITO/Ag/ITO.

Interlayer 130

The interlayer 130 may be located on the first electrode 110. The interlayer 130 may include an emission layer 133.

The interlayer 130 may further include a hole transport region 131 between the first electrode 110 and the emission layer 133 and an electron transport region 133 between the emission layer 133 and the second electrode 150.

The interlayer 130 may further include metal-containing compounds such as organometallic compounds, inorganic materials such as quantum dots, and/or the like, in addition to various organic materials.

In one or more embodiments, the interlayer 130 may include, i) two or more emitting units sequentially stacked between the first electrode 110 and the second electrode 150 and ii) a charge generation layer located between the two emitting units. When the interlayer 130 includes the emitting unit and the charge generation layer as described above, the light-emitting device 10 may be a tandem light-emitting device.

Hole Transport Region 131 in Interlayer 130

The hole transport region 131 may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region 131 may include a hole injection layer, a hole transport layer, an emission auxiliary layer, an electron blocking layer, or any combination thereof.

For example, the hole transport region 131 may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region 131 may include a compound represented by Formula 201, a compound represented by Formula 202, or any combination thereof:

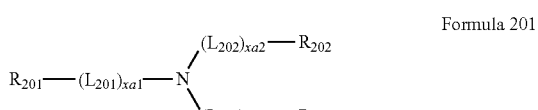

Formula 201

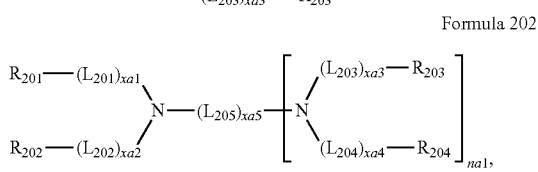

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer selected from 0 to 5, xa5 may be an integer selected from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer selected from 1 to 4.

In one or more embodiments, each of Formulae 201 and 202 may include at least one group represented by any of Formulae CY201 to CY217:

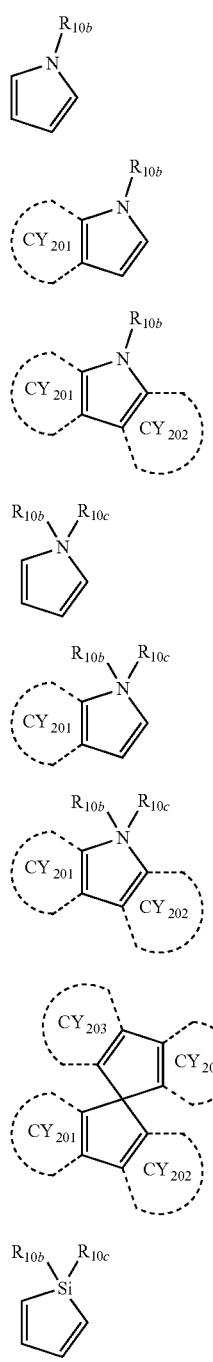

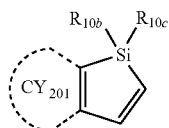

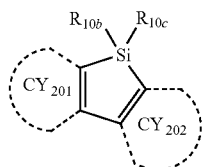

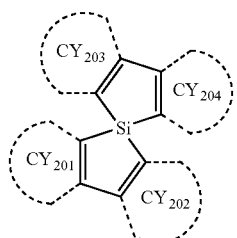

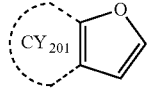

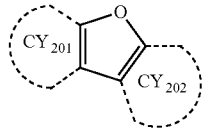

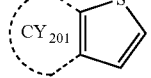

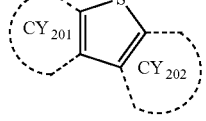

$R_{10b}$ and $R_{10c}$ in Formulae CY201 to CY217 are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae $CY_{201}$ to $CY_{217}$ may be unsubstituted or substituted with $R_{10a}$ as described above.

In one or more embodiments, ring $CY_{201}$ to ring $CY_{204}$ in Formulae $CY_{201}$ to $CY_{217}$ may each independently be a benzene group, a naphthalene group, a phenanthrene group, or an anthracene group.

In one or more embodiments, each of Formulae 201 and 202 may include at least one group represented by any of Formulae CY201 to CY203.

In one or more embodiments, Formula 201 may include at least one group represented by any of Formulae CY201 to CY203 and at least one group represented by any of Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include groups represented by Formulae CY201 to CY203.

In one or more embodiments, each of Formulae 201 and 202 may not include groups represented by Formulae CY201 to CY203, and may include at least one group represented by any of Formulae CY204 to CY217.

In one or more embodiments, each of Formulae 201 and 202 may not include groups represented by Formulae CY201 to CY217.

In one or more embodiments, the hole transport region 131 may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), Poly[(9,9-dioctylfluorenyl-2,7-diyl)-co-(4,4'-(N-(4-sec-butylphenyl)diphenylamine)] (TFB), or any combination thereof:

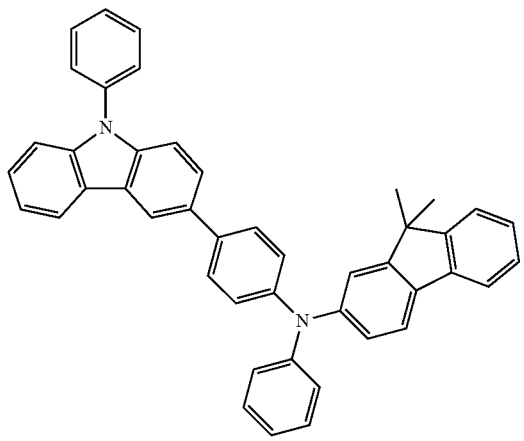

HT1

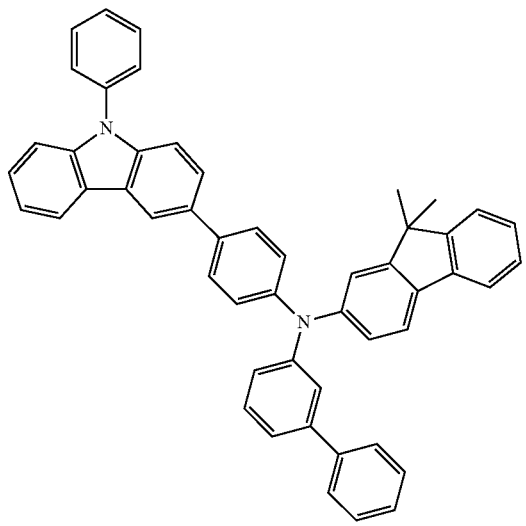

HT2

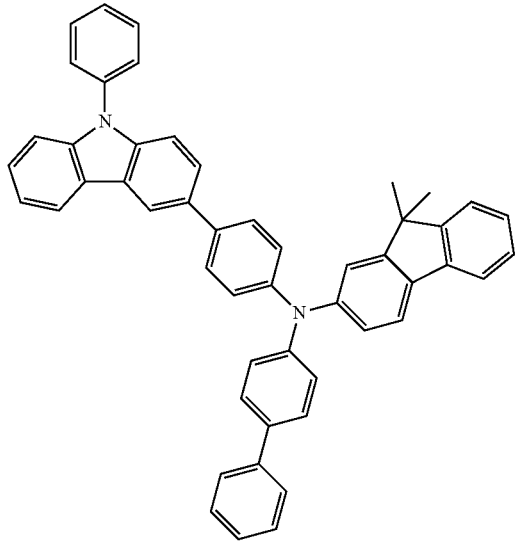

HT3

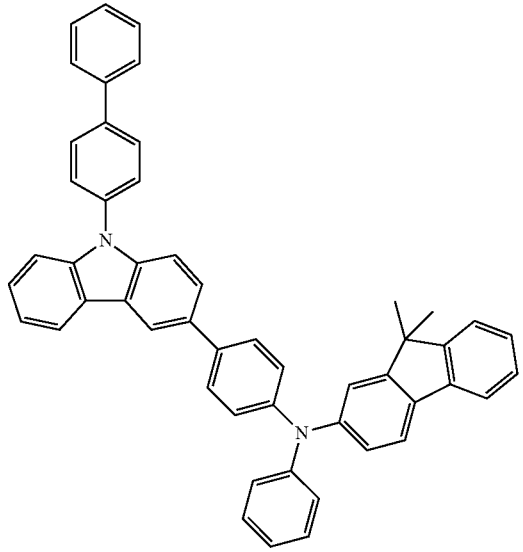

HT4

-continued
HT5
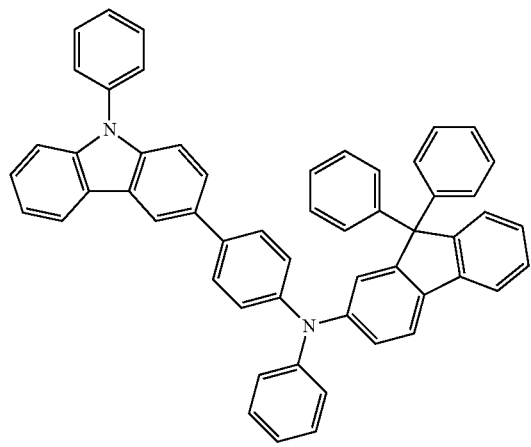
HT6
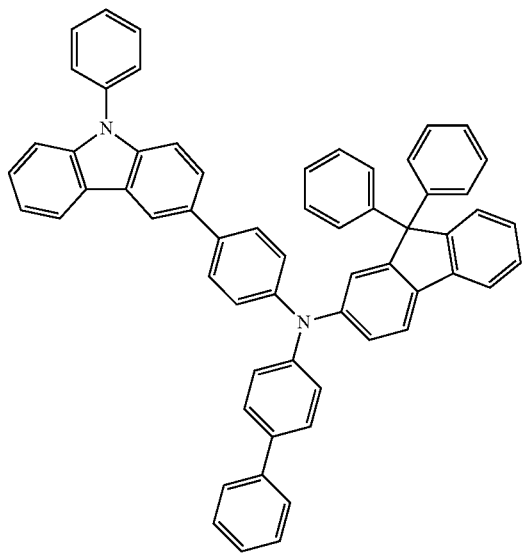
HT7
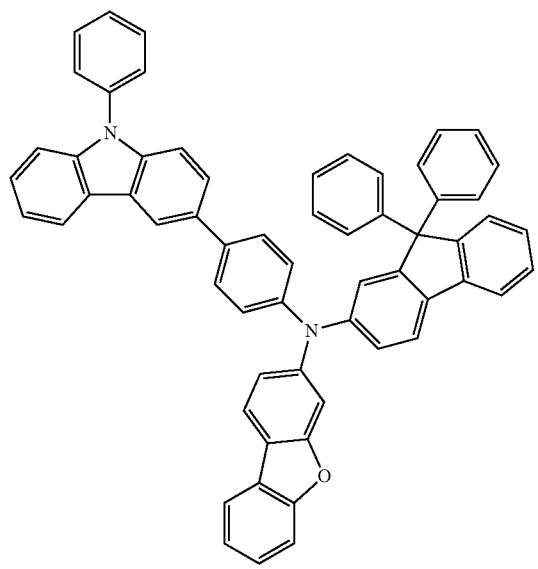
HT8
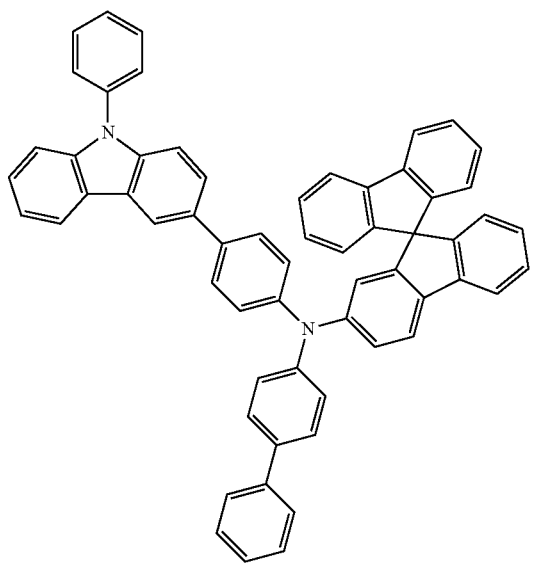

-continued
HT9
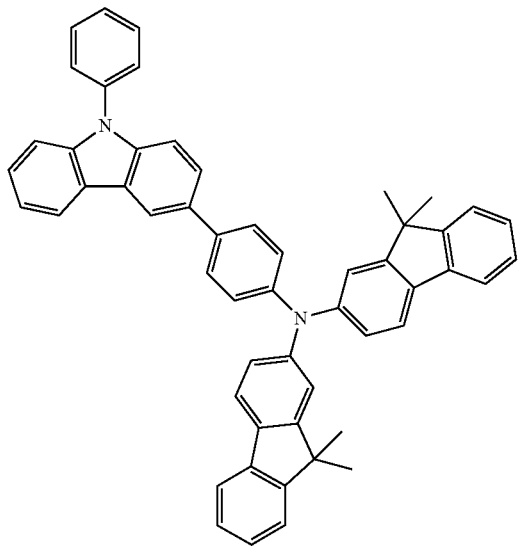
HT10
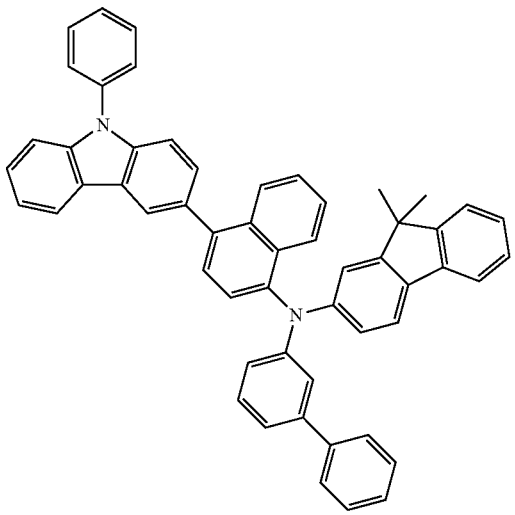
HT11
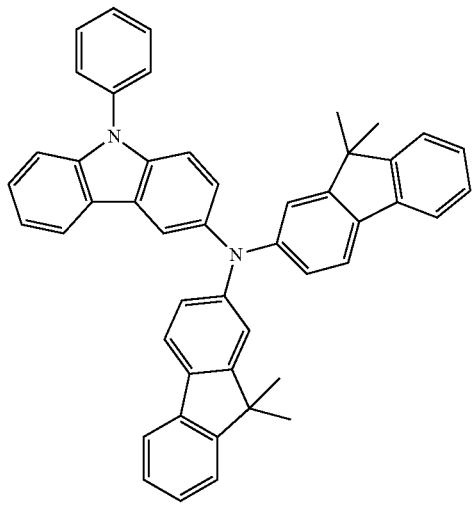
HT12
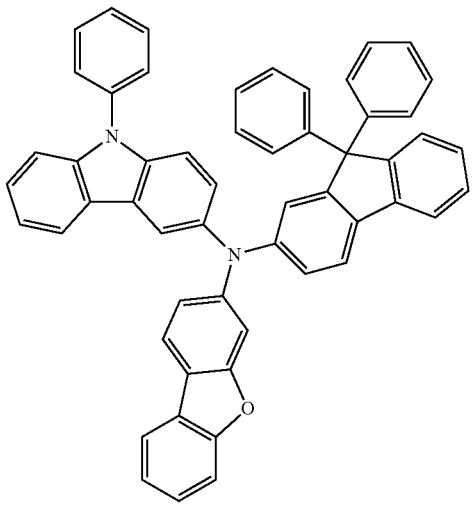
HT13
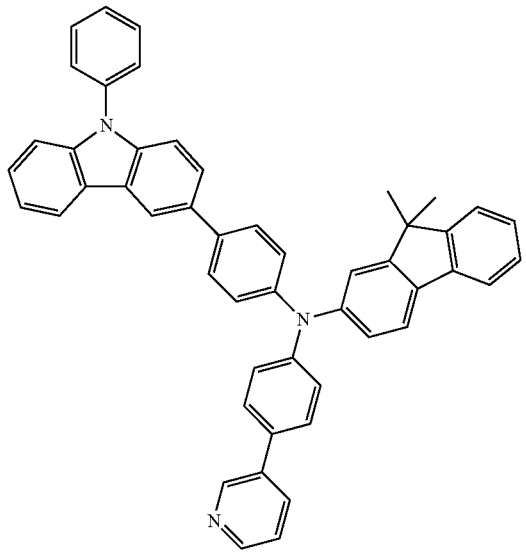
HT14
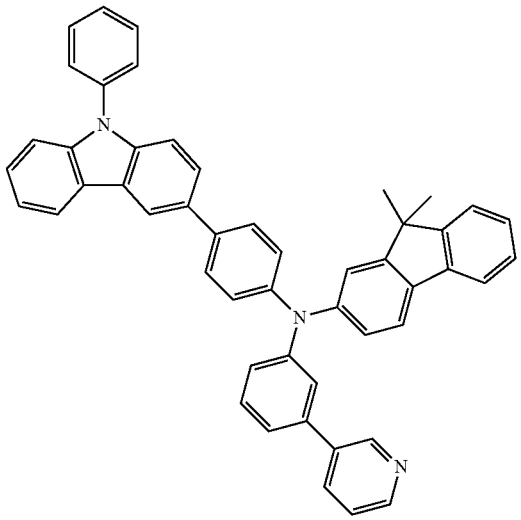

-continued
HT15
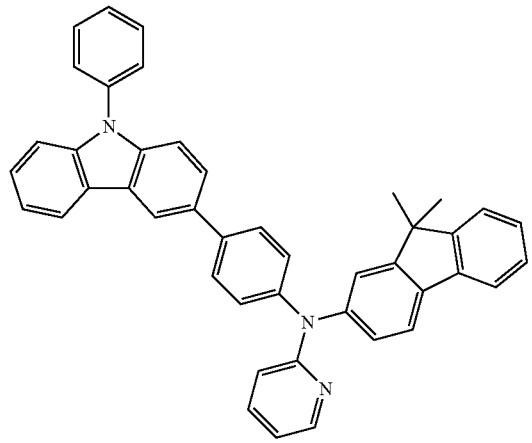
HT16
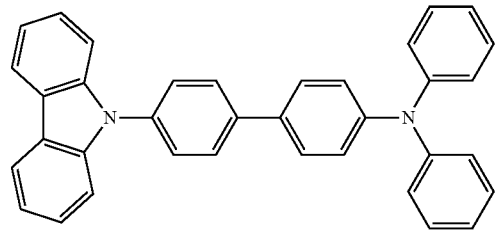
HT17
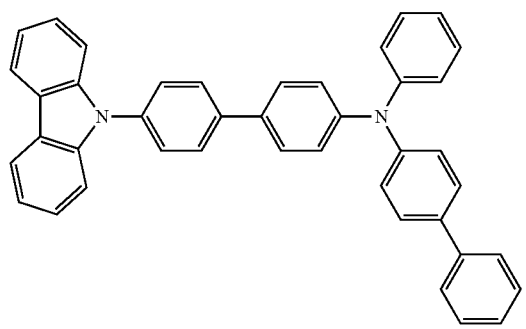
HT18
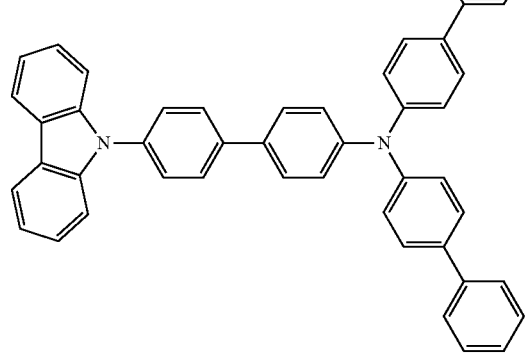
HT19
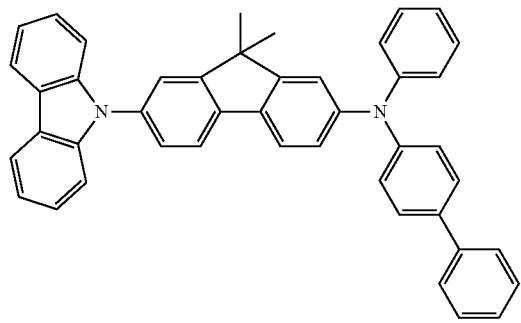
HT20
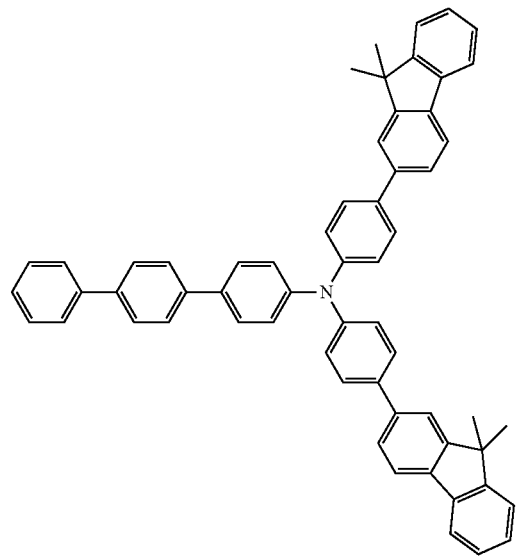

HT21
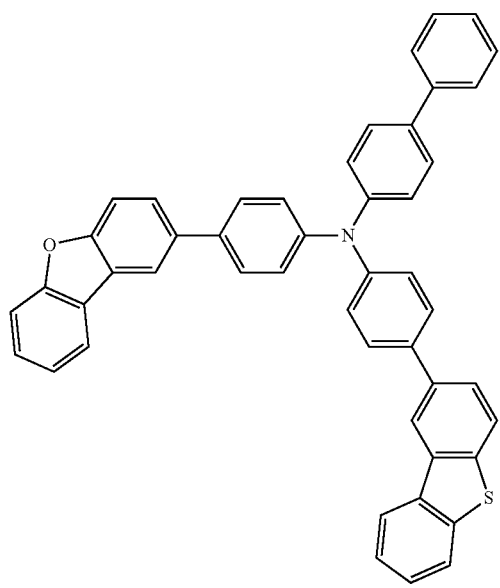
HT22
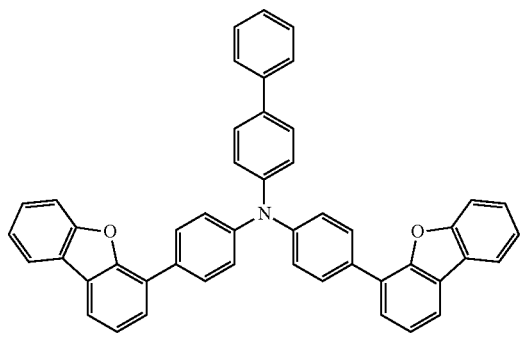
HT23
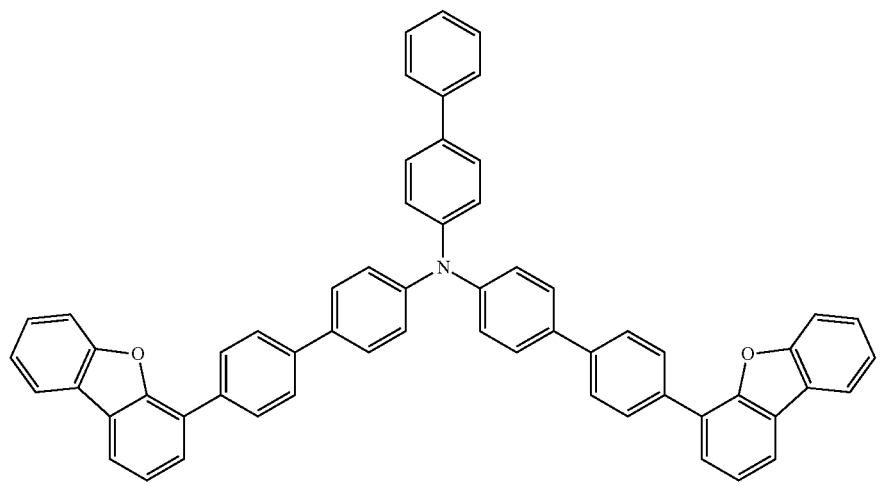
HT24
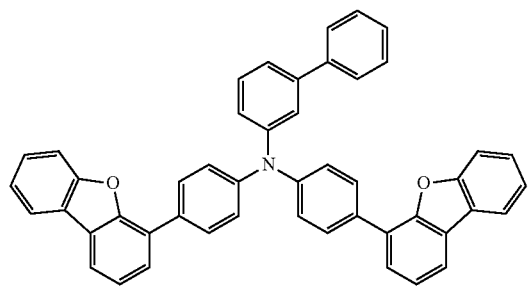
HT25
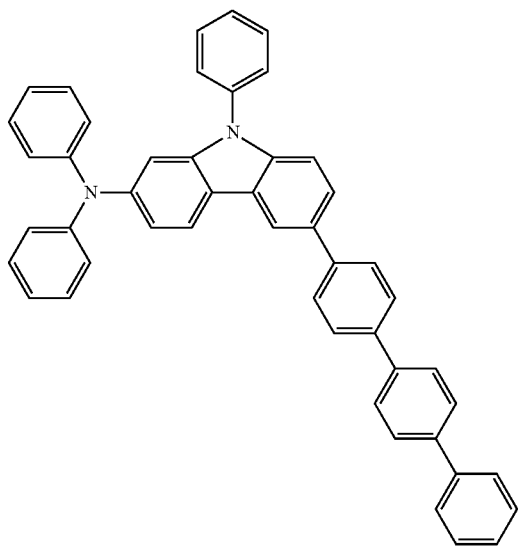

-continued
HT26
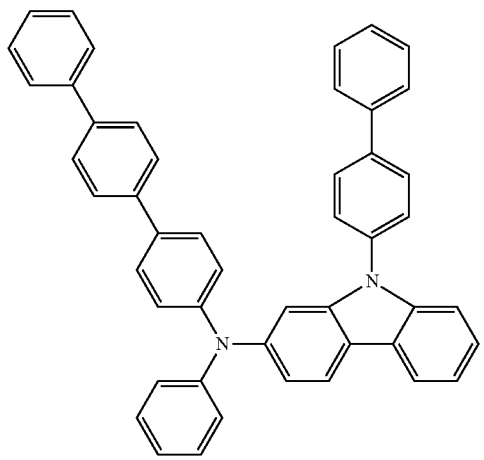
HT27
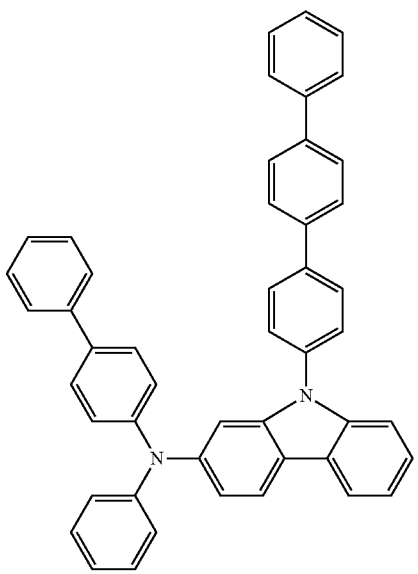
HT28
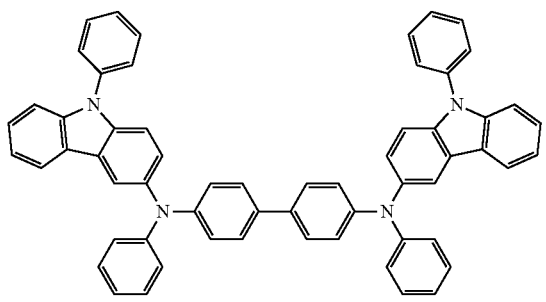
HT29
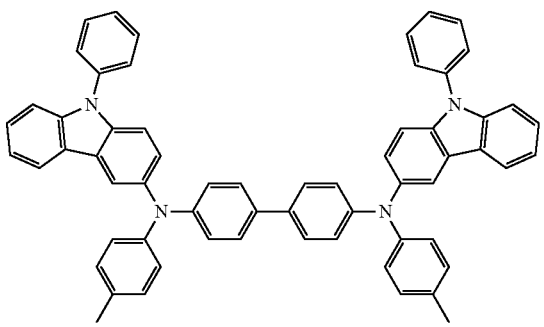
HT30
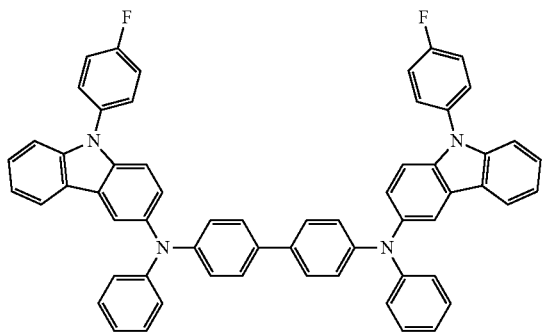
HT31
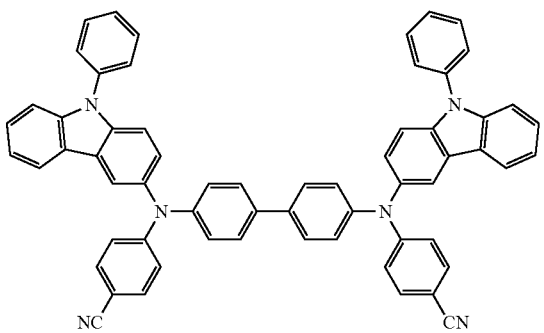

-continued
HT32
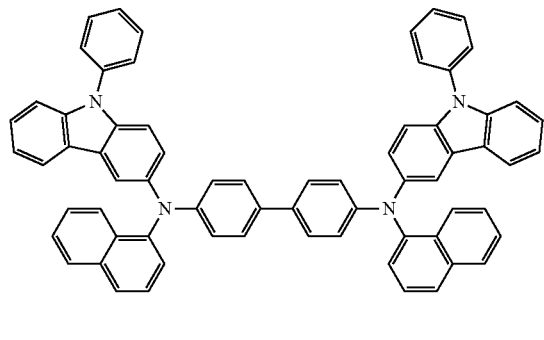
HT33
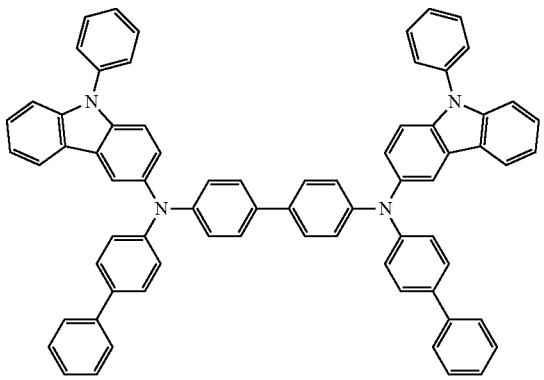
HT34
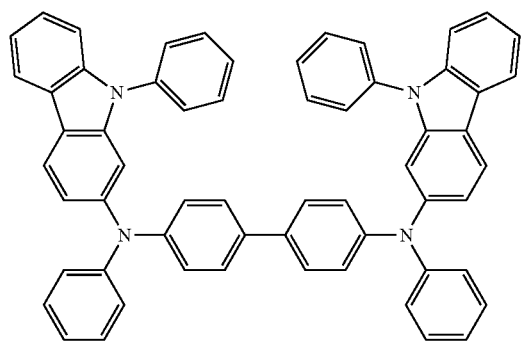
HT35
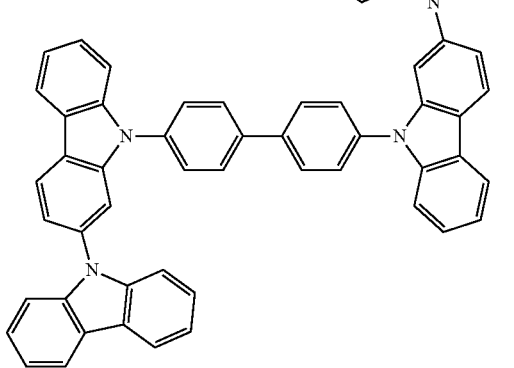
HT36
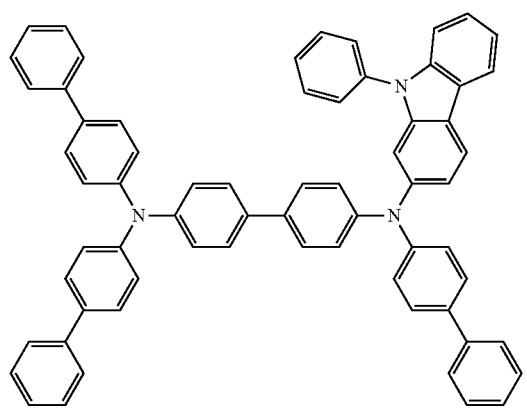
HT37
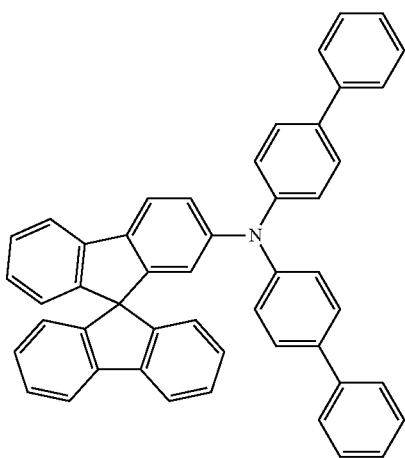

-continued
HT38
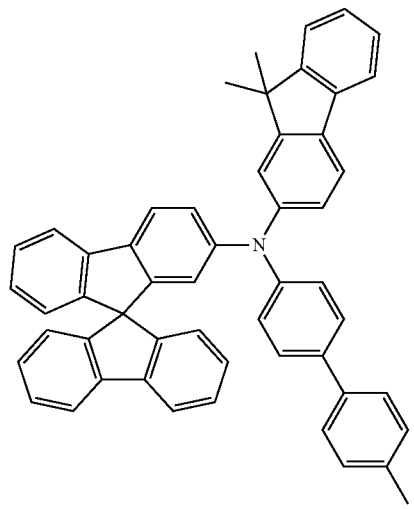
HT39
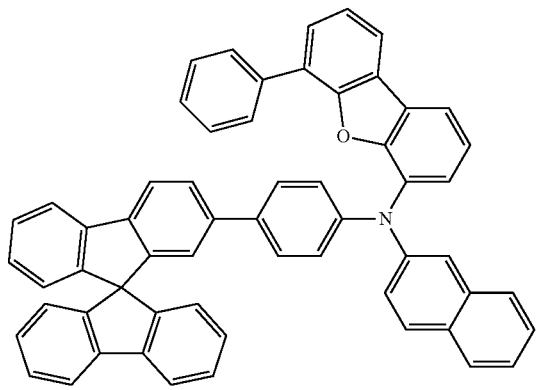
HT40
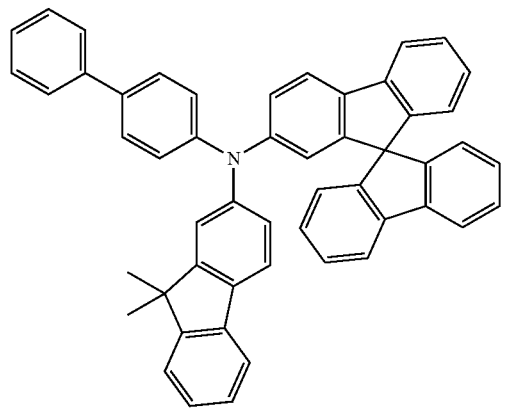
HT41
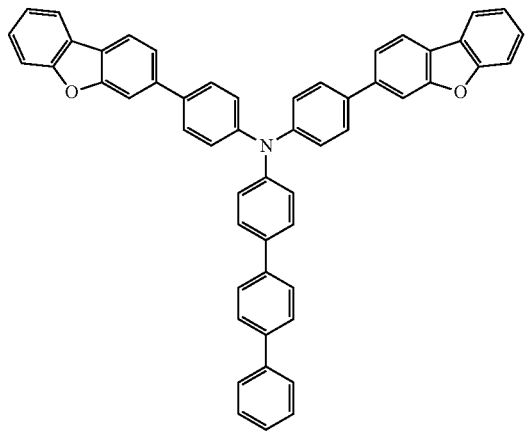
HT42
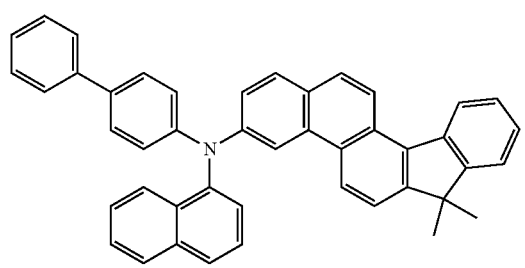
HT43
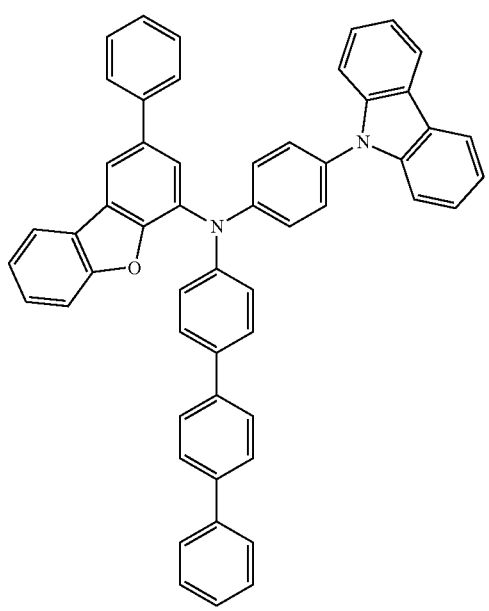

-continued
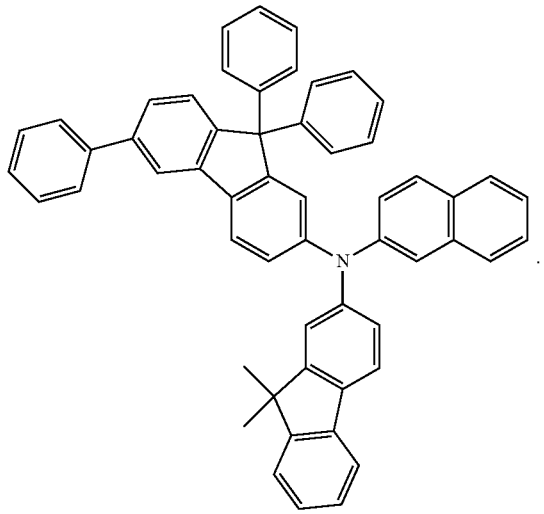
HT44
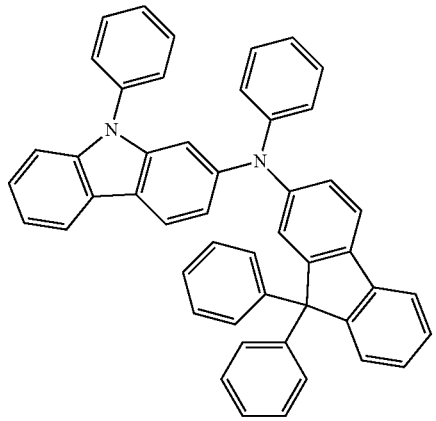
HT45
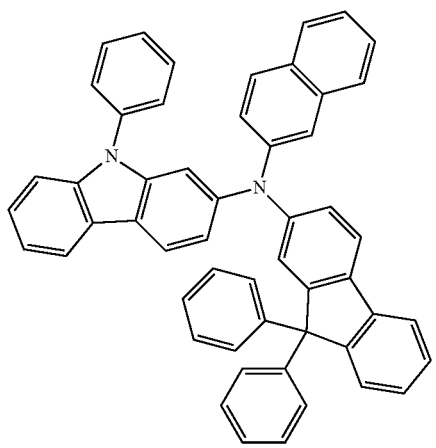
HT46
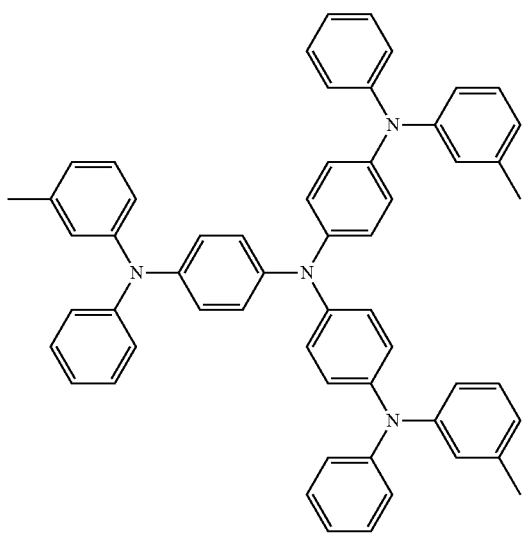
m-MTDATA
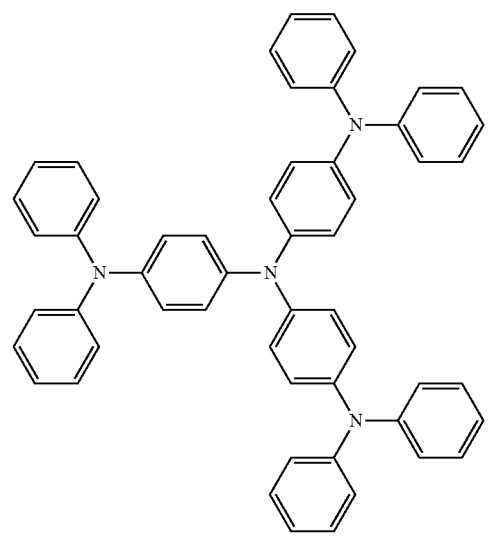
TDATA -continued
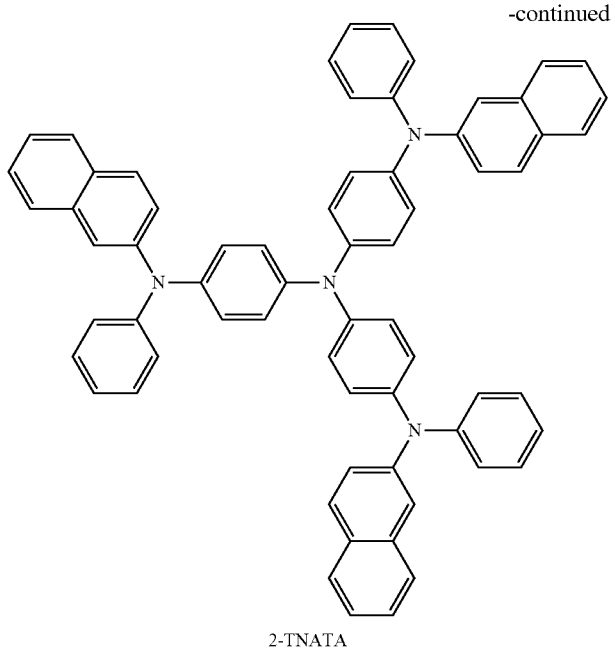
2-TNATA
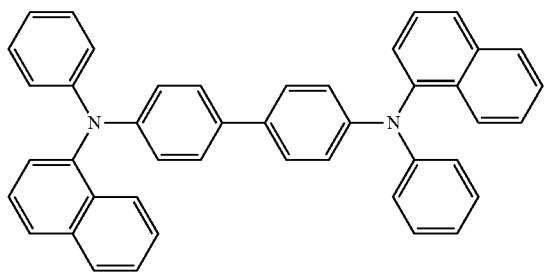
NPB
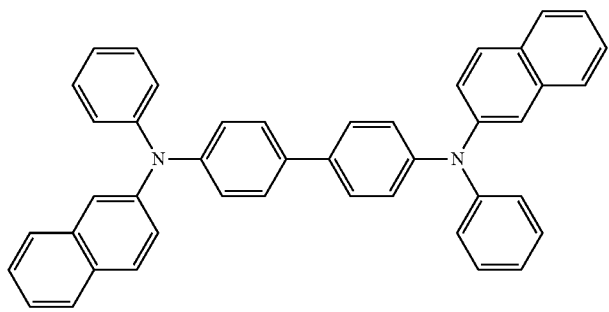
β-NPB
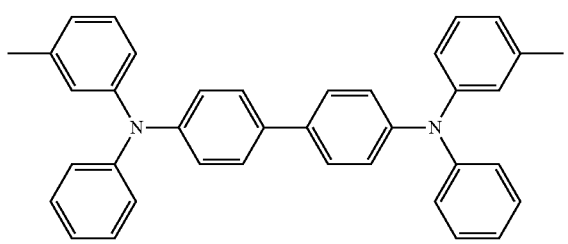
TPD
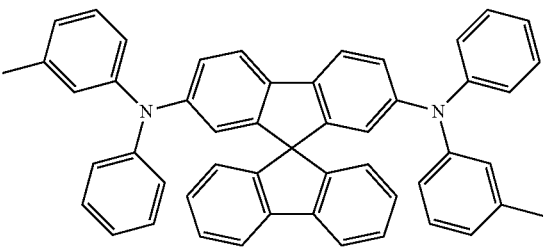
Spiro-TPD -continued

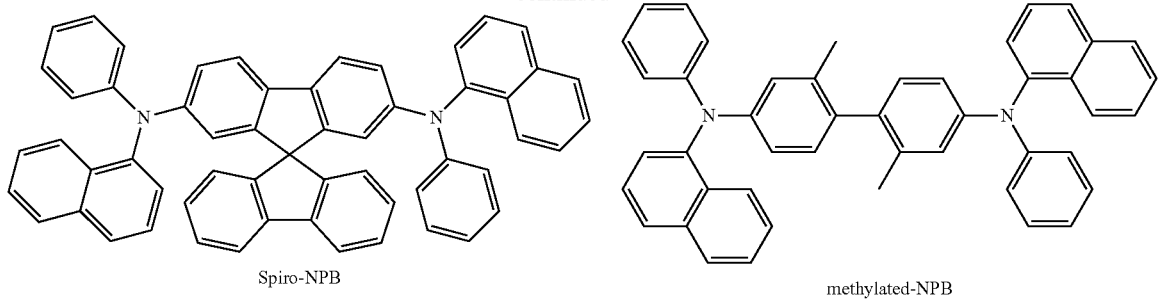

Spiro-NPB methylated-NPB

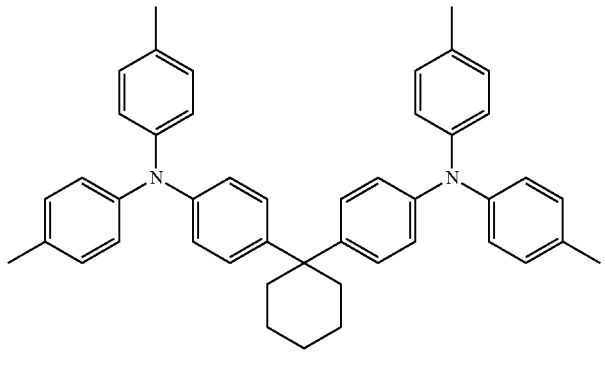

TAPC

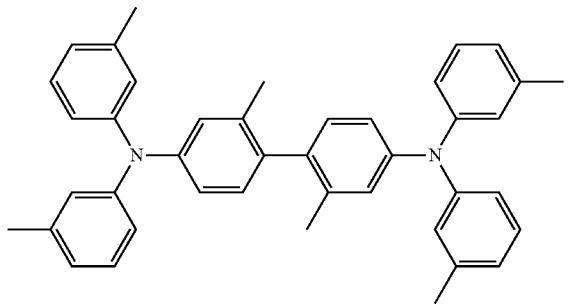

HMTPD

A thickness of the hole transport region 131 may be in a range of about 50 Å about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region 131, the hole injection layer and the hole transport layer are within their respective ranges, satisfactory or suitable hole transporting characteristics may be obtained without a substantial increase in driving voltage.

The emission auxiliary layer may increase light-emission efficiency by compensating for an optical resonance distance according to the wavelength of light emitted by the emission layer 133, and the electron blocking layer may block or reduce the leakage of electrons from an emission layer to a hole transport region. Any of the materials that may be included in the hole transport region may be included in the emission auxiliary layer and/or the electron blocking layer.

p-Dopant

The hole transport region 131 may further include, in addition to the materials described above, a charge-generation material for the improvement of conductive properties. The charge-generation material may be uniformly or non-uniformly dispersed in the hole transport region 131 (for example, in the form of a single layer including (e.g., consisting of) a charge-generation material).

The charge-generation material may be, for example, a p-dopant.

In one or more embodiments, a lowest unoccupied molecular orbital (LUMO) energy level of the p-dopant may be about −3.5 eV or less.

In one or more embodiments, the p-dopant may include a quinone derivative, a cyano group-containing compound, a compound containing element EL1 and element EL2, or any combination thereof.

Examples of the quinone derivative may include TCNQ, F4-TCNQ, and the like.

Examples of the cyano group-containing compound may include HAT-CN, a compound represented by Formula 221 below, and the like:

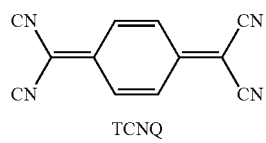

TCNQ

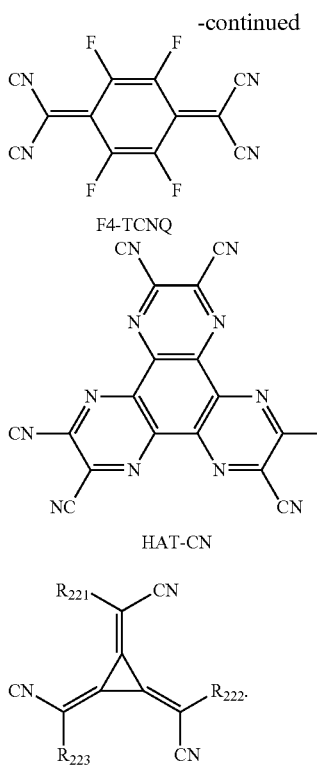

F4-TCNQ

HAT-CN

Formula 221

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be metal, metalloid, or a combination thereof, and element EL2 may be non-metal, metalloid, or a combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and halogen (for example, F, Cl, Br, I, etc.).

In one or more embodiments, examples of the compound containing element EL1 and element EL2 may include metal oxide, metal halide (for example, metal fluoride, metal chloride, metal bromide, and/or metal iodide), metalloid halide (for example, metalloid fluoride, metalloid chloride, metalloid bromide, and/or metalloid iodide), metal telluride, or any combination thereof.

Examples of the metal oxide may include tungsten oxide (for example, $WO$, $W_2O_3$, $WO_2$, $WO_3$, $W_2O_5$, etc.), vanadium oxide (for example, $VO$, $V_2O_3$, $VO_2$, $V_2O_5$, etc.), molybdenum oxide ($MoO$, $Mo_2O_3$, $MoO_2$, $MoO_3$, $Mo_2O_5$, etc.), and rhenium oxide (for example, $ReO_3$, etc.).

Examples of the metal halide may include alkali metal halide, alkaline earth metal halide, transition metal halide, post-transition metal halide, and lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, and $SmI_3$.

Examples of the metalloid halide may include antimony halide (for example, $SbCl_5$, etc.).

Examples of the metal telluride may include alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer 133 in Interlayer 130

When the light-emitting device 10 is a full-color light-emitting device, the emission layer 133 may be patterned into a red emission layer, a green emission layer, and/or a blue emission layer, according to a subpixel. In one or more embodiments, the emission layer 133 may have a stacked structure of two or more layers of a red emission layer, a green emission layer, and a blue emission layer, in which the two or more layers contact each other or are separated from each other. In one or more embodiments, the emission layer may include two or more materials of a red light-emitting material, a green light-emitting material, and a blue light-emitting material, in which the two or more materials are mixed with each other in a single layer to emit white light.

The emission layer 133 may include a host and a dopant. The dopant may include a phosphorescent dopant, a fluorescent dopant, or any combination thereof.

The amount of the dopant in the emission layer 133 may be from about 0.01 to about 15 parts by weight based on 100 parts by weight of the host.

In one or more embodiments, the emission layer 133 may include a quantum dot.

In one or more embodiments, the emission layer 133 may include a delayed fluorescence material. The delayed fluorescence material may act as a host or a dopant in the emission layer 133.

A thickness of the emission layer 133 may be in a range of about 100 Å to about 1,000 Å, for example, about 200 Å to about 600 Å. When the thickness of the emission layer 133 is within any of these ranges, excellent or improved light-emission characteristics may be obtained without a substantial increase in driving voltage.

Host

The host may include a compound represented by Formula 301 below:

$$[Ar_{301}]_{xb11}-[(L_{301})_{xb1}-R_{301}]_{xb21},$$ Formula 301 wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer selected from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer selected from 1 to 5, and $Q_{301}$ to $Q_3$s are the same as described in connection with $Q_1$.

In one or more embodiments, when xb11 in Formula 301 is 2 or more, two or more of $Ar_{301}(s)$ may be linked to each other via a single bond.

In one or more embodiments, the host may include a compound represented by Formula 301-1, a compound represented by Formula 301-2, or any combination thereof:

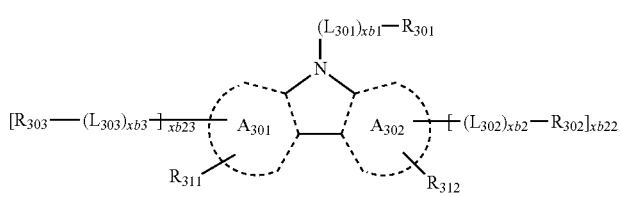

Formula 301-1

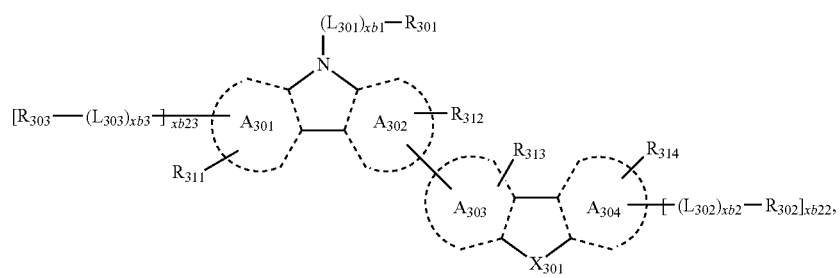

Formula 301-2 wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ are the same as described in the present specification, $L_{302}$ to $L_{304}$ are each independently the same as described in connection with $L_{301}$, xb2 to xb4 are each independently the same as described in connection with xb1, and $R_{302}$ to $R_{305}$ and $R_{311}$ to $R_{314}$ are each the same as described in connection with $R_{301}$.

In one or more embodiments, the host may include an alkali earth metal complex, a post-transition metal complex, or a combination thereof. In one or more embodiments, the host may include a Be complex (for example, Compound H55), an Mg complex, a Zn complex, or a combination thereof.

In one or more embodiments, the host may include one of Compounds H1 to H125, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), 3,3-di(9H-carbazol-9-yl)biphenyl (mCBP), or any combination thereof:

H1
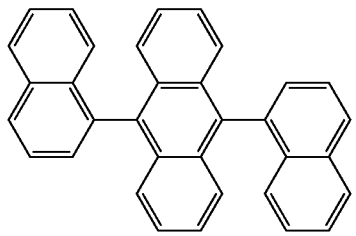

H2
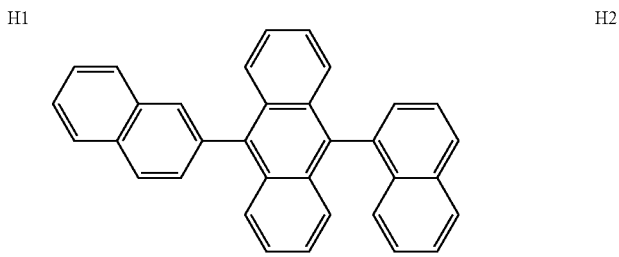

H3
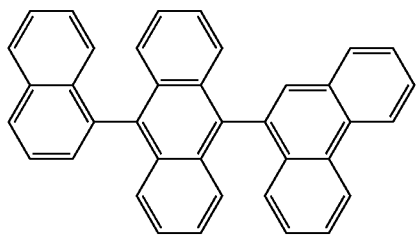

H4
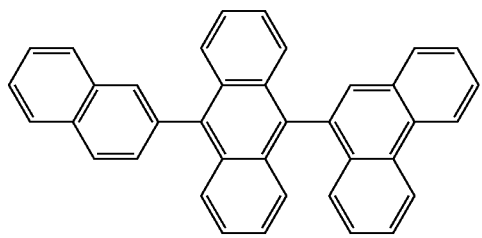

H5
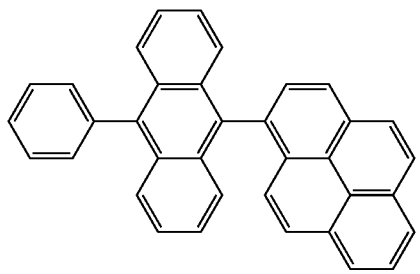

H6
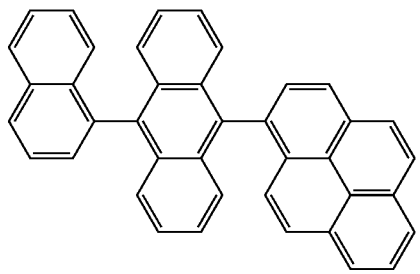

H7
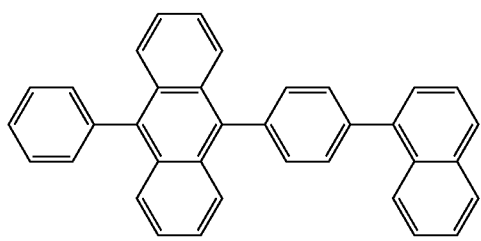

H8
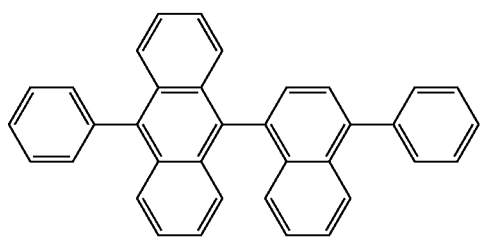

H9
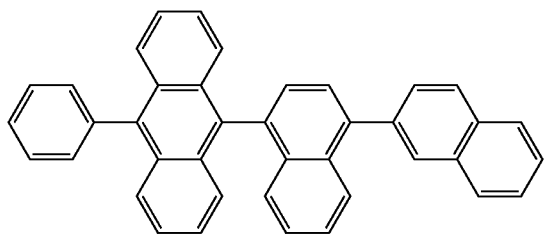

H10
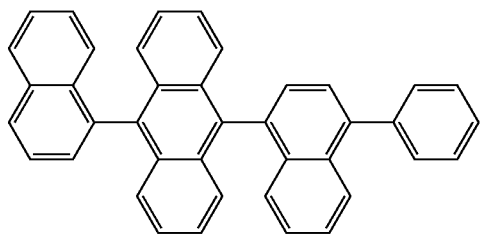

-continued
H11
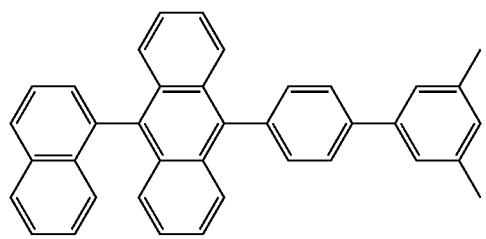
H12
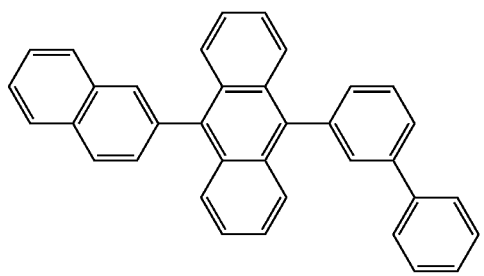
H13
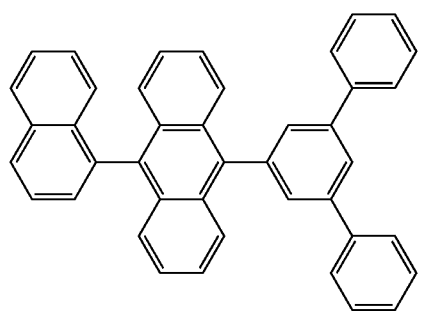
H14
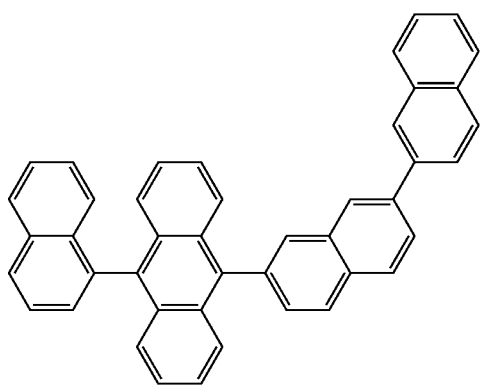
H15
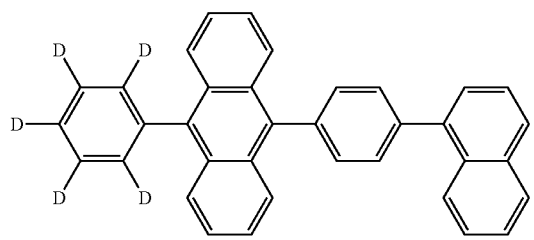
H16
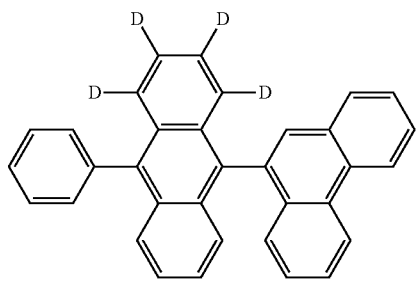
H17
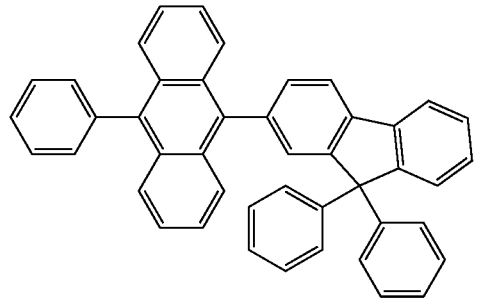
H18
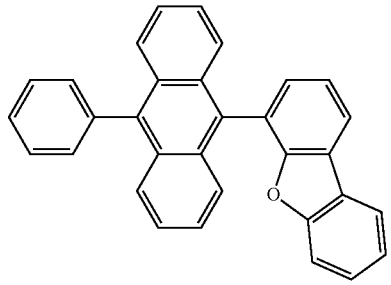
H19
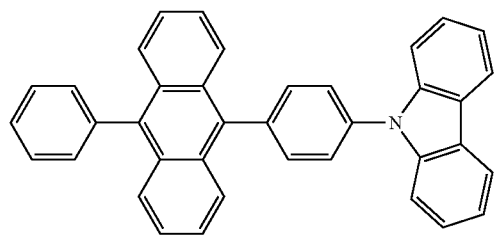
H20
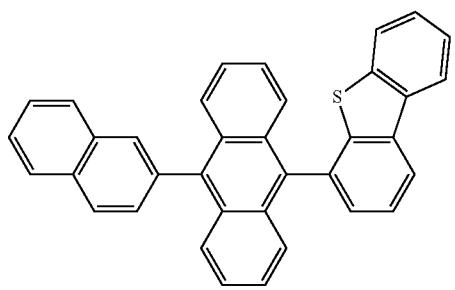

-continued
H21
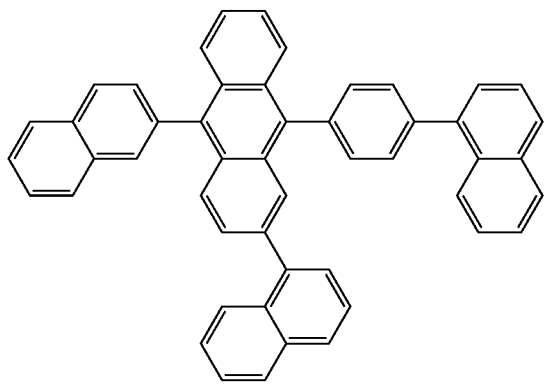
H22
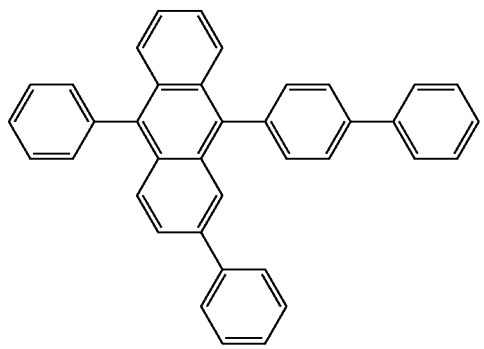
H23
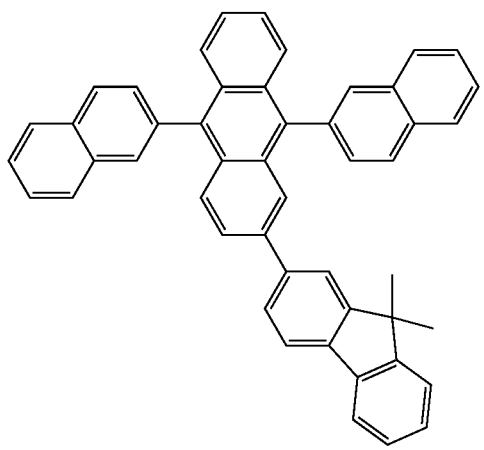
H24
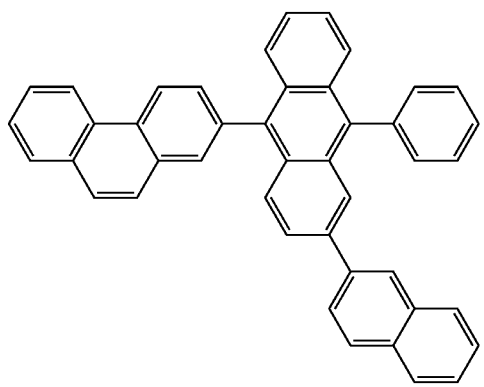
H25
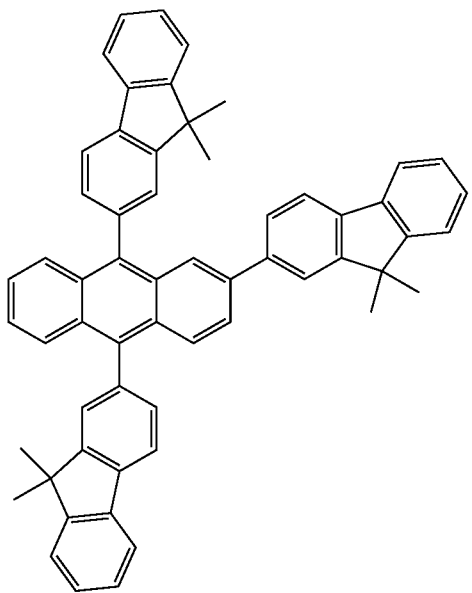
H26
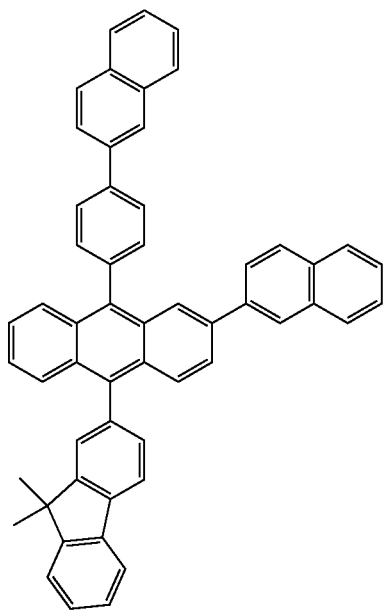

-continued
H27
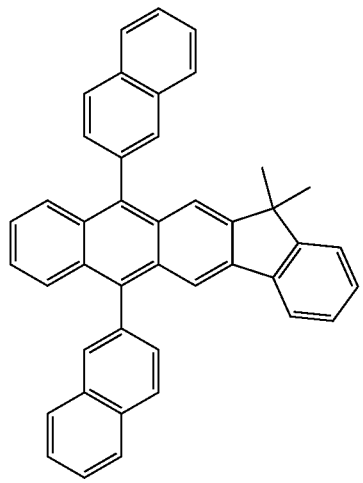
H28
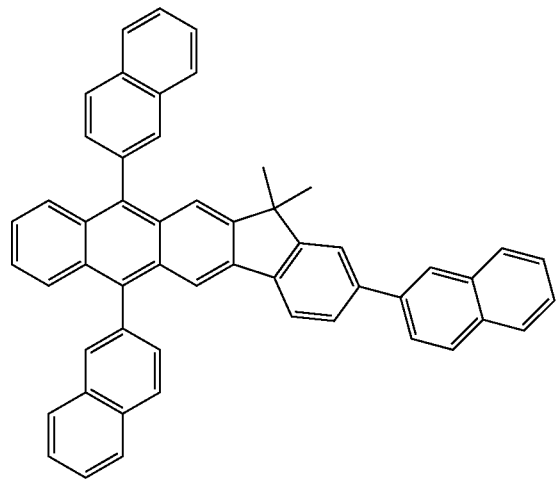
H29
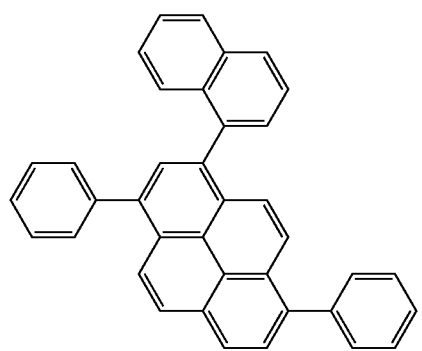
H30
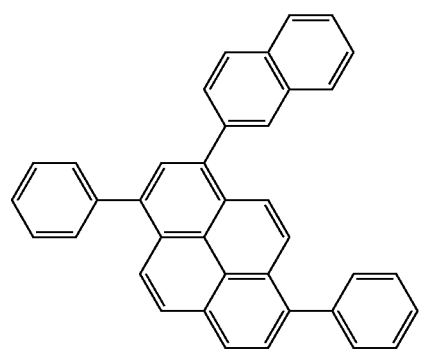
H31
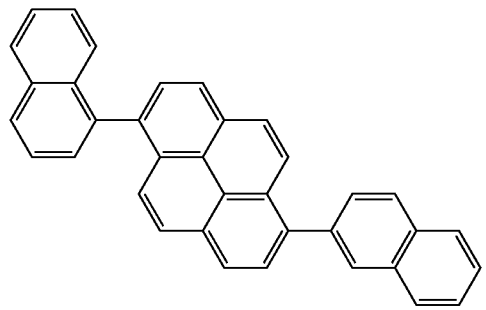
H32
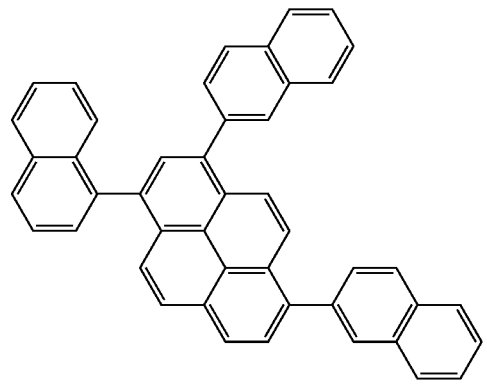
H33
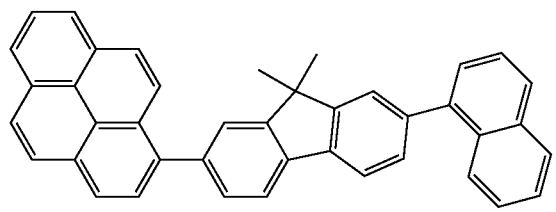
H34
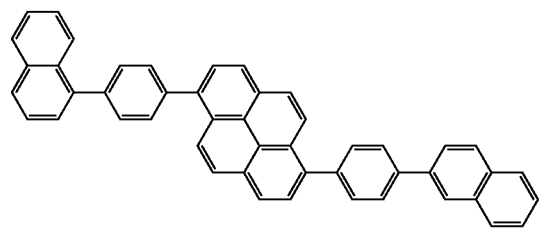

-continued
H35
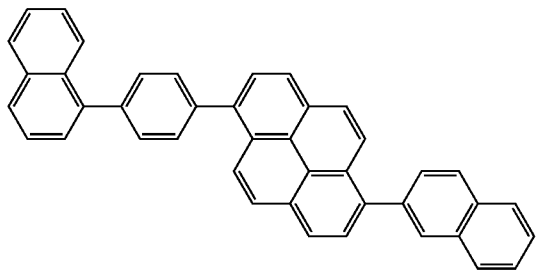
H36
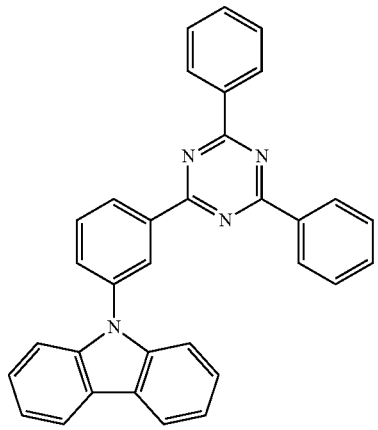
H37
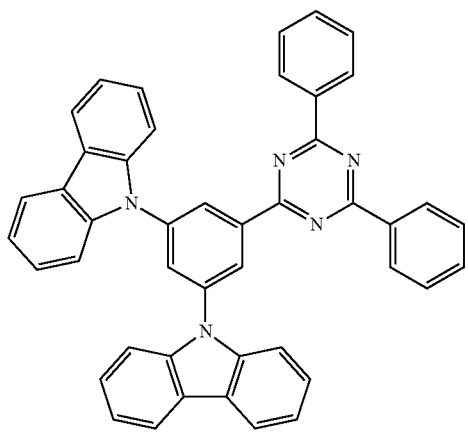
H38
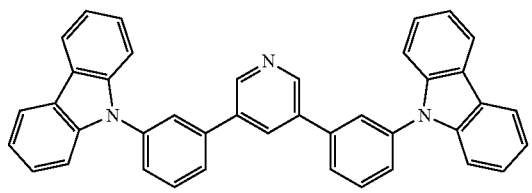
H39
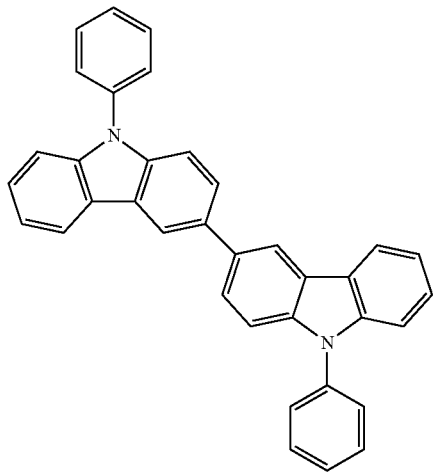
H40
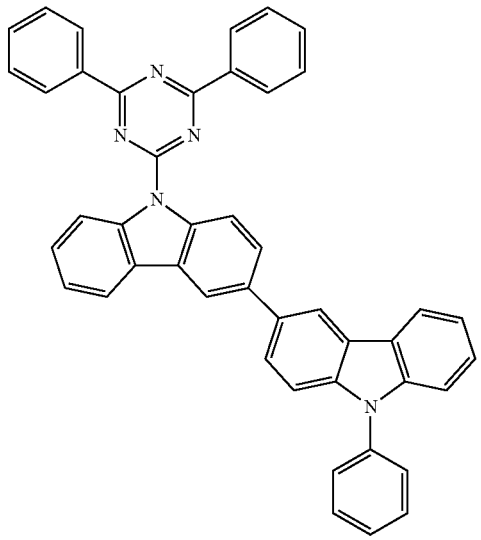

-continued
H41
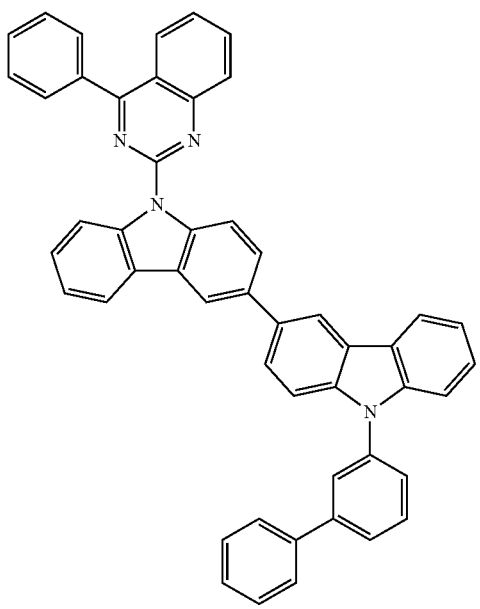
H42
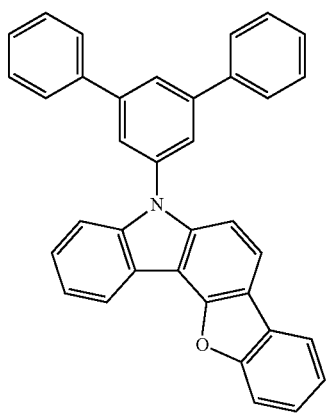
H43
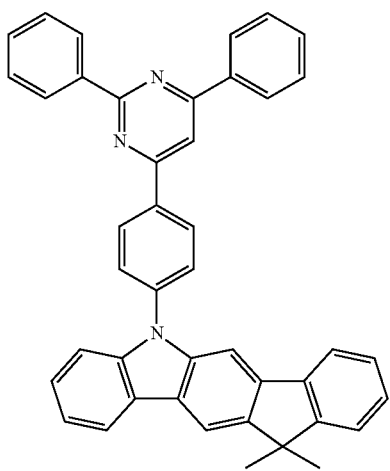
H44
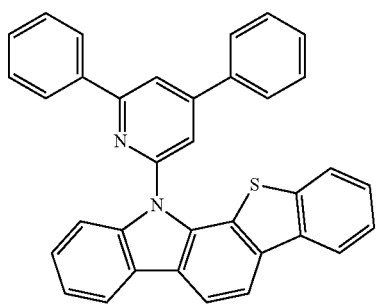
H45
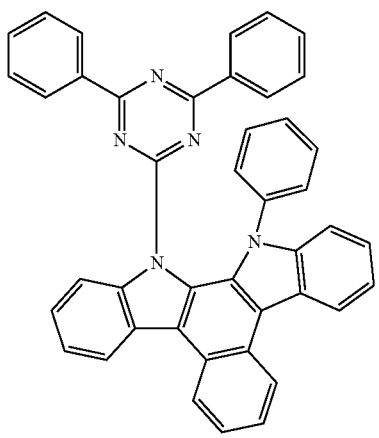
H46
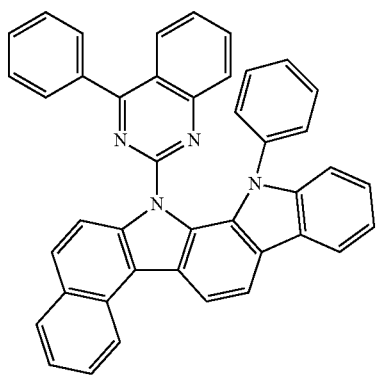

-continued
H47 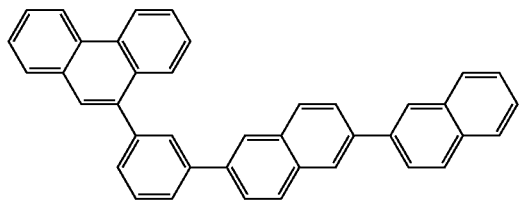
H48 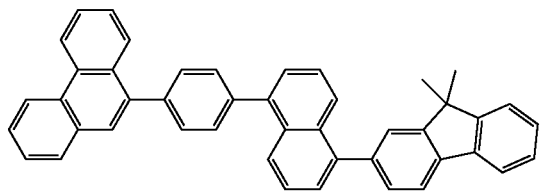
H49 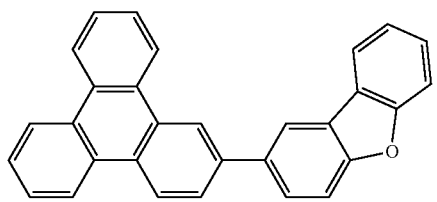
H50 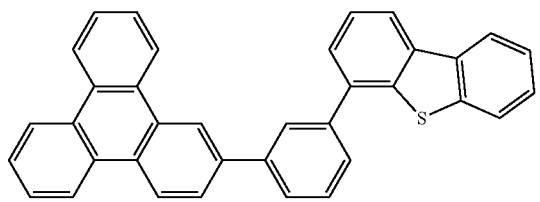
H51 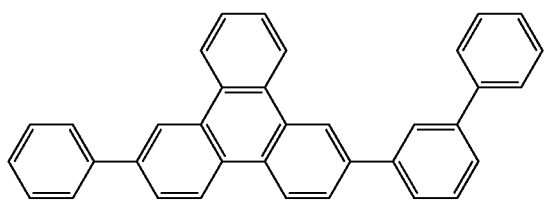
H52 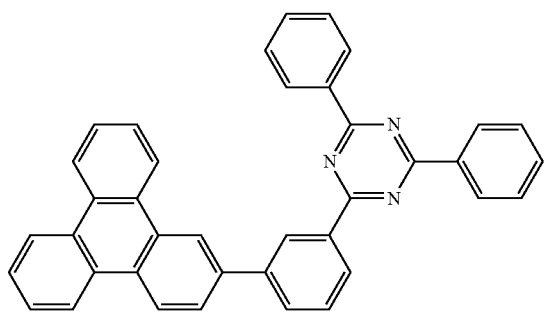
H53 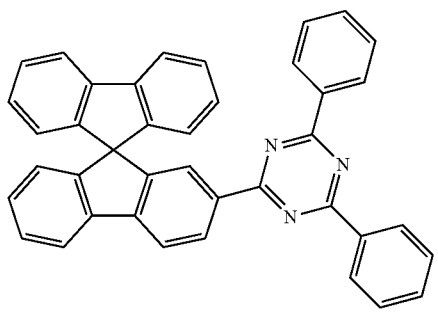
H54 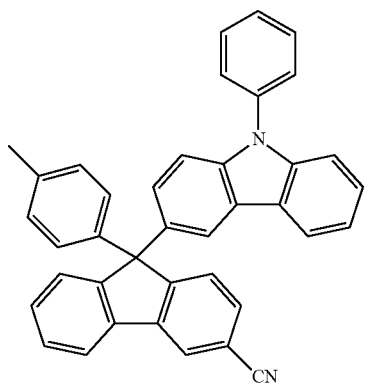
H55 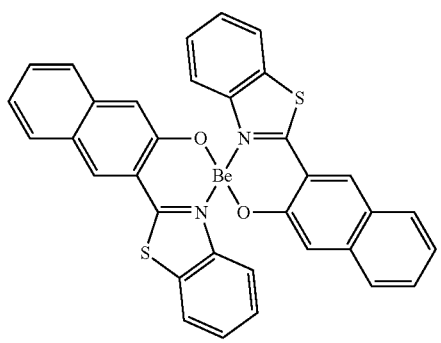
H56 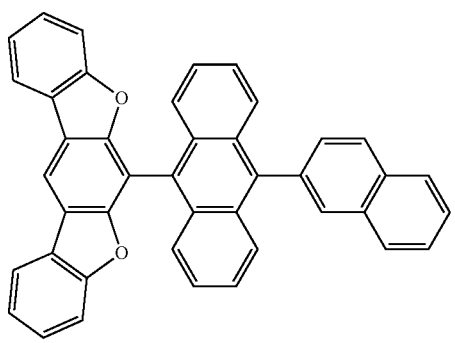

-continued
H57
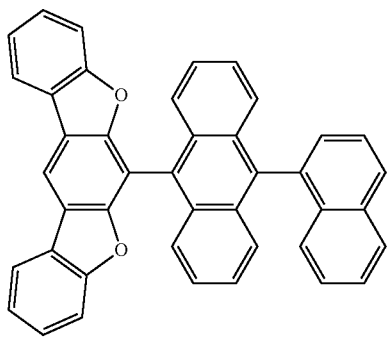
H58
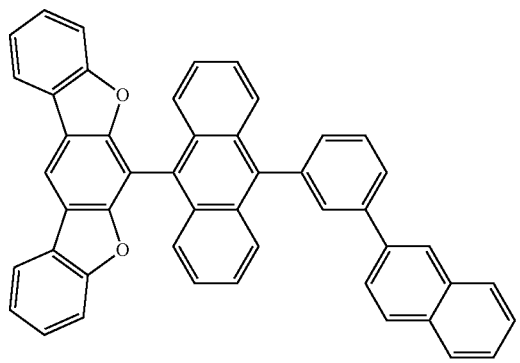
H59
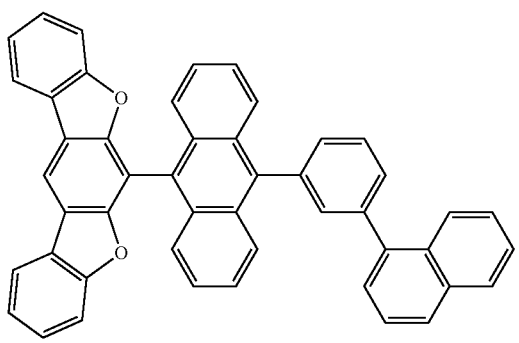
H60
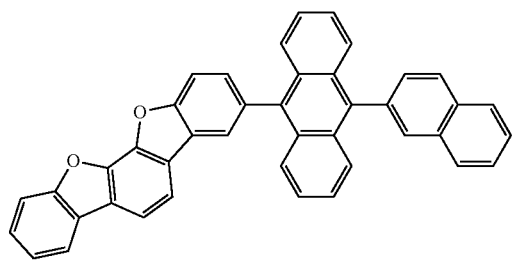
H61
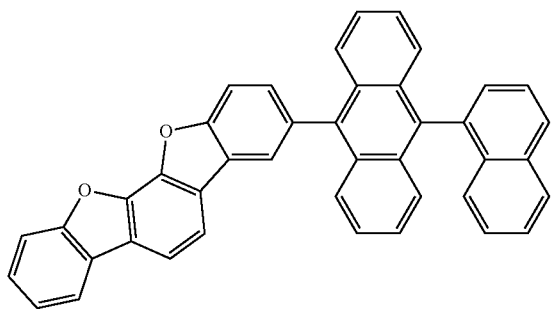
H62
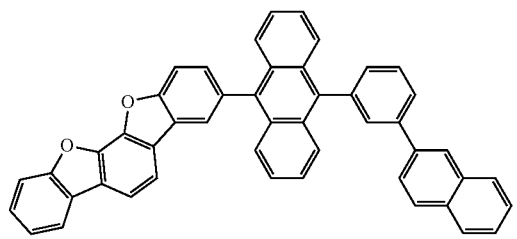
H63
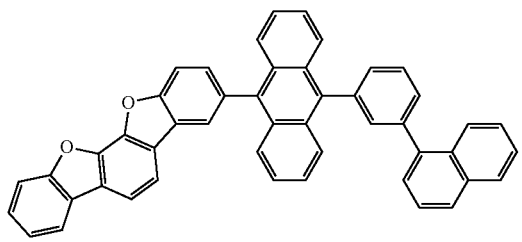
H64
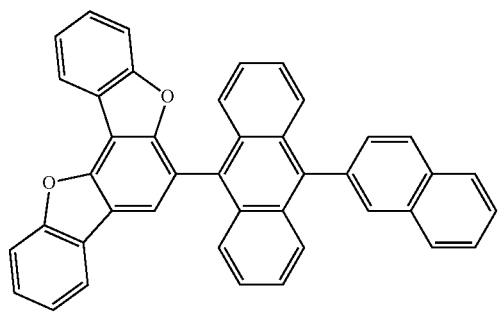

-continued
H65
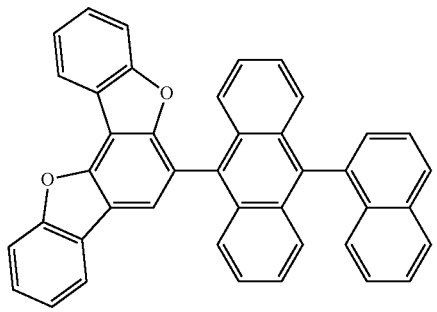
H66
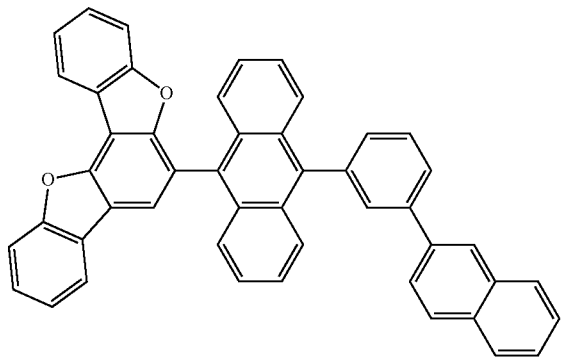
H67
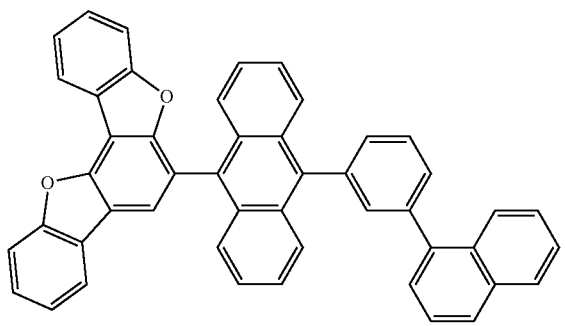
H68
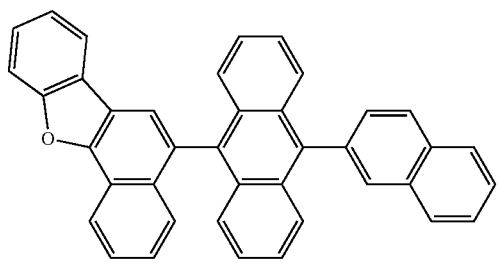
H69
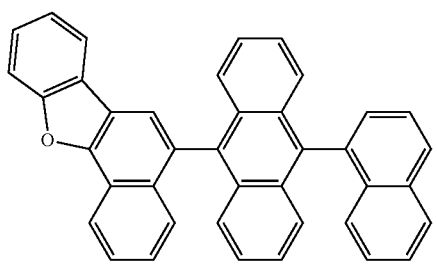
H70
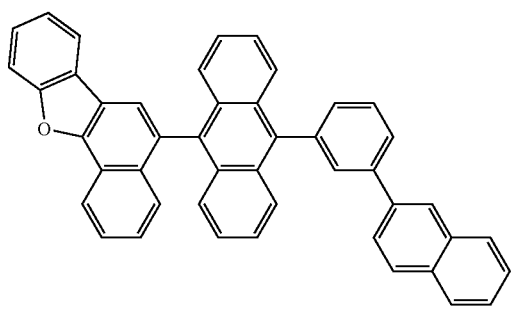
H71
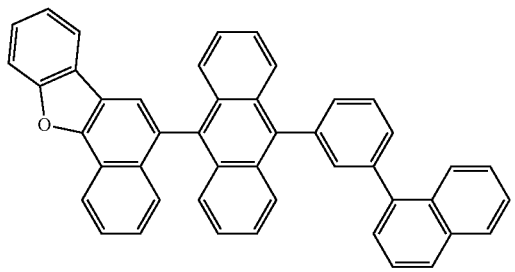
H72
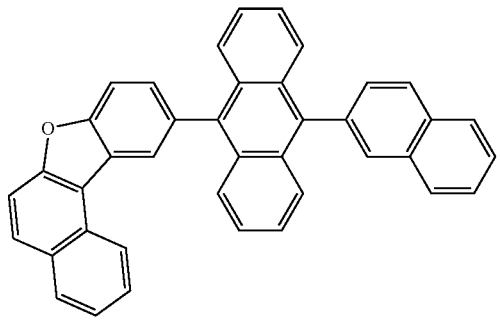

-continued
H73
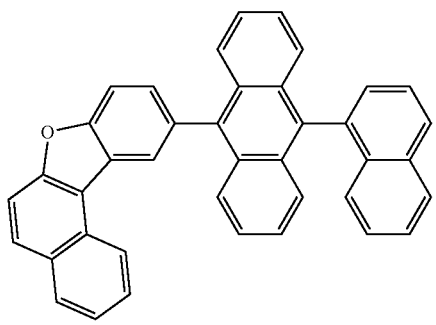
H74
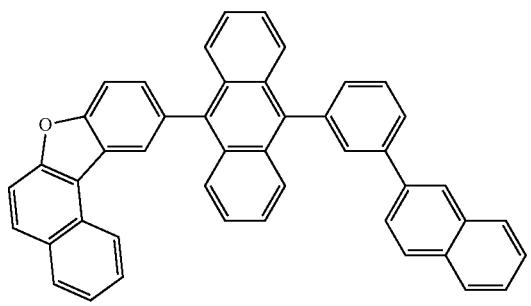
H75
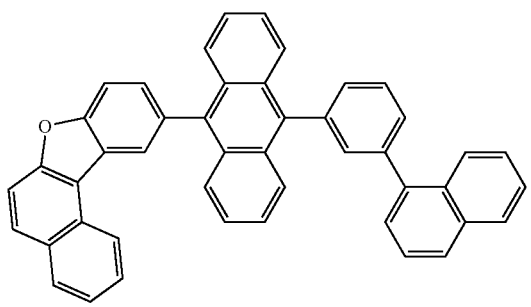
H76
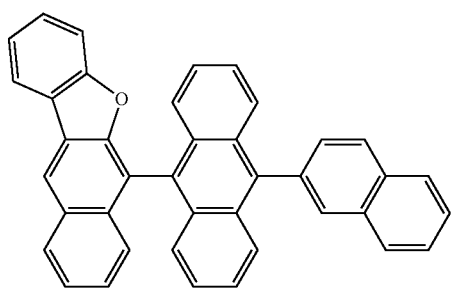
H77
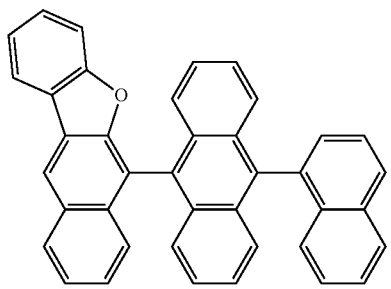
H78
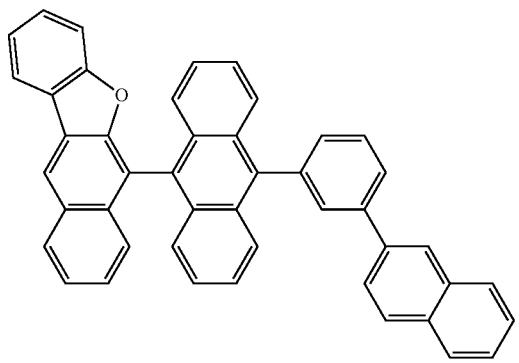
H79
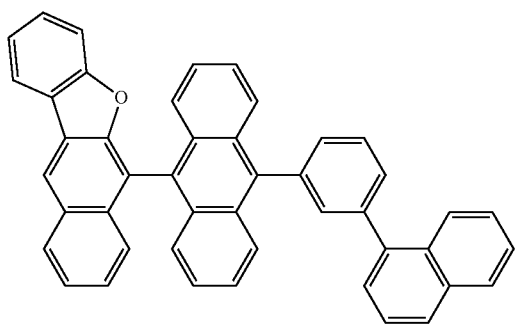
H80
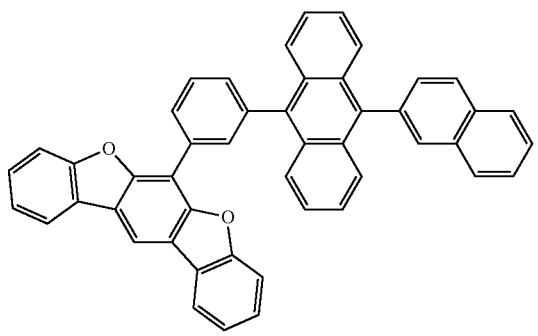

-continued
H81
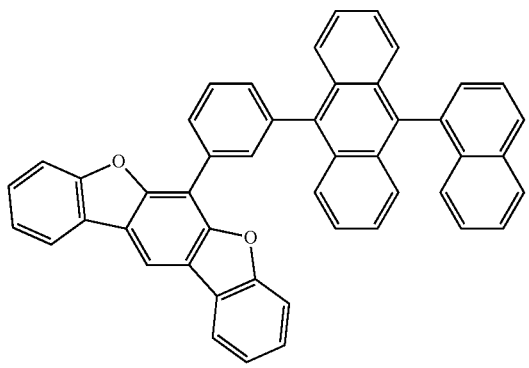
H82
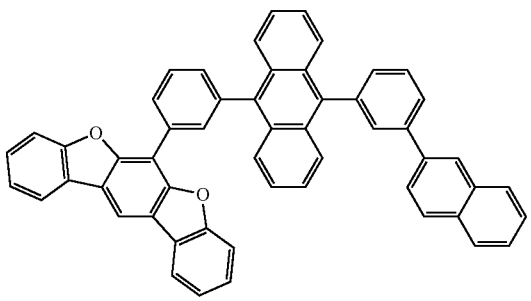
H83
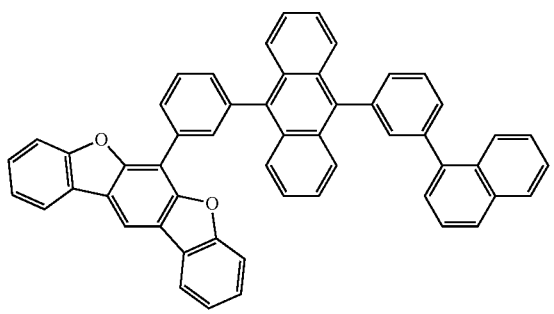
H84
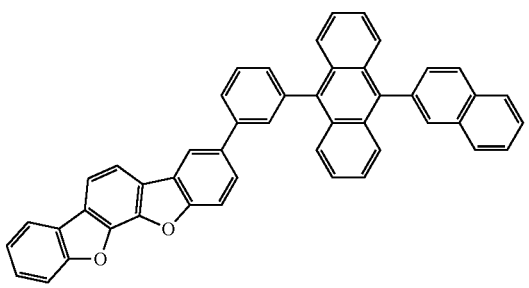
H85
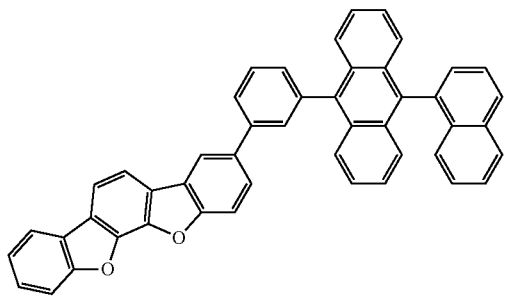
H86
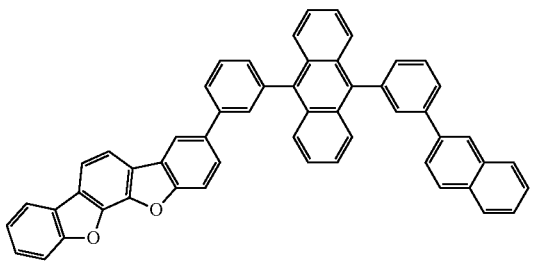
H87
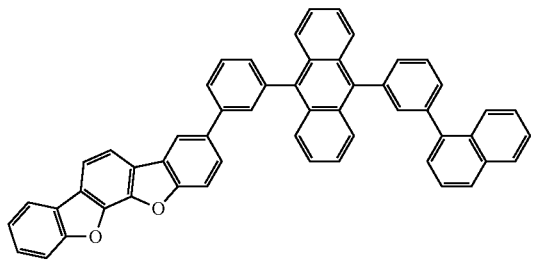
H88
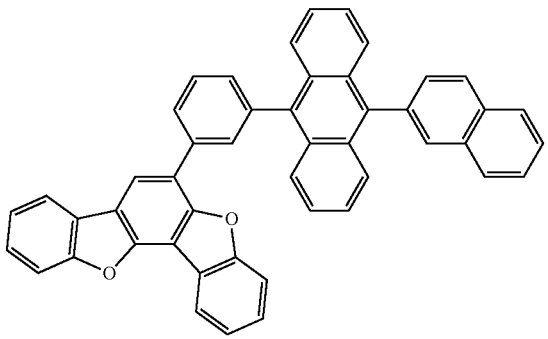

-continued
H89
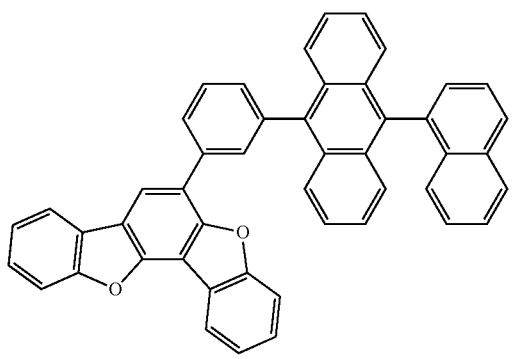
H90
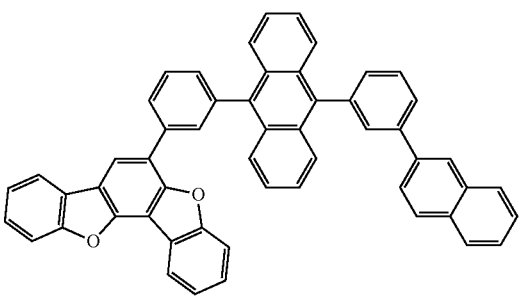
H91
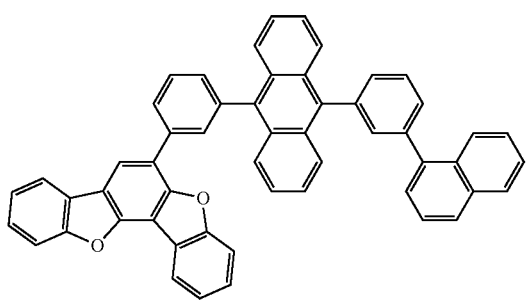
H92
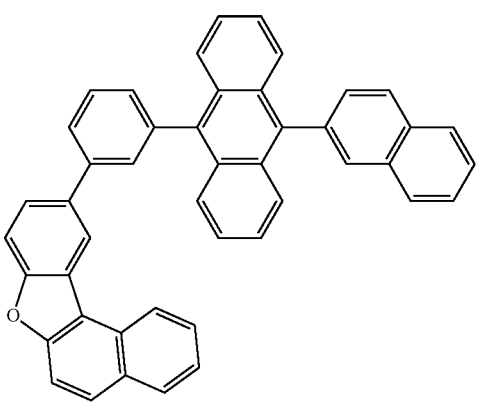
H93
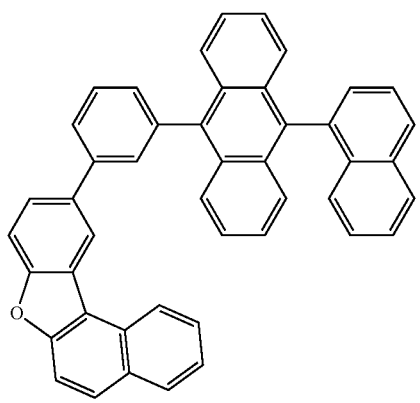
H94
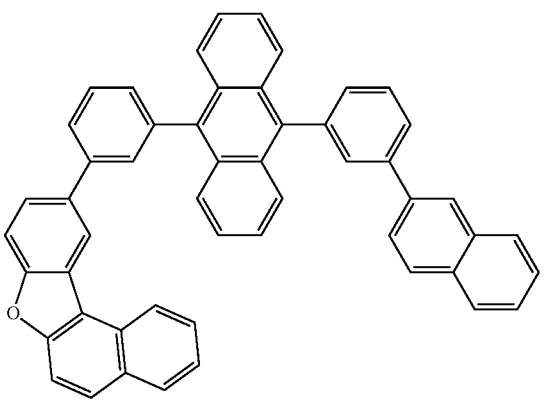
H95
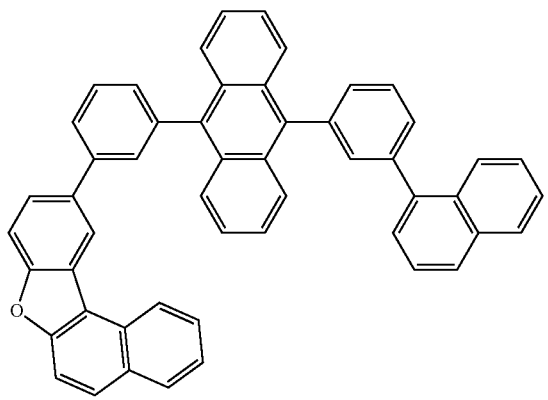
H96
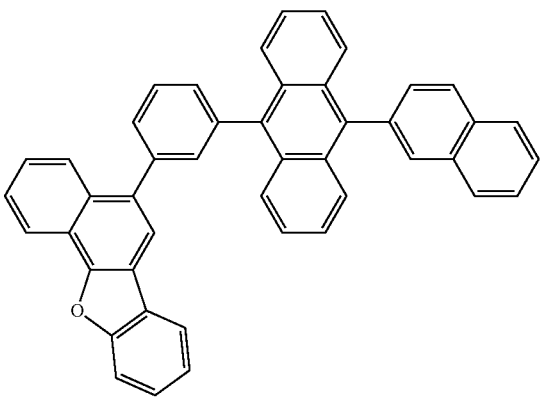

-continued
H97
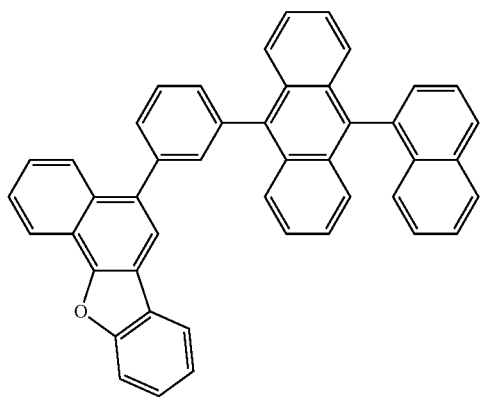
H98
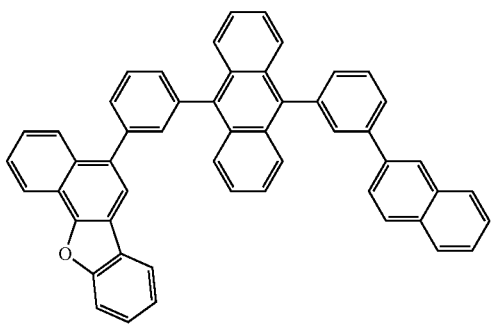
H99
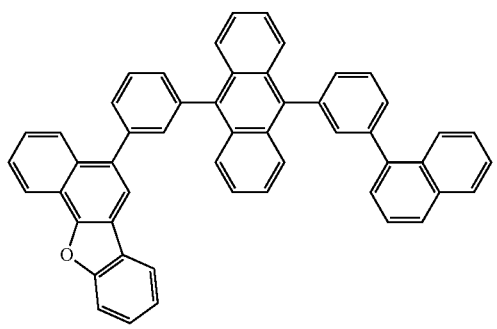
H100
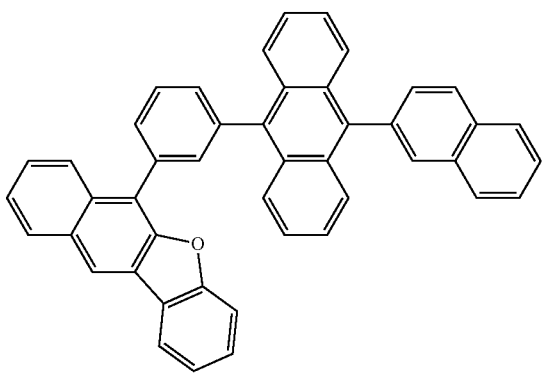
H101
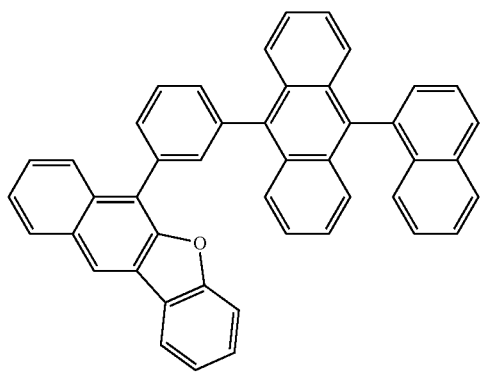
H102
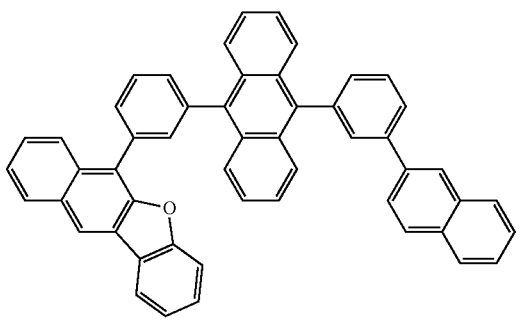
H103
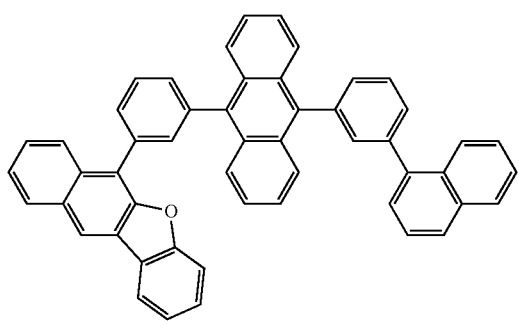
H104
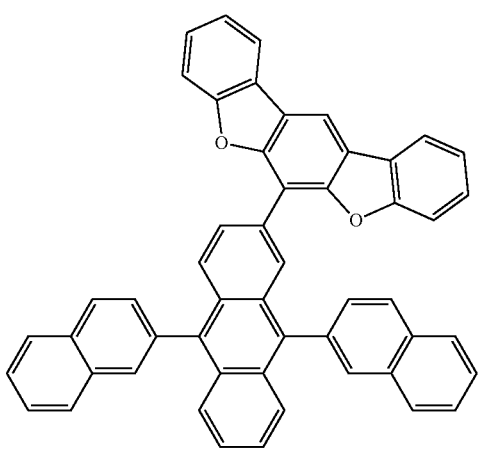

-continued
H105
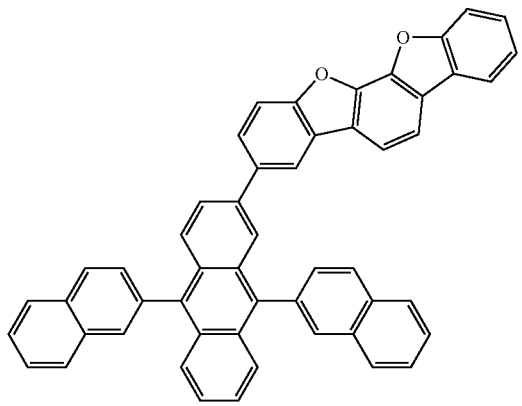
H106
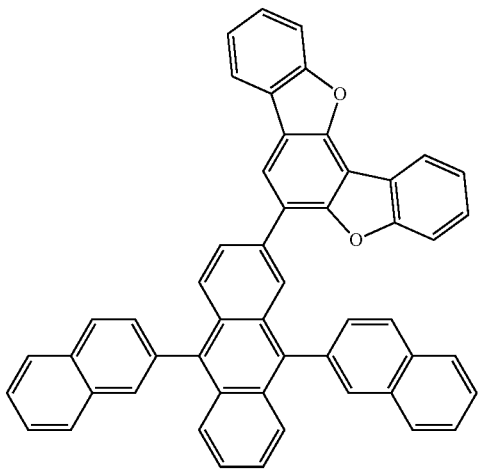
H107
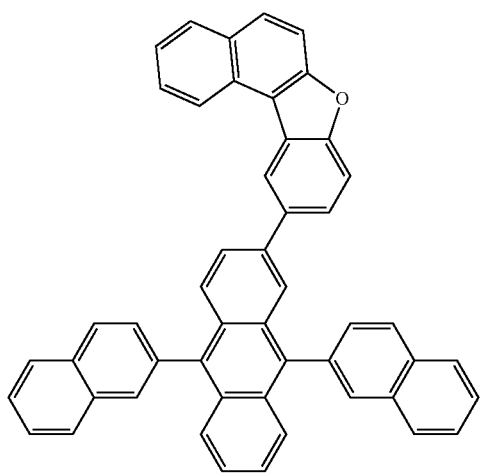
H108
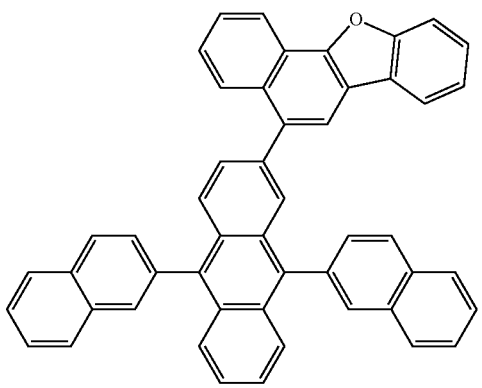
H109
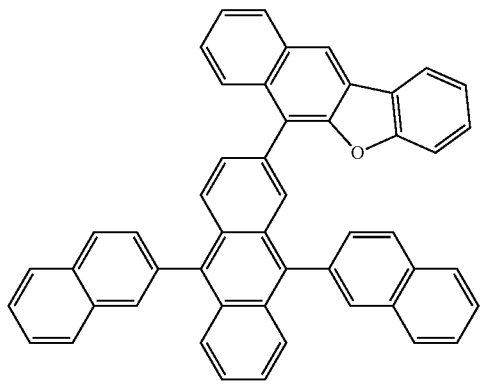
H110
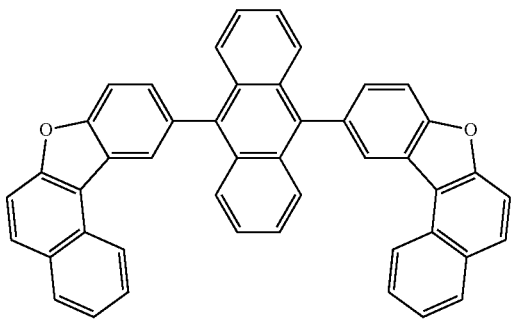
H111
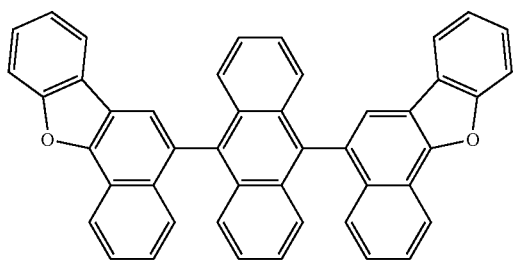
H112
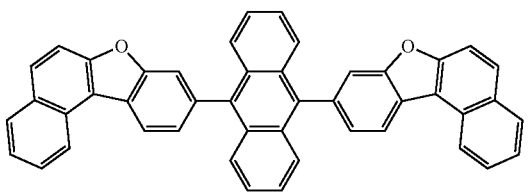

H113
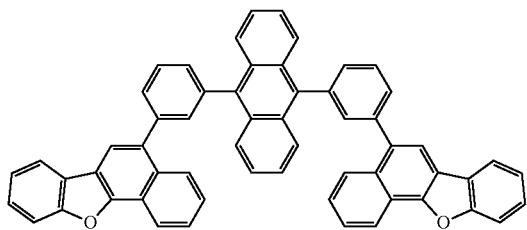
H114
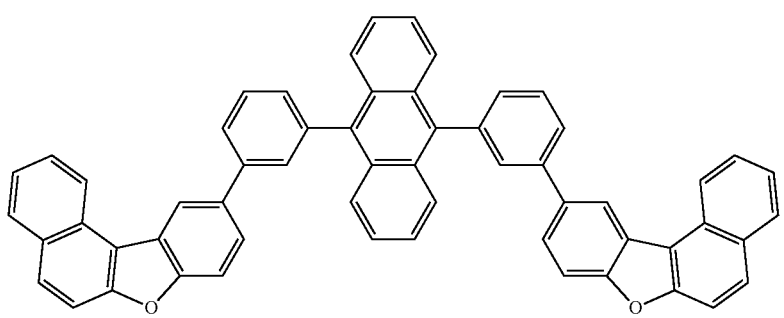
H115
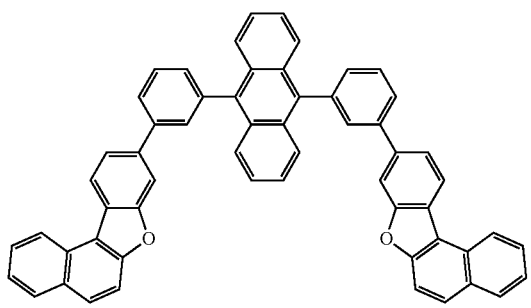
H116
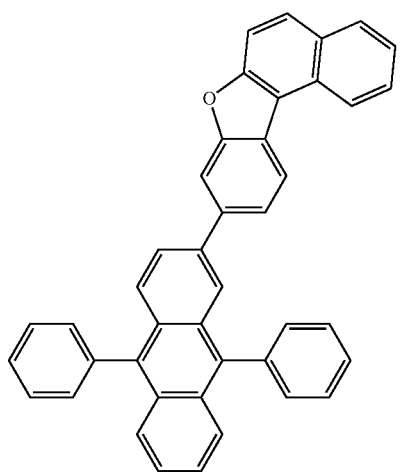
H117
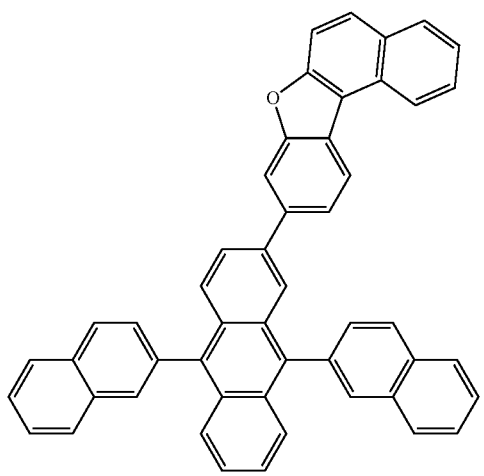
H118
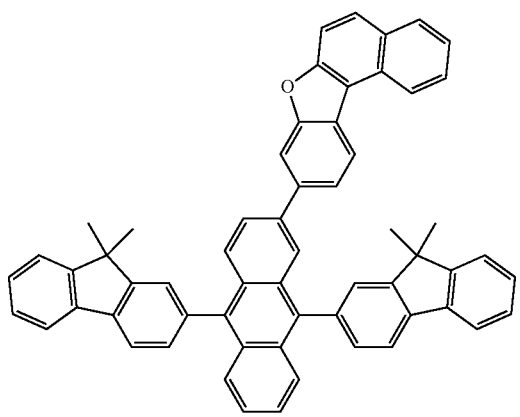

-continued
H119
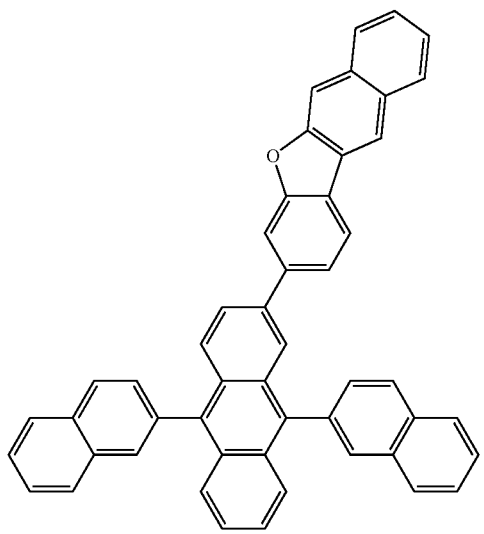
H120
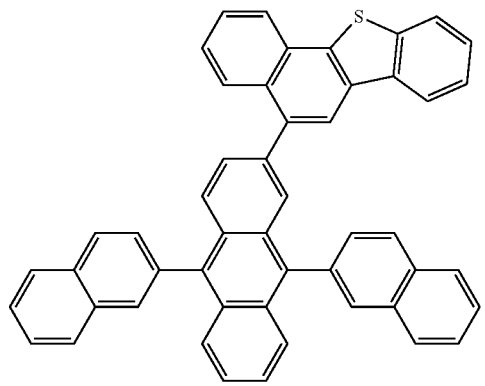
H121
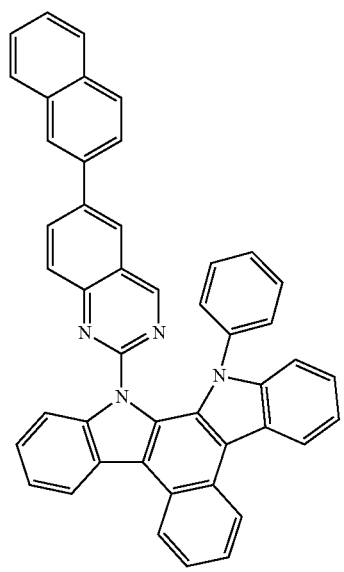
H122
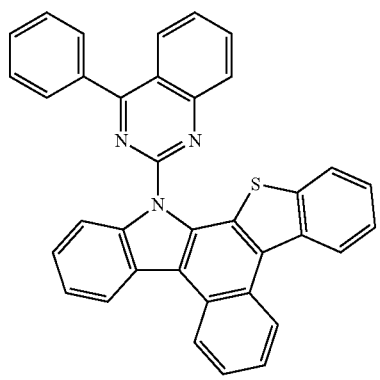
H123
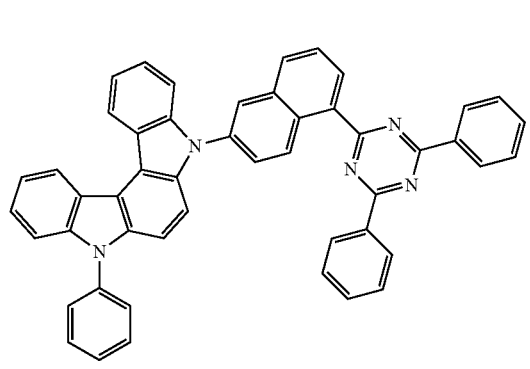
H124
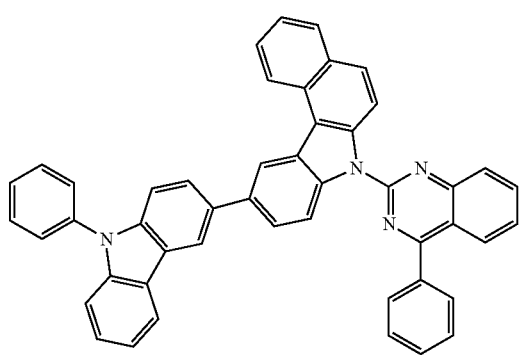

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In one or more embodiments, the phosphorescent dopant may include an organometallic compound represented by Formula 401:

Formula 401
$$M(L_{401})_{xc1}(L_{402})_{xc2}$$

Formula 402 wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is two or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*, $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with $Q_1$, xc11 and xc12 may each independently be an integer selected from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two rings $A_{401}$ in two or more of $L_{401}$(s) may be optionally linked to each other via $T_{402}$, which is a linking group, and two rings $A_{402}$ may optionally be linked to each other via $T_{403}$, which is a linking group (see e.g., Compounds PD1 to PD4 and PD7). $T_{402}$ and $T_{403}$ are the same as described in connection with $T_{401}$.

$L_{402}$ in Formula 401 may be an organic ligand. In one or more embodiments, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.
The phosphorescent dopant may include, for example, one of compounds PD1 to PD25, or any combination thereof:
PD1
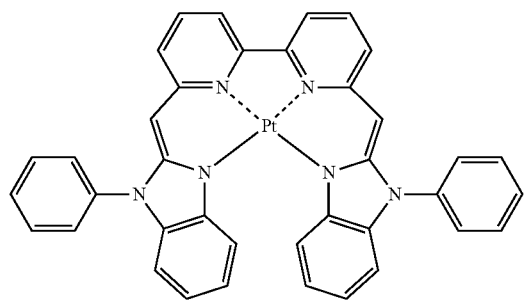
PD2
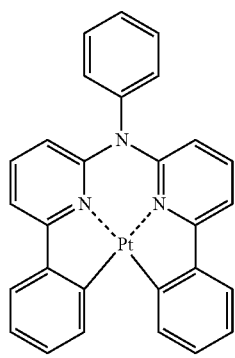
PD3
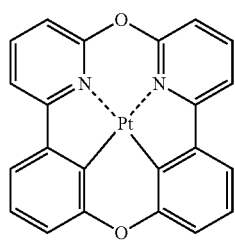
PD4
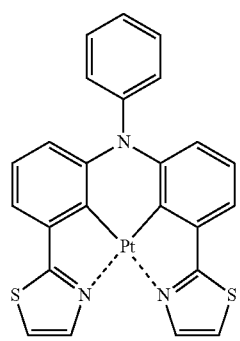
-continued
PD5
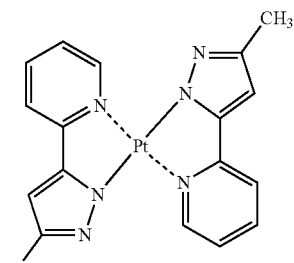
PD6
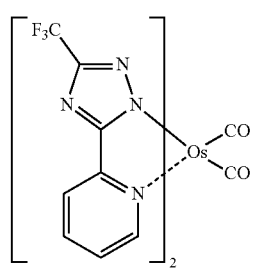
PD7
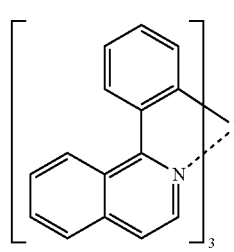
PD8
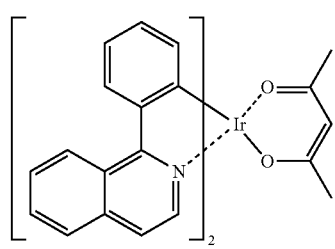
PD9
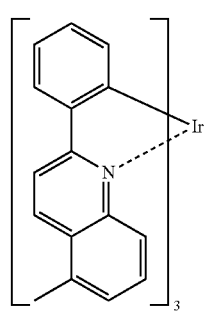
PD10

PD11 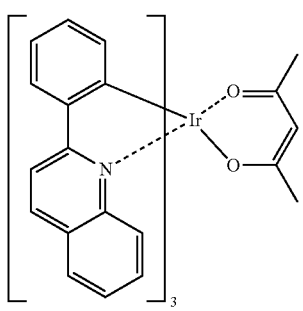
PD12 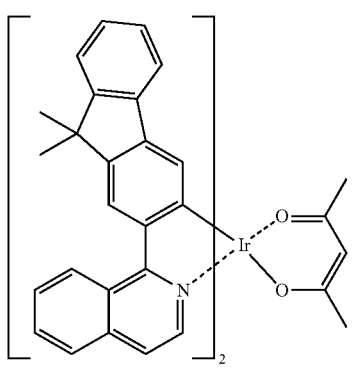
PD13 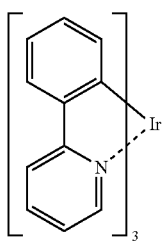
PD14 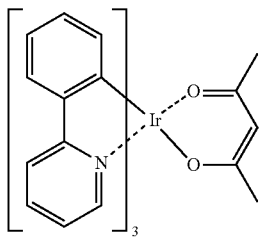
PD15 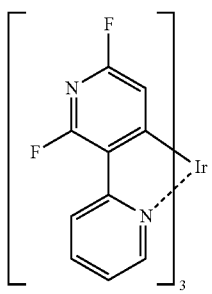
PD16 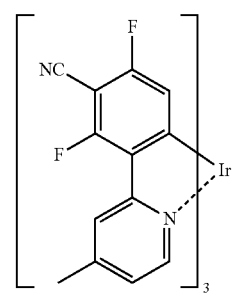
PD17 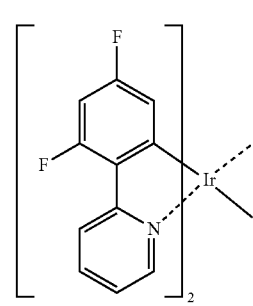
PD18 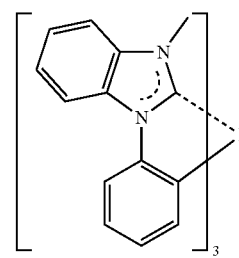
PD19 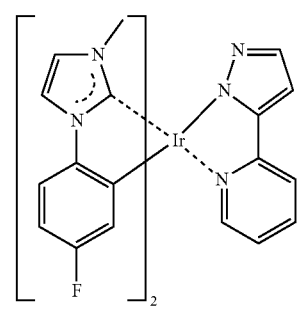
PD20 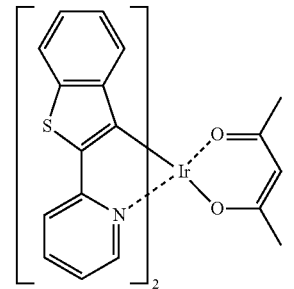

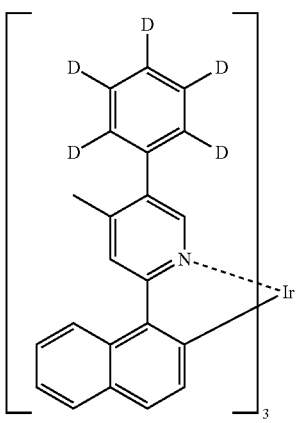

PD21

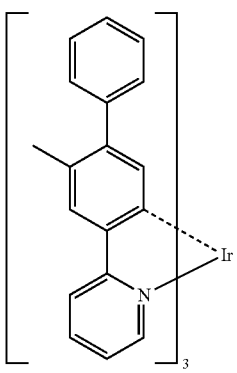

PD22

PD23

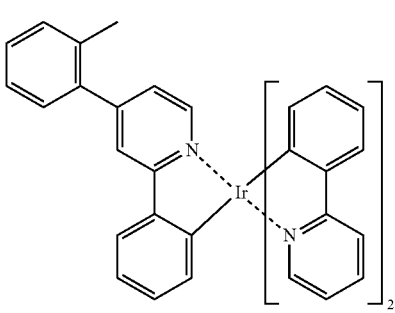

PD24

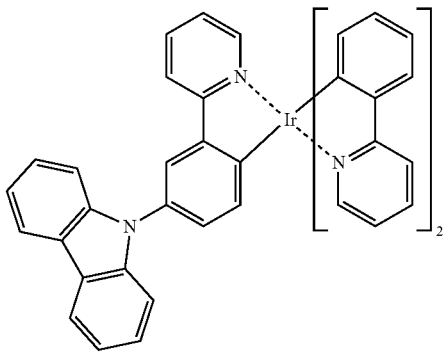

PD25

Fluorescent Dopant

The fluorescent dopant may include an amine group-containing compound, a styryl group-containing compound, or any combination thereof.

In one or more embodiments, the fluorescent dopant may include a compound represented by Formula 501:

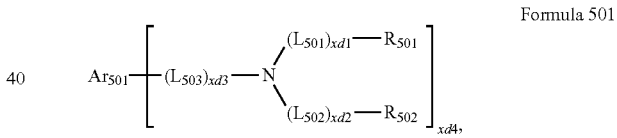

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In one or more embodiments, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

In one or more embodiments, the fluorescent dopant may include: one of Compounds FD1 to FD36; DPVBi; DPAVBi; or any combination thereof:

81  82
FD1
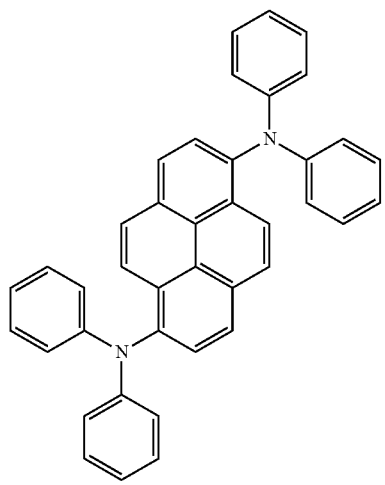
FD2
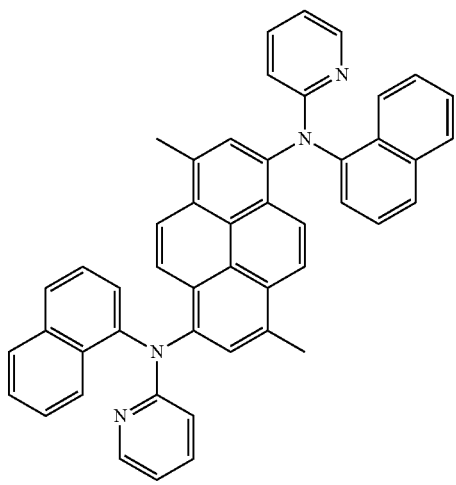
FD3
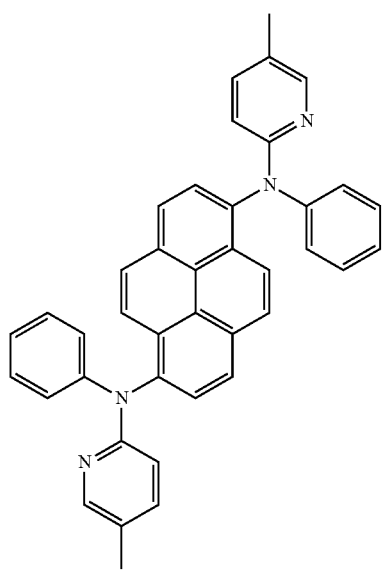
FD4
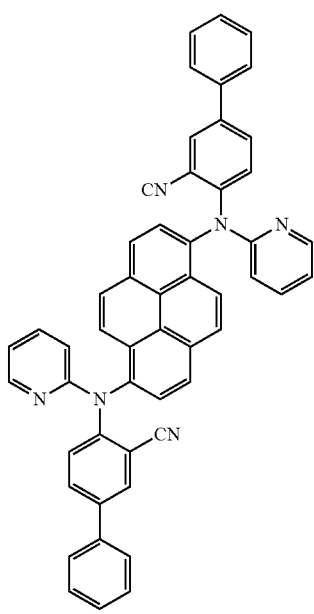
FD5
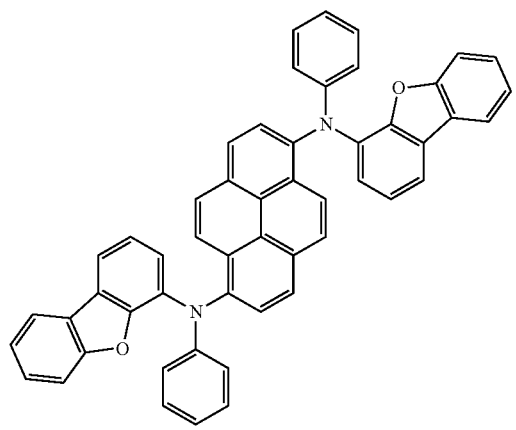
FD6
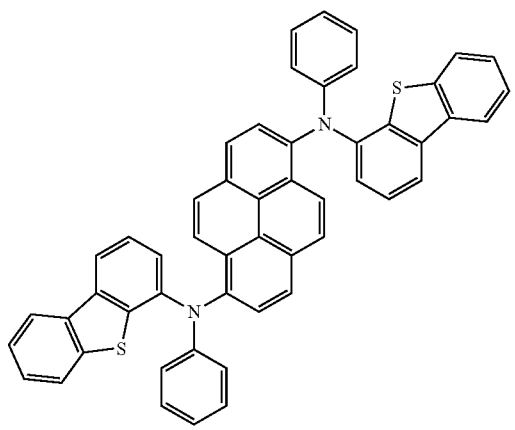

-continued
FD7
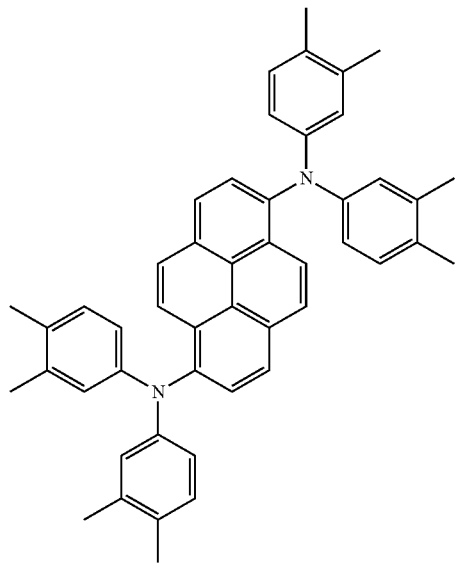
FD8
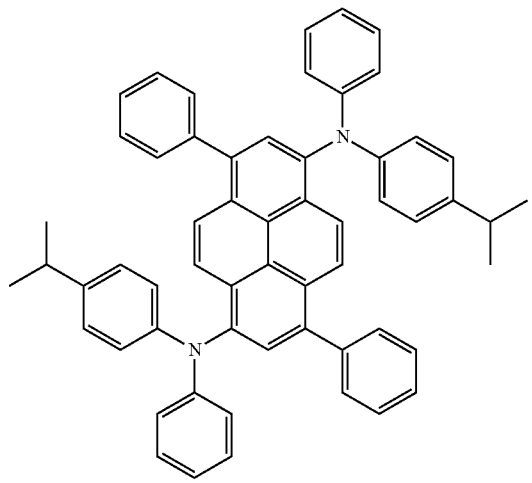
FD9
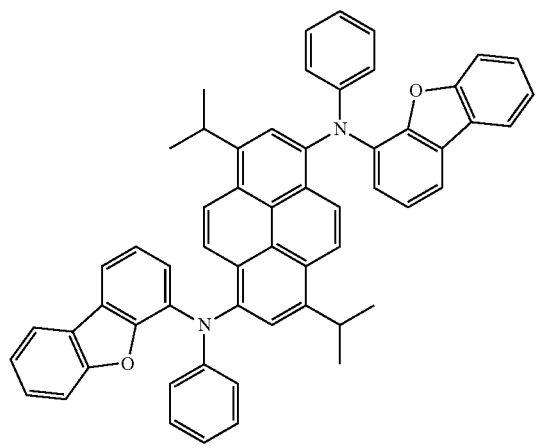
FD10
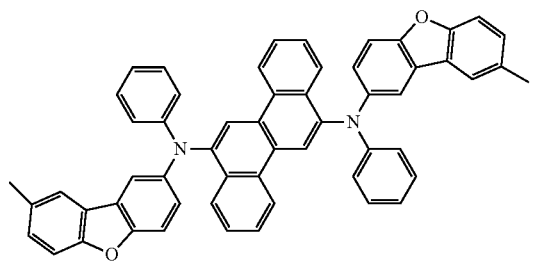
FD11
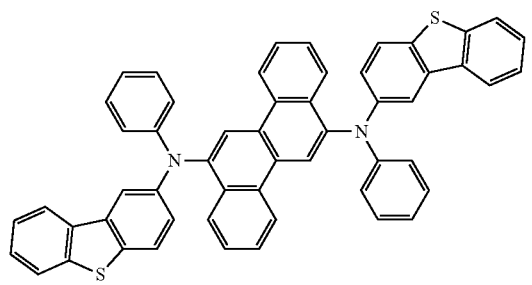
FD12
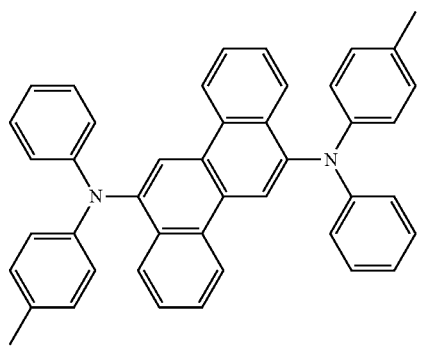

-continued
FD13
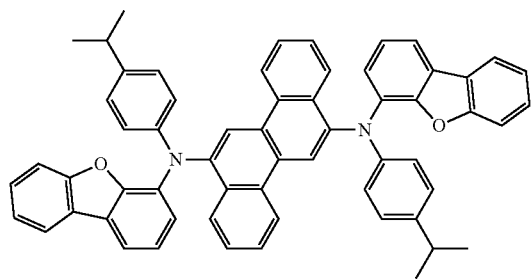
FD14
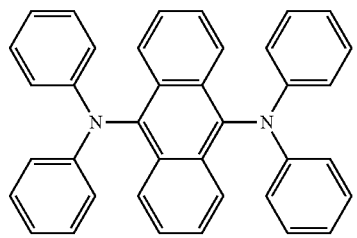
FD15
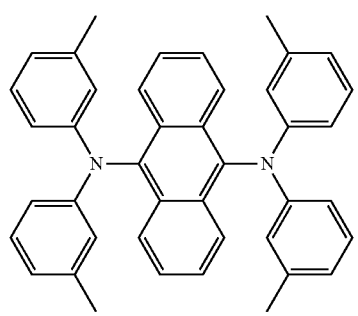
FD16
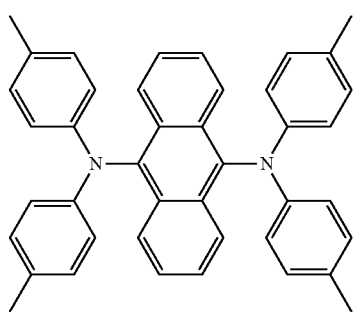
FD17
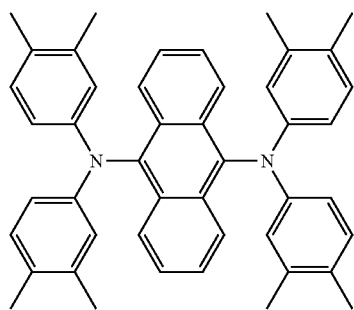
FD18
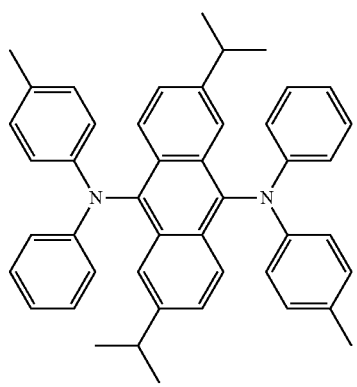
FD19
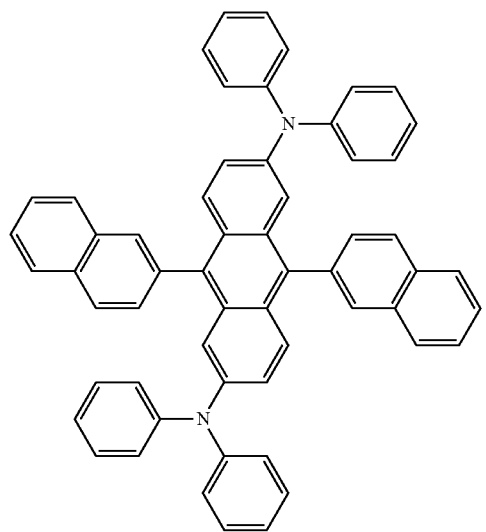
FD20
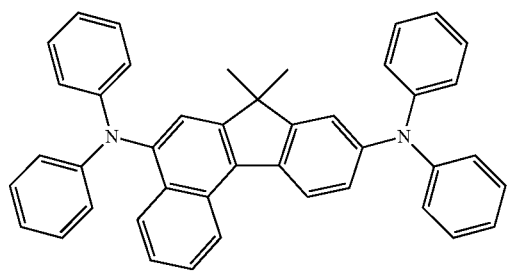

-continued
FD21
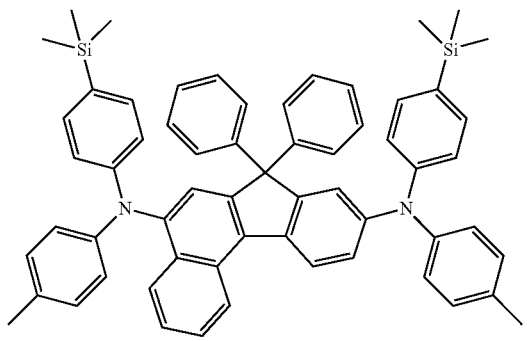
FD22
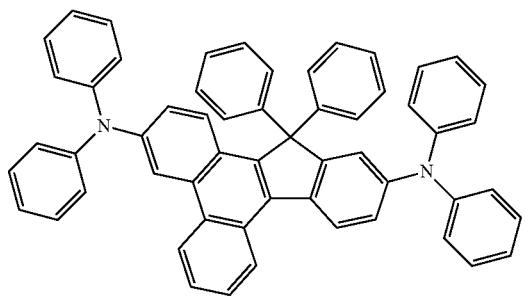
FD23
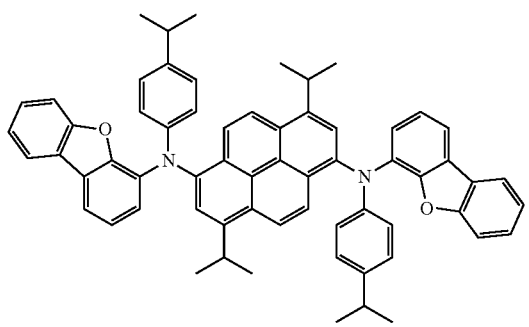
FD24
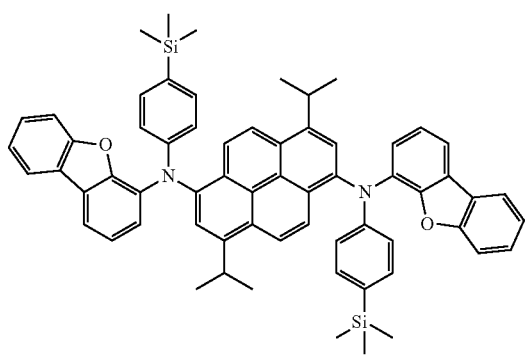
FD25
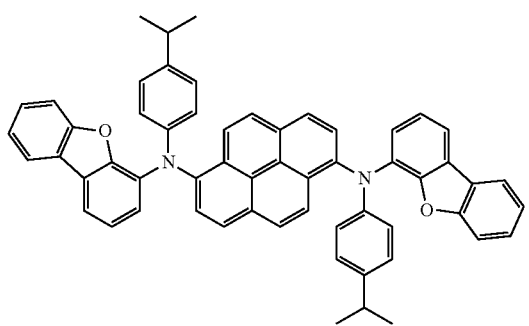
FD26
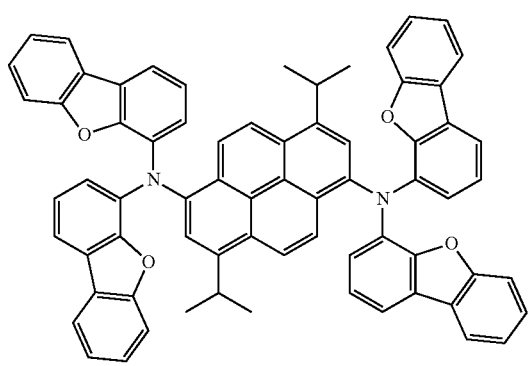
FD27
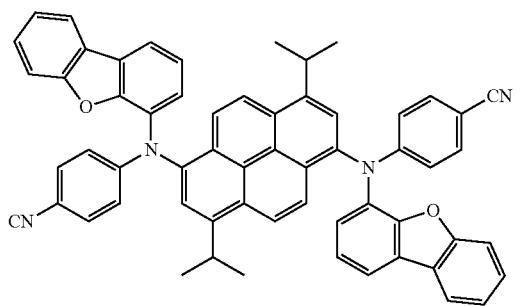
FD28
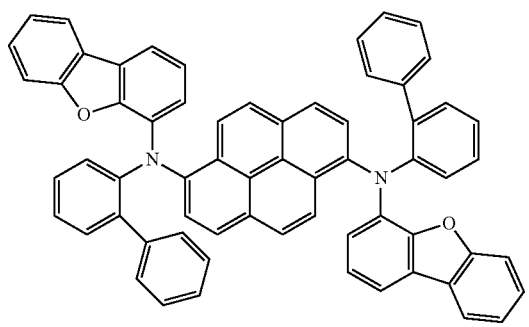

-continued
FD29
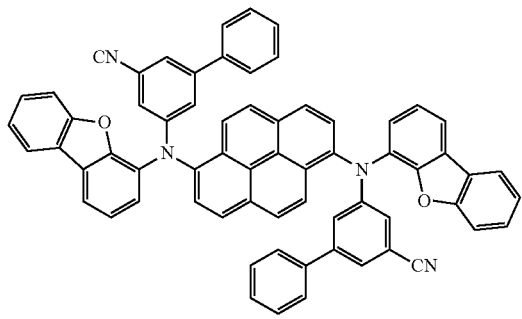
FD30
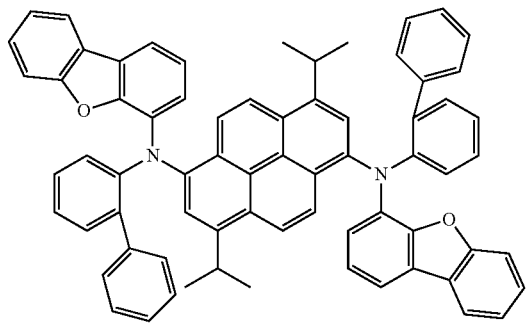
FD31
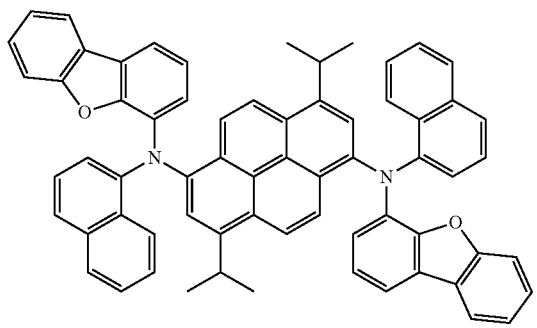
FD32
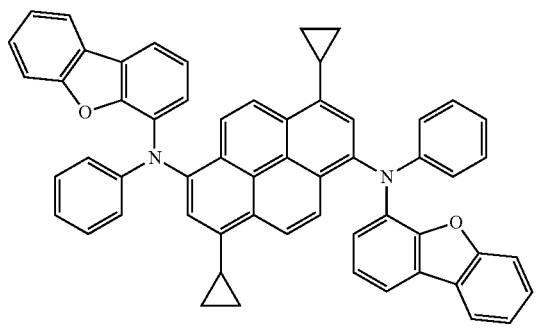
FD33
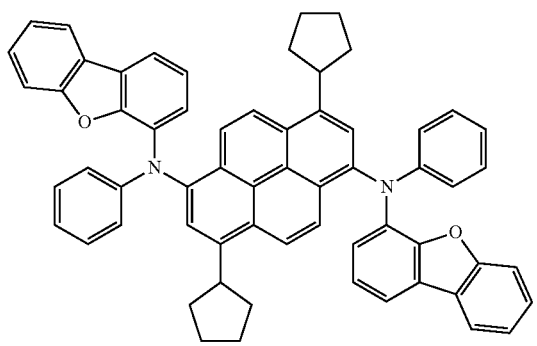
FD34
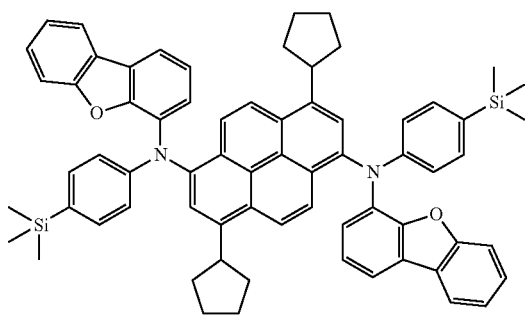
FD35
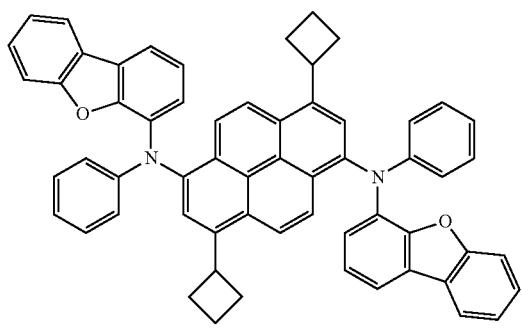
FD36
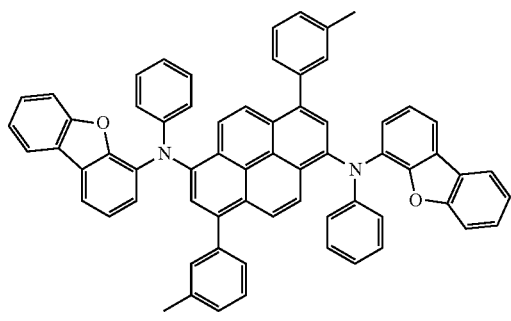

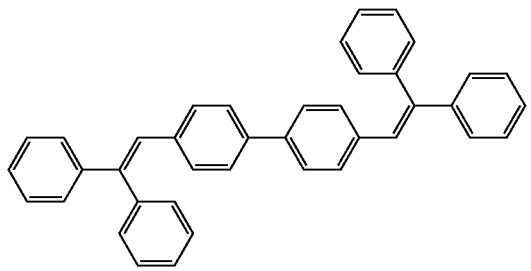

DPVBi

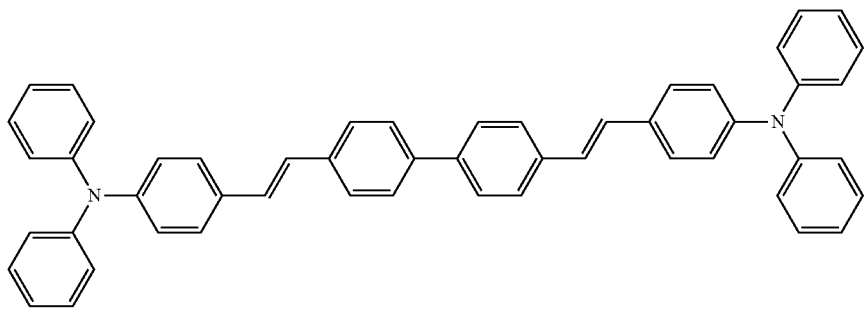

DPAVBi

Delayed Fluorescence Material

The emission layer 133 may include a delayed fluorescent material.

In the present specification, the delayed fluorescence material may be selected from compounds capable of emitting delayed fluorescence based on a delayed fluorescence emission mechanism.

The delayed fluorescent material included in the emission layer 133 may act as a host or a dopant, depending on the type (or kind) of other materials included in the emission layer 133.

In one or more embodiments, the difference between the triplet energy level (eV) of the delayed fluorescence material and the singlet energy level (eV) of the delayed fluorescence material may be greater than or equal to 0 eV and less than or equal to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively or suitably occur, and thus, the luminescence efficiency of the light-emitting device 10 may be improved.

In one or more embodiments, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, and/or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

Examples of the delayed fluorescence material may include at least one of the following Compounds DF1 to DF9:

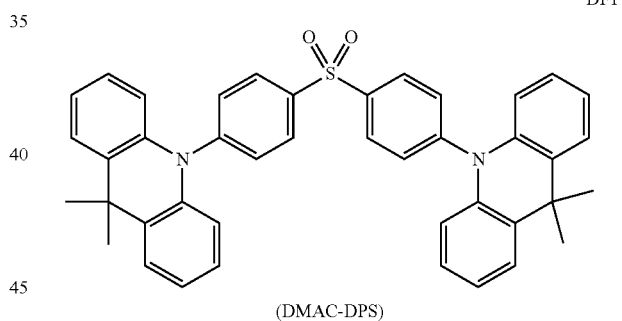

DF1

(DMAC-DPS)

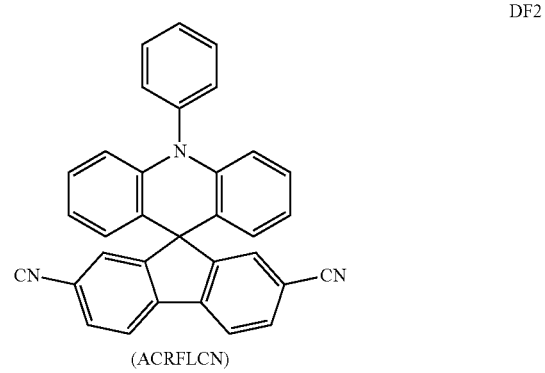

DF2

(ACRFLCN)

-continued
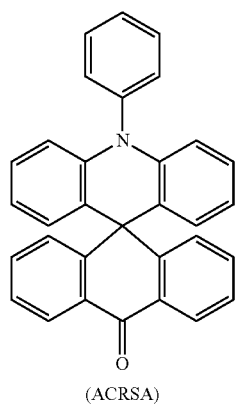
(ACRSA)
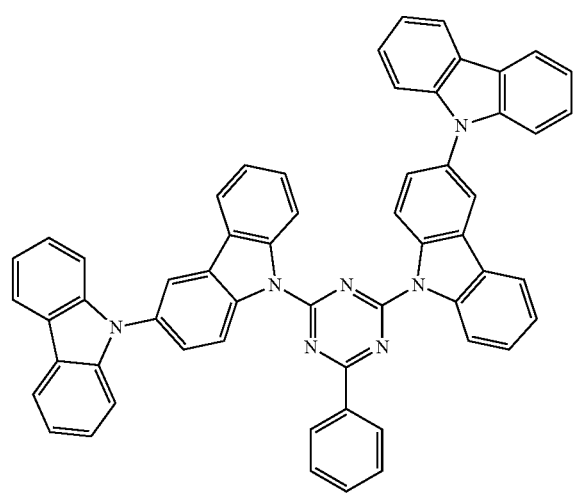
(CC2TA)
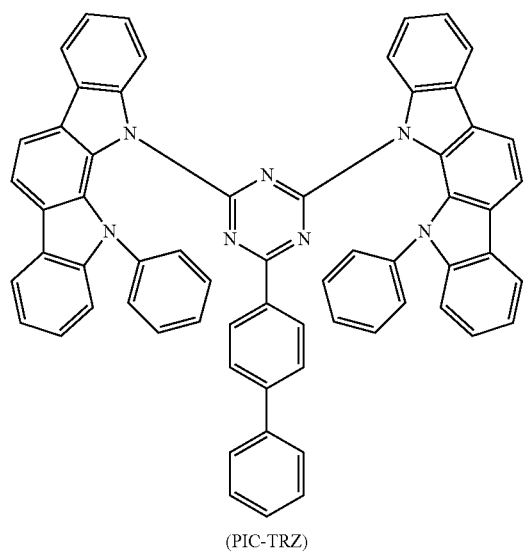
(PIC-TRZ)
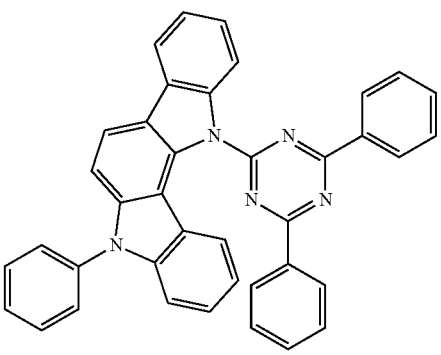
(PIC-TRZ2)
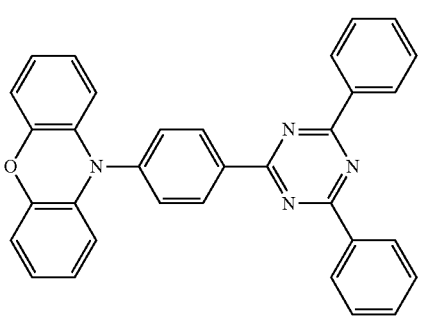
(PXZ-TRZ)
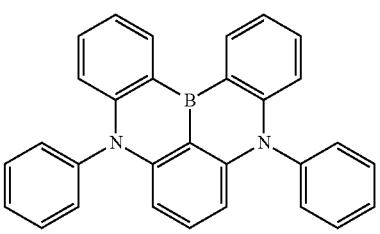
(DABNA-1)
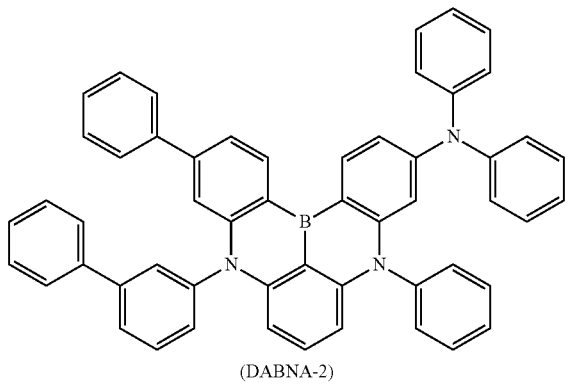
(DABNA-2)

-continued

DF10

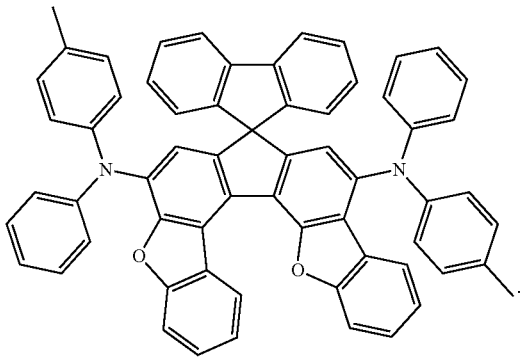

Quantum Dot

In one or more embodiments, the emission layer 133 may include a quantum dot.

In the present specification, a quantum dot refers to a crystal of a semiconductor compound, and may include any suitable material capable of emitting light of various emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process (or combination of processes) similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal, so that the growth of quantum dot particles can be controlled through a process which is more easily performed than vapor deposition methods, such as metal organic chemical vapor deposition (MOCVD) or molecular beam epitaxy (MBE), and which requires relatively low costs.

The quantum dot may include: a Group II-VI semiconductor compound; a Group III-V semiconductor compound; a Group III-VI semiconductor compound; a Group III-VI semiconductor compound; a Group IV-VI semiconductor compound; a Group IV element, a Group IV compound; or any combination thereof.

Examples of the Group II-VI semiconductor compound may include: a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compound may include: a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and/or the like; a quaternary compound, such as GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, and/or the like; or any combination thereof. In one or more embodiments, the Group III-V semiconductor compound may further include Group II elements. Examples of the Group III-V semiconductor compound further including Group II elements may include InZnP, InGaZnP, InAlZnP, and the like.

Examples of the Group III-VI semiconductor compound may include a binary compound, such as GaS, GaSe, $Ga_2Se_3$, GaTe, InS, InSe, $In_2S_3$, $In_2Se_3$, and/or InTe; a ternary compound, such as $InGaS_3$, and/or $InGaSe_3$; or any combination thereof.

Examples of the Group III-VI semiconductor compound may include: a ternary compound, such as AgInS, $AgInS_2$, CuInS, $CuInS_2$, $CuGaO_2$, $AgGaO_2$, and/or $AgAlO_2$; or any combination thereof.

Examples of the Group IV-VI semiconductor compound may include: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

The Group IV element and the Group IV compound may include: a single element compound, such as Si and/or Ge; a binary compound, such as SiC and/or SiGe; or any combination thereof.

Each element included in a multi-element compound such as the binary compound, ternary compound and/or quaternary compound, may exist in a particle with a uniform (e.g., substantially uniform) concentration or non-uniform concentration.

In one or more embodiments, the quantum dot may have a single structure or a dual core-shell structure. In the case of the quantum dot having a single structure, the concentration of each element included in the corresponding quantum dot is uniform. In one or more embodiments, the material contained in the core and the material contained in the shell may be different from each other.

The shell of the quantum dot may act as a protective layer to prevent or reduce chemical degeneration of the core to maintain semiconductor characteristics and/or as a charging layer to impart electrophoretic characteristics to the quantum dot. The shell may be a single layer or a multi-layer. The element present at the interface between the core and the shell of the quantum dot may have a concentration gradient that decreases toward the center of the quantum dot.

Examples of the shell of the quantum dot may be an oxide of metal, metalloid, and/or non-metal, a semiconductor compound, and any combination thereof. Examples of the oxide of metal, metalloid, and/or non-metal may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; and any combination thereof. Examples of the semiconductor compound may include, as described herein, a Group II-VI semiconductor compound, a Group III-V semiconductor compound, a Group III-VI semiconductor compound, a Group III-VI semiconductor compound, a Group IV-VI semiconductor compound, or any combination thereof. In one or more embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less, and within any of these ranges, color purity and/or color reproducibility may be increased. In addition, because the light emitted through the quantum dot is emitted in all directions, the wide viewing angle can be improved.

In one or more embodiments, the quantum dot may be a spherical particle, a pyramidal particle, a multi-arm particle, a cubic nanoparticle, a nanotube particle, a nanowire particle, a nanofiber particle, and/or a nanoplate particle.

Because the energy band gap can be adjusted by controlling the size of the quantum dot, light having various wavelength bands can be obtained from the quantum dot emission layer. Therefore, by using quantum dots of different sizes, a light-emitting device that emits light of various wavelengths may be implemented. In one or more embodiments, the size of the quantum dot may be selected to emit red, green and/or blue light. In one or more embodiments, the size of the quantum dot may be configured to emit white light by combining light of various colors.

Electron Transport Region 135 in Interlayer 130

The electron transport region 135 may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region 135 may include a buffer layer, a hole blocking layer, an electron control layer, an electron transport layer, an electron injection layer, or any combination thereof.

In one or more embodiments, the electron transport region 135 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from the emission layer 133.

In one or more embodiments, the electron transport region 135 may include an electron transport layer, and the electron transport layer may be formed using the composition for manufacturing a light-emitting device.

In one or more embodiments, the electron transport region 135 (for example, the buffer layer, the hole blocking layer, the electron control layer, and/or the electron transport layer in the electron transport region 135) may include a metal-free compound including at least one $\pi$ electron-deficient nitrogen-containing $C_1$-$C_{60}$ cyclic group.

In one or more embodiments, the electron transport region 135 may include a compound represented by Formula 601 below:

$$[Ar_{601}]_{xe11}\text{-}[(L_{601})_{xe1}\text{-}R_{601}]_{xe21}, \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ are the same as described in connection with $Q_1$, xe21 may be 1, 2, 3, 4, or 5, at least one selected from $Ar_{601}$, $L_{601}$, and $R_{601}$ may each independently be a $\pi$ electron-deficient nitrogen-containing $C_1$-$C_{60}$ cyclic group unsubstituted or substituted with at least one $R_{10a}$.

In one or more embodiments, when xe11 in Formula 601 is 2 or more, two or more of $Ar_{601}$(s) may be linked via a single bond.

In one or more embodiments, $Ar_{601}$ in Formula 601 may be a substituted or unsubstituted anthracene group.

In one or more embodiments, the electron transport region 135 may include a compound represented by Formula 601-1:

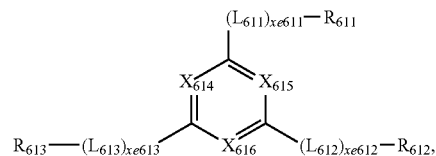

Formula 601-1 wherein, in Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ are the same as described in connection with $L_{601}$, xe611 to xe613 are the same as described in connection with xe1, $R_{611}$ to $R_{613}$ are the same as described in connection with $R_{601}$, and $R_{614}$ to $R_{618}$ may each independently be hydrogen, deuterium, $-F$, $-Cl$, $-Br$, $-I$, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In one or more embodiments, xe1 and xe611 to xe613 in Formulae 601 and 601-1 may each independently be 0, 1, or 2.

The electron transport region 135 may include one of Compounds ET1 to ET45, 2,9-dimethyl-4,7-diphenyl-1,10-phenanthroline (BCP), 4,7-diphenyl-1,10-phenanthroline (Bphen), Alq$_3$, BAlq, TAZ, NTAZ, diphenyl(4-(triphenylsilyl)phenyl)-phosphine oxide (TSPO1), or any combination thereof:

ET1
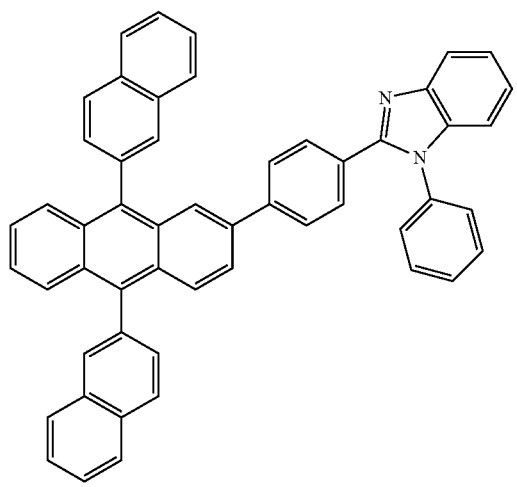
ET2
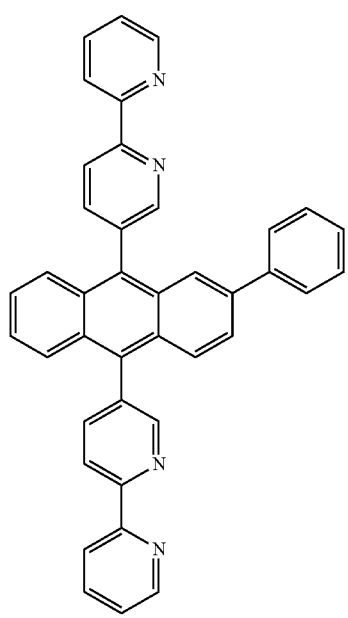
ET3
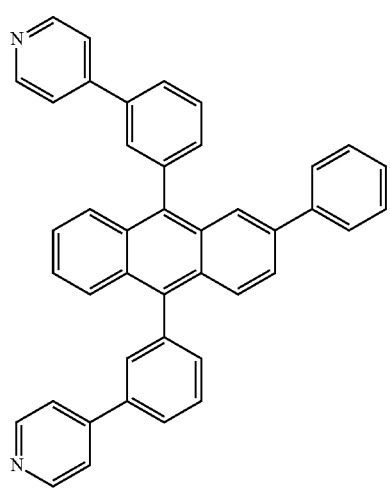
-continued
ET4
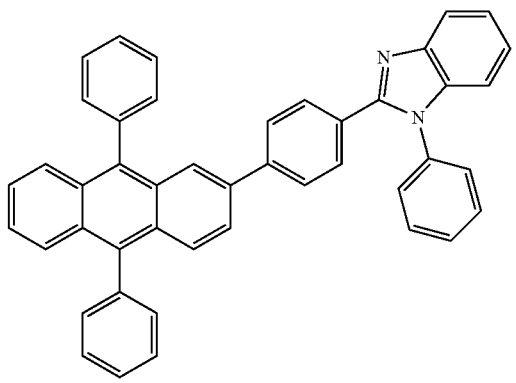
ET5
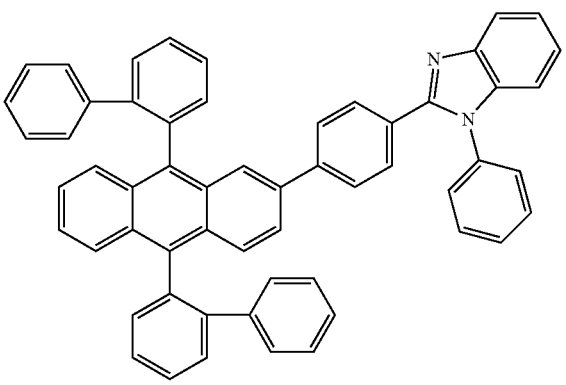
ET6
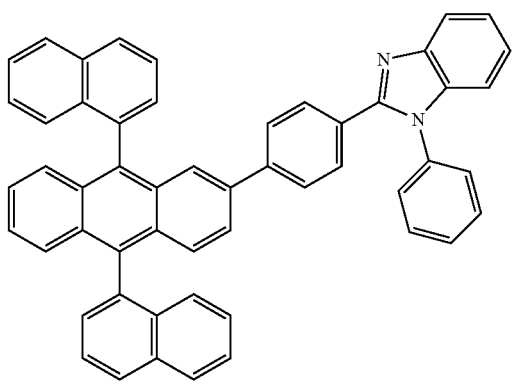

ET7
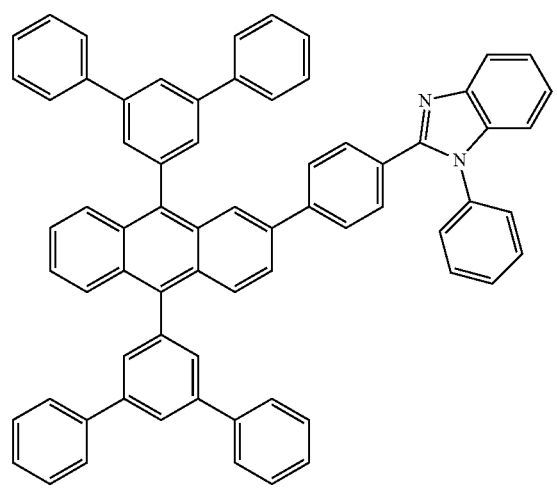
ET8
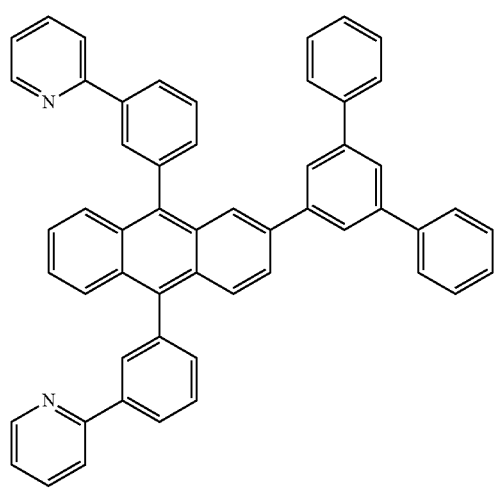
ET9
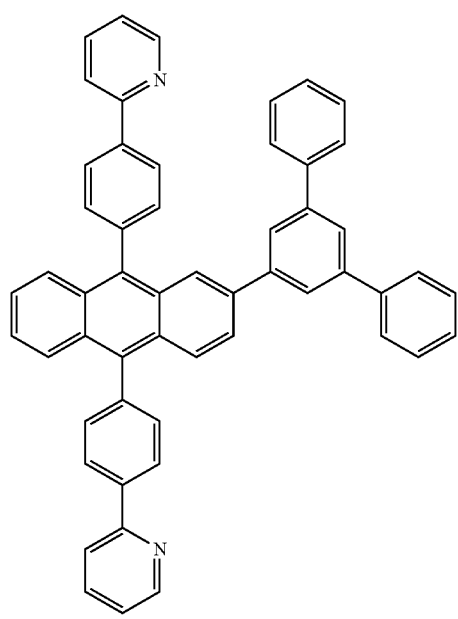
ET10
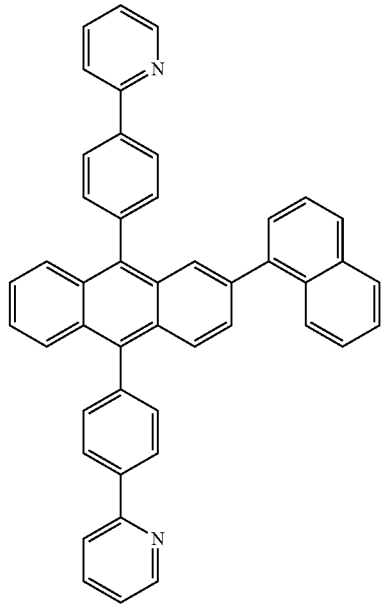
ET11
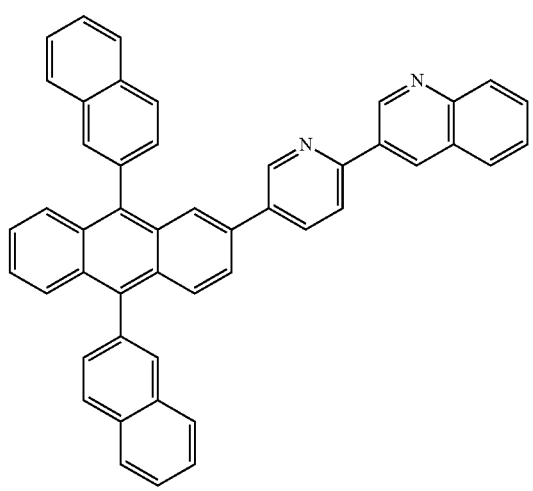
ET12
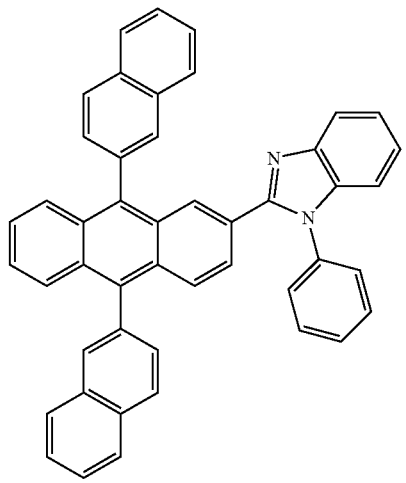

ET13
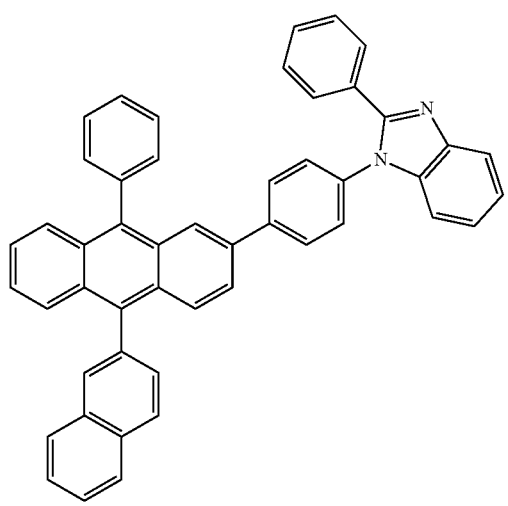
ET14
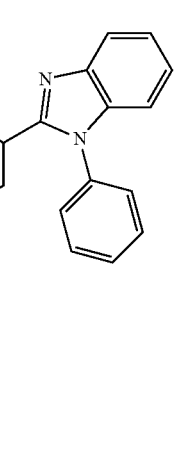
ET15
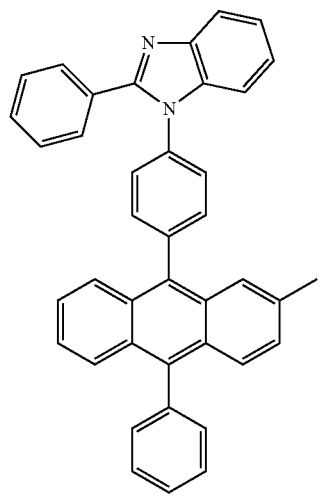
ET16
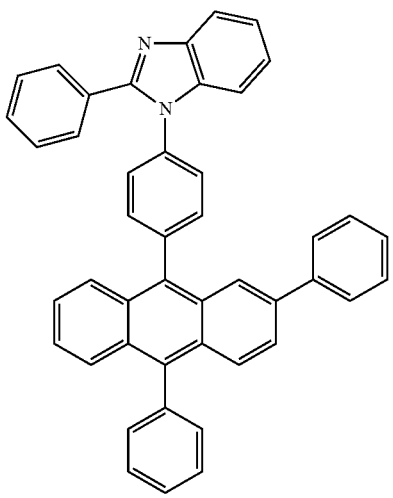
ET17
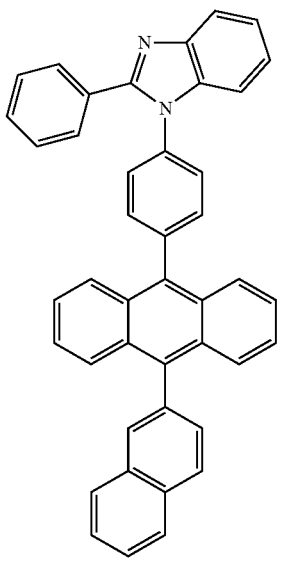
ET18
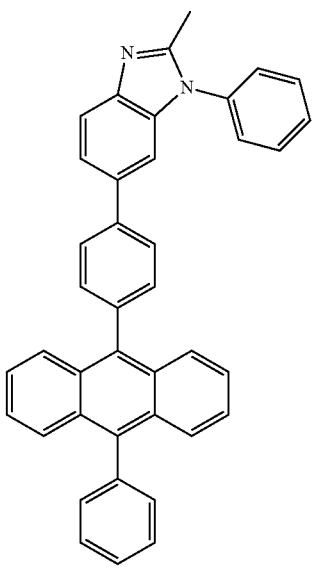

105
-continued
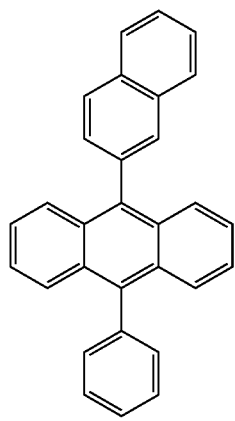
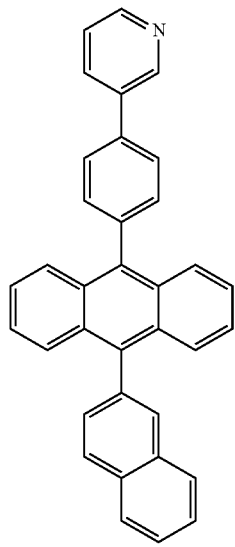
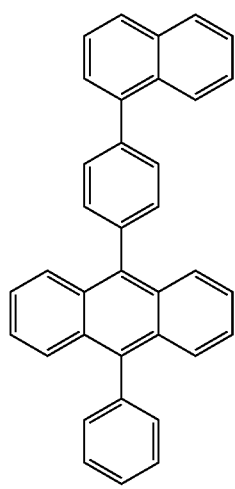
106
-continued
ET19
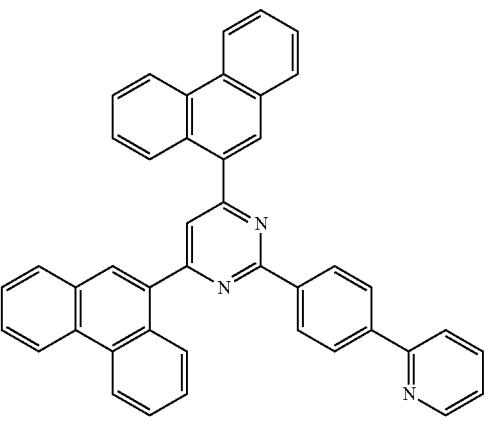
ET22
ET20
ET23
ET21
ET24
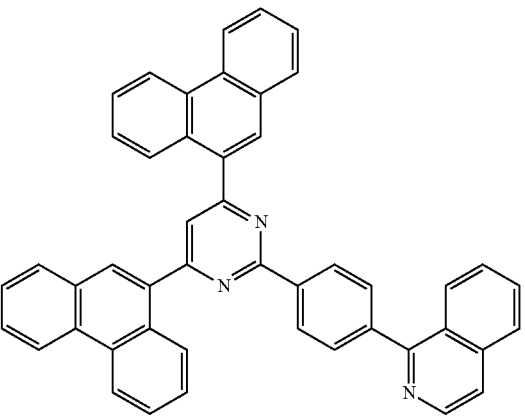

ET25
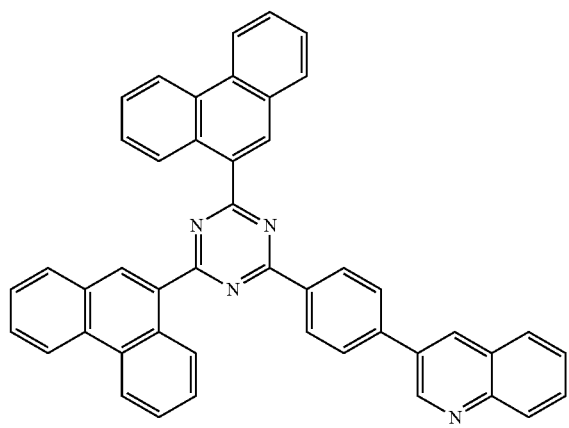
ET26
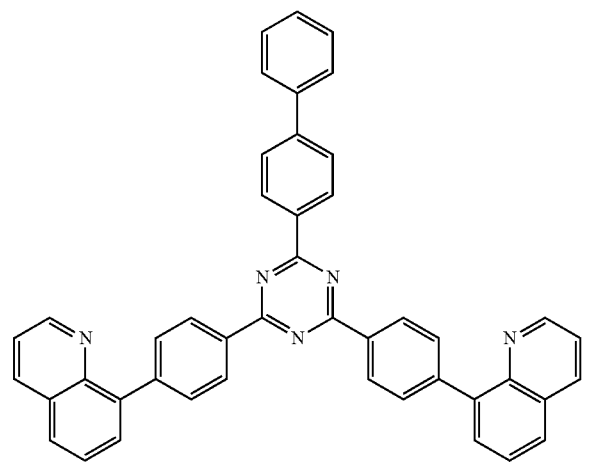
ET27
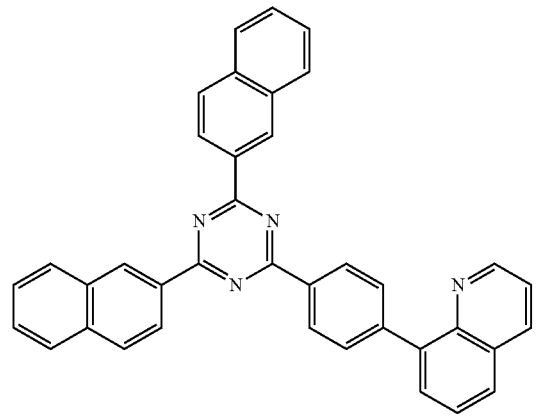
ET28
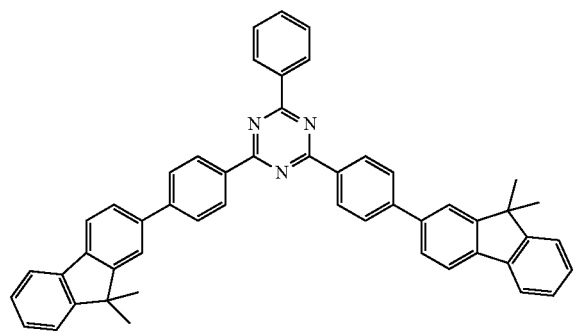
ET29
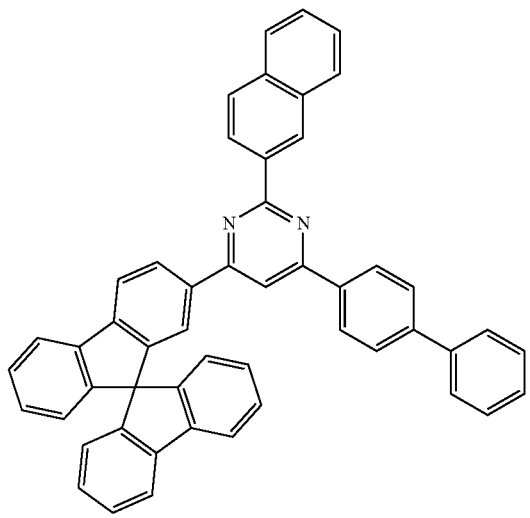
ET30
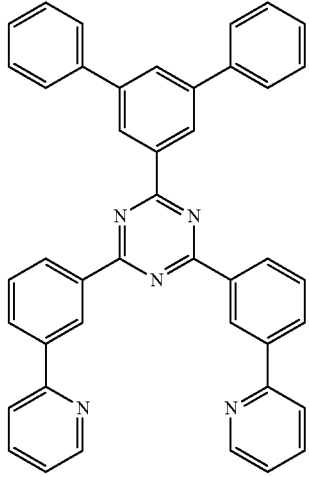

-continued
ET31
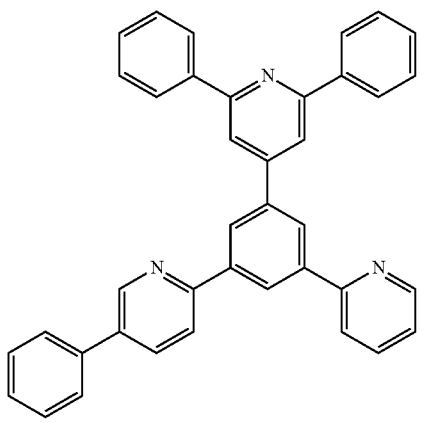
ET32
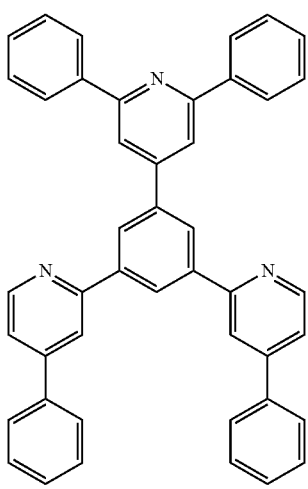
ET33
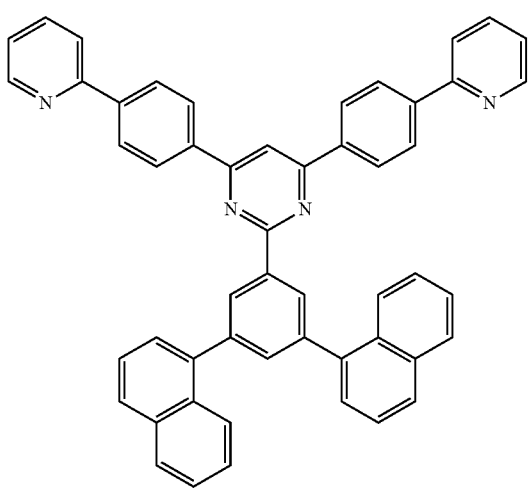
-continued
ET34
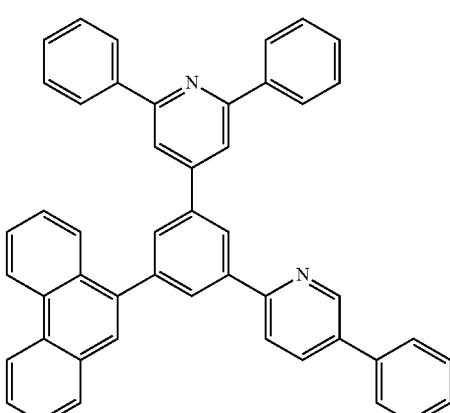
ET35
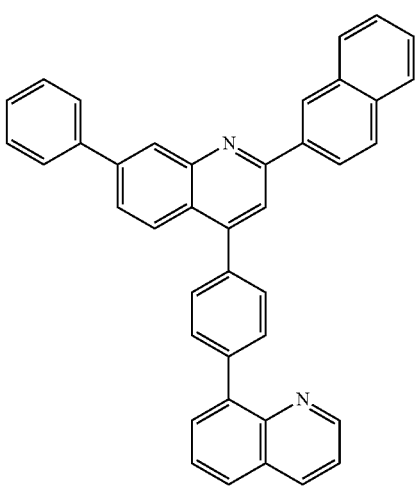
ET36
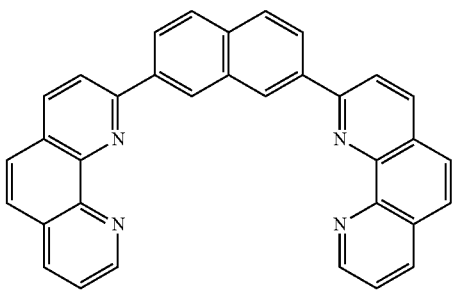
ET37
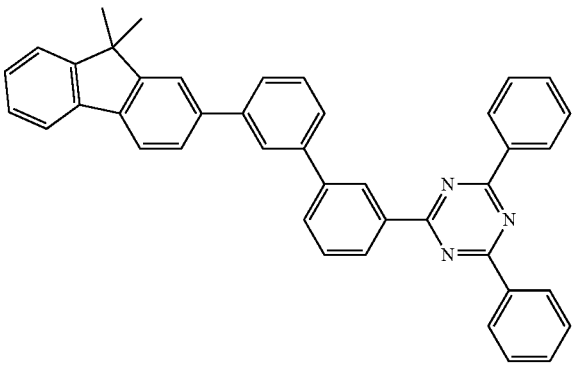

ET38
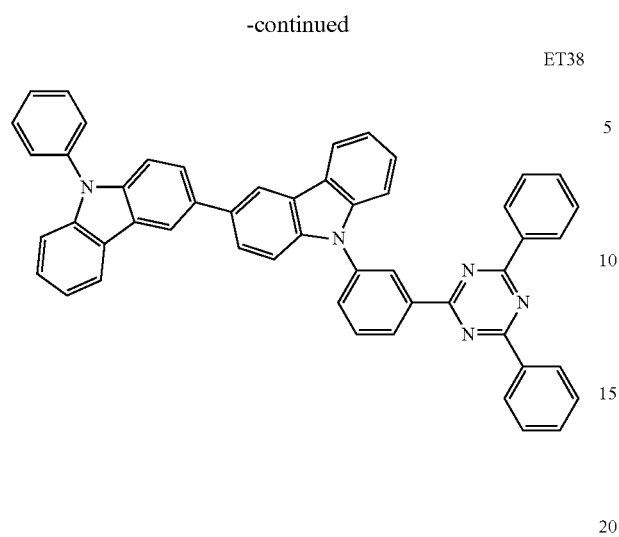
ET39
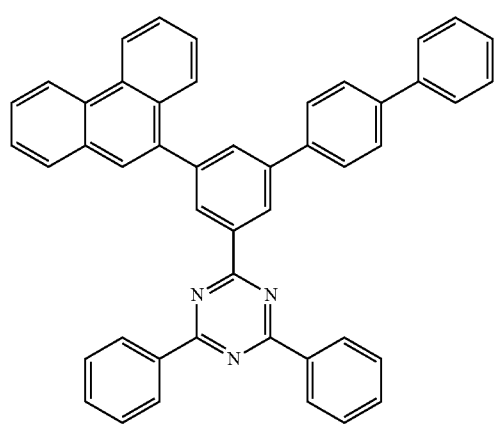
ET40
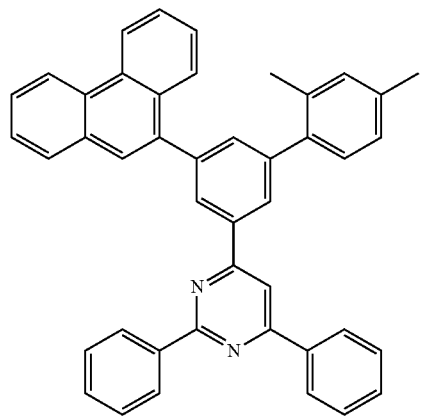
ET41
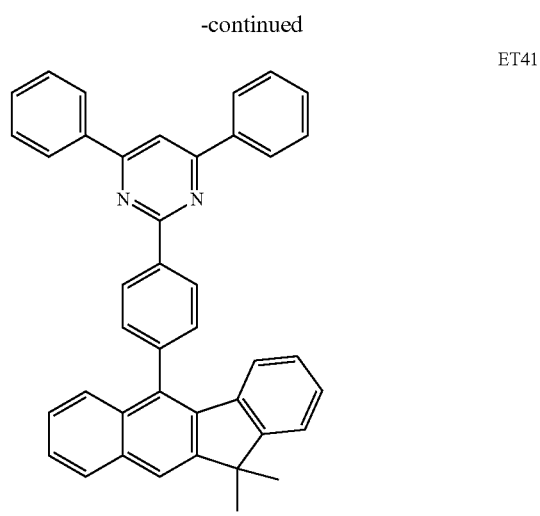
ET42
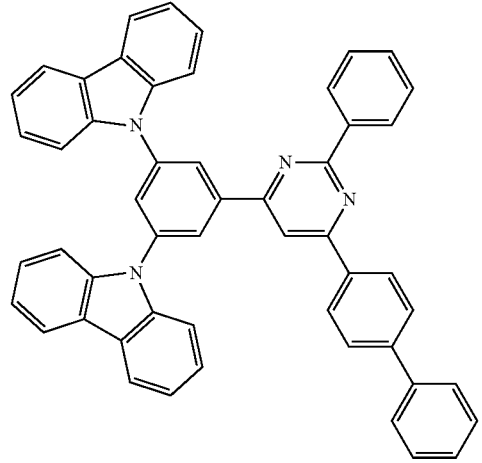
ET43
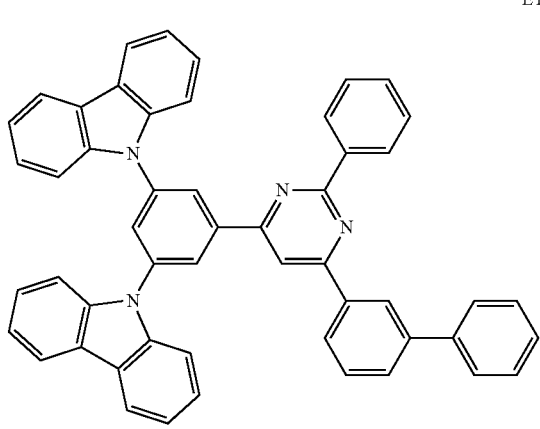

-continued

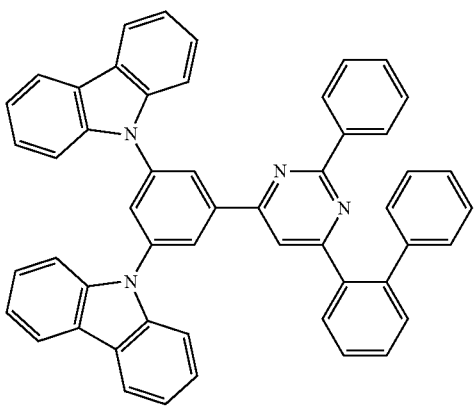
ET44

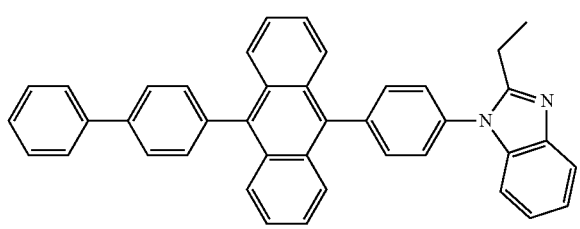
ET45

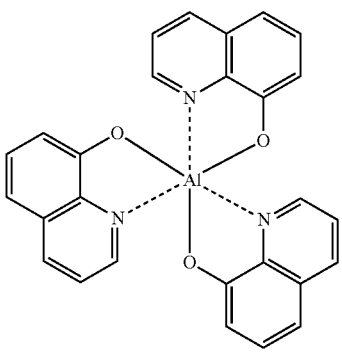
Alq₃

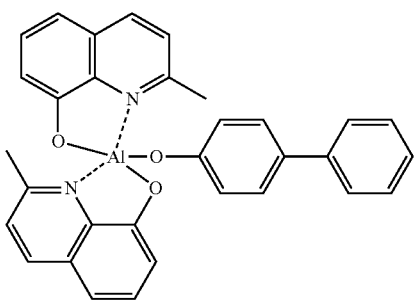
BAlq

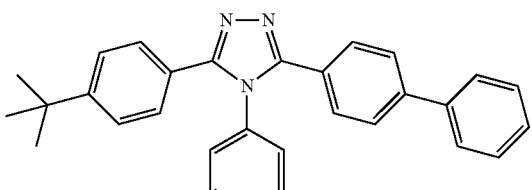
TAZ

-continued

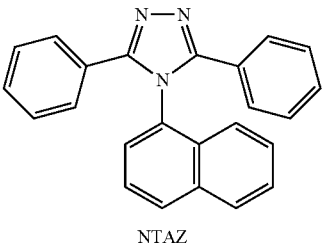
NTAZ

The thickness of the electron transport region 135 may be from about 160 Å to about 5,000 Å, for example, about 100 Å to about 4,000 Å. When the electron transport region 135 includes a buffer layer, a hole blocking layer, an electron control layer, an electron transport layer, or any combination thereof, the thickness of the buffer layer, the hole blocking layer, and the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thicknesses of the buffer layer, hole blocking layer, electron control layer, electron transport layer and/or electron transport layer are within their respective ranges, satisfactory or suitable electron transporting characteristics may be obtained without a substantial increase in driving voltage.

The electron transport region 135 (for example, the electron transport layer in the electron transport region 135) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In one or more embodiments, the metal-containing material may include a Li complex. The Li complex may include, for example, Compound ET-D1 (LiQ) and/or Compound ET-D2:

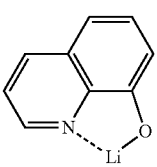
ET-D1

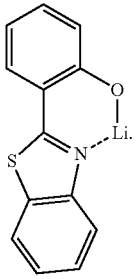

ET-D2

The electron transport region 135 may include an electron injection layer that facilitates the injection of electrons from the second electrode 150. The electron injection layer may be in direct contact with the second electrode 150.

The electron injection layer may have: i) a single-layered structure including (e.g., consisting of) a single layer including (e.g., consisting of) a single material, ii) a single-layered structure including (e.g., consisting of) a single layer consisting of a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, and/or iodides), and/or tellurides of the alkali metal, the alkaline earth metal, and the rare earth metal, or any combination thereof.

The alkali metal-containing compound may include alkali metal oxides, such as $Li_2O$, $Cs_2O$, and/or $K_2O$; alkali metal halides, such as LiF, NaF, CsF, KF, LiI, NaI, CsI, and/or KI; or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal, respectively, and ii) as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may include (e.g., may consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., may consist of) i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. In one or more embodiments, the electron injection layer may be a KI:Yb co-deposited layer, an RbI:Yb co-deposited layer, and/or the like.

When the electron injection layer further includes an organic material, alkali metal, alkaline earth metal, rare earth metal, alkali metal-containing compound, alkaline earth metal-containing compound, rare earth metal-containing compound, alkali metal complex, alkaline earth-metal complex, rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within any of the ranges described above, satisfactory or suitable electron injection characteristics may be obtained without a substantial increase in driving voltage.

Second Electrode 150

The second electrode 150 may be located on the interlayer 130 having the structure according to embodiments of the present disclosure. The second electrode 150 may be a cathode, which is an electron injection electrode, and as the material for the second electrode 150, a metal, an alloy, an electrically conductive compound, or any combination thereof, each having a low work function, may be used.

In one or more embodiments, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode 110, and/or a second capping layer may be located outside the second electrode 150. In one or more embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in the emission layer 133 of the interlayer 130 of the light-emitting device 10 may be extracted toward the outside through the first electrode 110, which is a semi-transmissive electrode or a transmissive electrode, and the first capping layer, and/or light generated in the emission layer 133 of the interlayer 130 of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the emission efficiency of the light-emitting device 10 may be improved.

The first capping layer and second capping layer may each independently include a material having a refractive index (at 589 nm) of about 1.6 or more.

The first capping layer and the second capping layer may each independently be an organic capping layer including an organic material, an inorganic capping layer including an inorganic material, or an organic-inorganic composite capping layer including an organic material and an inorganic material.

At least one selected from the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and/or the amine group-containing compound may be optionally substituted with a substituent containing O, N, S, Se, Si, F, Cl, Br, I, or any combination thereof. In one or more embodiments, at least one selected from the first capping layer and the second capping layer may each independently include an amine group-containing compound.

In one or more embodiments, at least one selected from the first capping layer and the second capping layer may each independently include a compound represented by Formula 201, a compound represented by Formula 202, or any combination thereof.

In one or more embodiments, at least one selected from the first capping layer and the second capping layer may each independently include one of Compounds HT28 to HT33, one of Compounds CP1 to CP6, β-NPB, or any combination thereof:

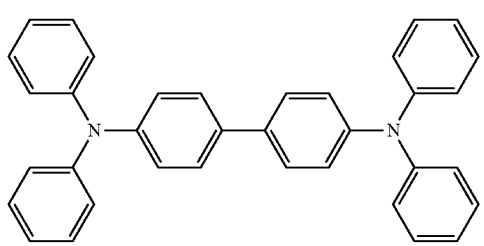
CP1

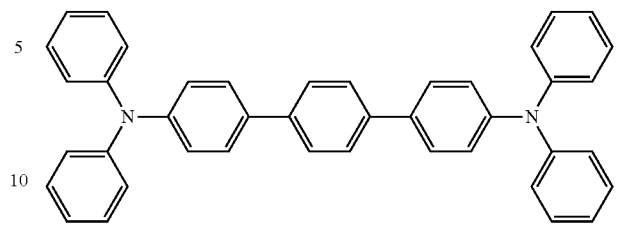
CP2

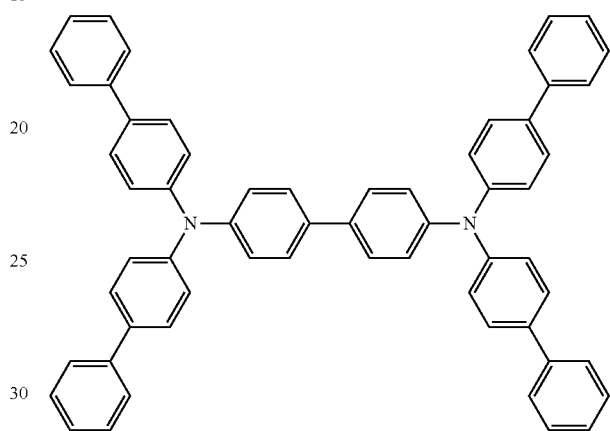
CP3

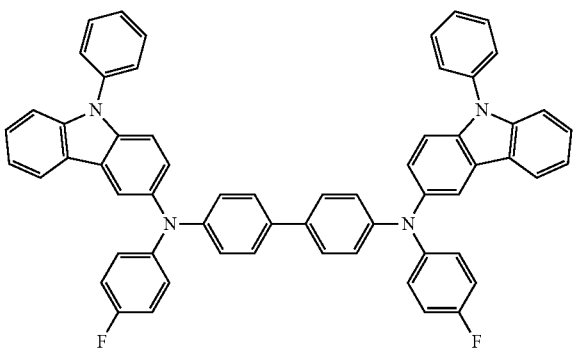
CP4

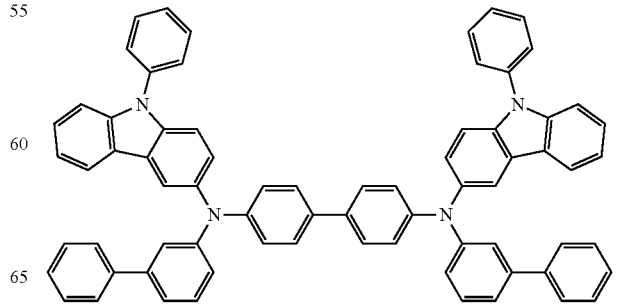
CP5

-continued

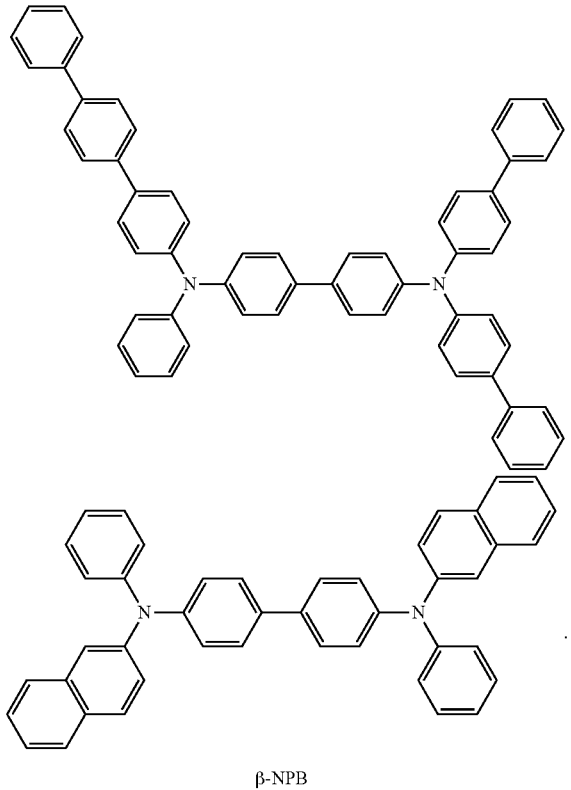

β-NPB

Film

The composition for manufacturing a light-emitting device may be used in various suitable films. According to one or more embodiments of the disclosure, a film formed by the composition for manufacturing a light-emitting device may be provided. The film may be, for example, an optical member (or a light control means) (for example, a color filter, a color conversion member, a capping layer, a light extraction efficiency improvement layer, a selective light absorption layer, a polarizing layer, a quantum dot-containing layer, etc.), a light-shielding member (for example, a light reflecting layer, a light absorbing layer, etc.), a protective member (for example, an insulating layer, a dielectric layer, etc.), and/or the like.

Electronic Apparatus

The light-emitting device may be included in various suitable electronic apparatuses. In one or more embodiments, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In one or more embodiments, the light emitted from the light-emitting device may be blue light or white light. The light-emitting device may be the same as described above. In one or more embodiments, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among (e.g., between) the subpixel areas to define each of the subpixel areas.

The color filter may further include a plurality of color filter areas and light-shielding patterns located among (e.g., between) the color filter areas, and the color conversion layer may include a plurality of color conversion areas and light-shielding patterns located among (e.g., between) the color conversion areas.

The color filter areas (or the color conversion areas) may include a first area emitting (e.g., configured to emit) first color light, a second area emitting (e.g., configured to emit) second color light, and/or a third area emitting (e.g., configured to emit) third color light, and the first color light, the second color light, and/or the third color light may have different maximum emission wavelengths from one another. In one or more embodiments, the first color light may be red light, the second color light may be green light, and the third color light may be blue light. In one or more embodiments, the color filter areas (or the color conversion areas) may include quantum dots. For example, the first area may include a red quantum dot, the second area may include a green quantum dot, and the third area may not include a quantum dot. The quantum dot is the same as described in the present specification. The first area, the second area, and/or the third area may each further include a scatterer.

In one or more embodiments, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. For example, the first light may be blue light, the first first-color light may be red light, the second first-color light may be green light, and the third first-color light may be blue light.

The electronic apparatus may further include a thin-film transistor, in addition to the light-emitting device as described above. The thin-film transistor may include a source electrode, a drain electrode, and an activation layer, wherein any one of the source electrode and the drain electrode may be electrically connected (e.g., electrically coupled) to any one of the first electrode and the second electrode of the light-emitting device.

The thin-film transistor may further include a gate electrode, a gate insulating film, etc.

The activation layer may include crystalline silicon, amorphous silicon, organic semiconductor, oxide semiconductor, and/or the like.

The electronic apparatus may further include a sealing portion for sealing the light-emitting device. The sealing portion and/or the color conversion layer may be located between the color filter and the light-emitting device. The sealing portion allows light from the light-emitting device to be extracted to the outside, while simultaneously (or concurrently) preventing or reducing the penetration of ambient air and/or moisture into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touch screen layer, a polarizing layer, and/or the like. The touch screen layer may be a pressure-sensitive touch screen layer, a capacitive touch screen layer, and/or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic diaries, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various measuring instruments, meters (for example, meters for a vehicle, an aircraft, and/or a vessel), projectors, and/or the like.

Figure 2:
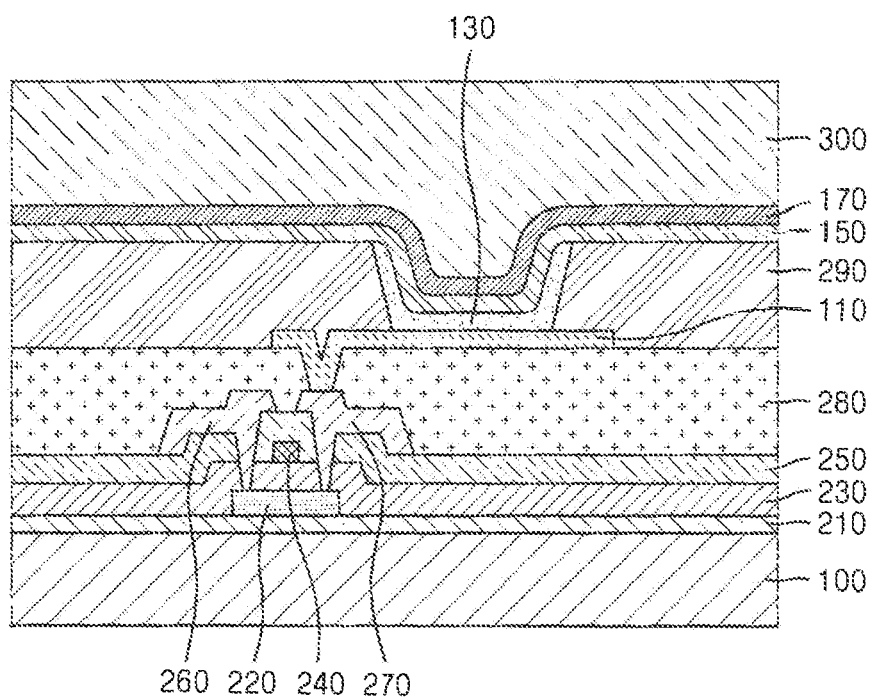
FIGS. 2 and 3 are each a schematic cross-sectional view of a light-emitting apparatus, according to one or more embodiments of the disclosure.
Figure 3:
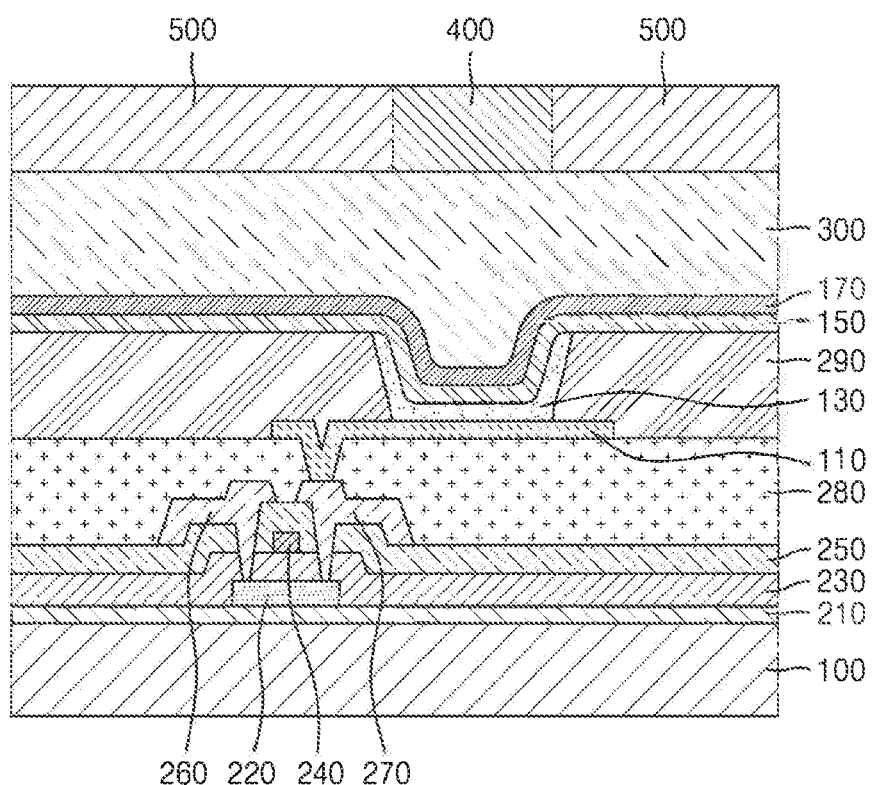

Description of FIGS. 2 and 3

FIG. 2 is a cross-sectional view of a light-emitting apparatus according to one or more embodiments of the disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be formed on the substrate 100. The buffer layer 210 may prevent or reduce penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260, and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact (e.g., physical contact) with the exposed portions of the source region and the drain region of the activation layer 220.

The TFT is electrically connected (e.g., electrically coupled) to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 may be connected (e.g., physically coupled) to the exposed portion of the drain electrode 270.

A pixel-defining layer 290 containing an insulating material may be located on the first electrode 110. The pixel-defining layer 290 exposes a region of the first electrode 110, and an interlayer 130 may be formed in the exposed region of the first electrode 110. The pixel-defining layer 290 may be a polyimide and/or a polyacrylic organic film. In one or more embodiments, at least some layers of the interlayer 130 may extend beyond the upper portion of the pixel-defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or a combination thereof; or a combination of the inorganic film and the organic film.

FIG. 3 is a cross-sectional view of a light-emitting apparatus according to one or more embodiments of the disclosure.

The light-emitting apparatus of FIG. 3 is the same as the light-emitting apparatus of FIG. 2, except that a light-shielding pattern 500 and a functional region 400 are additionally located on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 3 may be a tandem light-emitting device.

Method of Manufacturing Light-Emitting Device

According to one or more embodiments of the disclosure, a method of manufacturing a light-emitting device including a first electrode, a second electrode, and an interlayer located between the first electrode and the second electrode and including an emission layer includes:

forming the emission layer by a first solution process using the composition for manufacturing a light-emitting device.

In one or more embodiments, the first solution process may be performed by using spin coating, slot coating, dip coating, bar coating, roll coating, gravure coating, microgravure coating, wire coating, spray coating, inkjet printing, nozzle printing, screen printing, flexo printing, offset printing, and/or casting.

In one or more embodiments, the first solution process may be performed by using an inkjet printing method. As the inkjet printer used in the inkjet printing method, any suitable inkjet printer may be used.

In one or more embodiments, the method of manufacturing a light-emitting device may further include, after the forming of the emission layer, forming an electron transport layer on the emission layer by a second solution process.

The second solution process is the same as described in connection with the first solution process.

In one or more embodiments, the forming of the electron transport layer may include washing the emission layer out with a solvent used in the second solution process.

For example, the method of manufacturing a light-emitting device includes forming of the emission layer by the first solution and then forming the electron transport layer on the emission layer by the second solution process, and thus layers included in the interlayer may be stacked via a solution process without particular limitations.

In one or more embodiments, in addition to layers formed by a solution process using the above-described composition for manufacturing a light-emitting device, the layers constituting the hole transport region, the emission layer, the layers constituting the electron transport region may each independently be formed in a certain region by using one or more suitable methods such as vacuum deposition, spin coating, casting, Langmuir-Blodgett (LB) deposition, ink-jet printing, laser-printing, and/or laser-induced thermal imaging (LITI).

When layers constituting the hole transport region 131, the emission layer 133, and layers constituting the electron transport region 135 are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as used herein refers to a cyclic group consisting of carbon atoms only as ring-forming atoms and having three to sixty carbon atoms, and the term "$C_1$-$C_{60}$ heterocyclic group" as used herein refers to a cyclic group that has one to sixty carbon atoms and further has, in addition to carbon, at least one heteroatom as a ring-forming atom. The $C_3$-$C_{60}$ carbocyclic group and the $C_1$-$C_{60}$ heterocyclic group may each independently be a monocyclic group including (e.g., consisting of) one ring or a polycyclic group in which two or more rings are condensed with each other. In one or more embodiments, the $C_1$-$C_{60}$ heterocyclic group has 3 to 61 ring-forming atoms.

The "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

In one or more embodiments, the $C_3$-$C_{60}$ carbocyclic group may be i) group T1 or ii) a condensed cyclic group in which two or more groups T1 are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, an indenoanthracene group, etc.), the $C_1$-$C_{60}$ heterocyclic group may be i) group T2, ii) a condensed cyclic group in which two or more groups T2 are condensed with each other, or iii) a condensed cyclic group in which at least one group T2 and at least one group T1 are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which at least one group T3 and at least one group T1 are condensed with each other (for example, the π electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more group T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, the Tr electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", and/or "π electron-deficient nitrogen-containing $C_1$-$C_{60}$ cyclic group" as used herein may refer to a group condensed to any suitable cyclic group or a polyvalent group (for example, a divalent group, a trivalent group, a tetravalent group, etc.), depending on the structure of a formula in connection with which the terms are used. In one or more embodiments, "a benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_1$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at the terminus of the $C_2$-$C_{60}$ alkyl group, and examples thereof may include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at the terminus of the $C_2$-$C_{60}$ alkyl group, and examples thereof may include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof may include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to carbon atoms, at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" used herein refers to a monovalent cyclic group that has three (3) to ten (10) carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to carbon atoms, at least one heteroatom as a ring-forming atom, 1 to 10 carbon atoms, and at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having six (6) to sixty (60) carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. The term "$C_6$-$C_{60}$ arylene group" as used herein refers to a divalent group having the same structure as the $C_6$-$C_{60}$ aryl group. When the $C_6$-$C_{60}$ aryl group and the $C_6$-$C_{60}$ arylene group each independently include two or more rings, the respective rings may be condensed with each other.

The term "$C_1$-$C_{60}$ heteroaryl group" as used herein refers to a monovalent group having a heterocyclic aromatic system that has, in addition to carbon atoms, at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. The term "$C_1$-$C_{60}$ heteroarylene group" as used herein refers to a divalent group having the same structure as the $C_1$-$C_{60}$ heteroaryl group. When the $C_1$-$C_{60}$ heteroaryl group and the $C_1$-$C_{60}$ heteroarylene group each independently include two or more rings, the rings may be condensed with each other.

The term "monovalent non-aromatic condensed polycyclic group" as used herein refers to a monovalent group having two or more rings condensed to each other, only carbon atoms (for example, having 8 to 60 carbon atoms) as ring-forming atoms, and non-aromaticity in its molecular structure when considered as a whole. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (for example, having 1 to 60 carbon atoms), as a ring-forming atom, and non-aromaticity in its molecular structure when considered as a whole. Examples of the monovalent non-aromatic condensed heteropolycyclic group may include an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as a monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$C_7$-$C_{60}$ aryl alkyl group" used herein refers to a group represented by -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" used herein refers to a group represented by -$A_{106}A_{107}$(where $A_{106}$ may be a $C_1$-$C_{59}$ alkylene group, and $A_{107}$ may be a $C_1$-$C_{59}$ heteroaryl group).

$R_{10a}$ may be:
- deuterium (-D), —F, —Cl, —Br, —I, a hydroxyl group, a cyano group, or a nitro group;
- a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
- a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
- —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "hetero atom" as used herein refers to any atom other than a carbon atom. Examples of the heteroatom include O, S, N, P, Si, B, Ge, Se, or any combination thereof.

The term "the third-row transition metal" used herein includes hafnium (Hf), tantalum (Ta), tungsten (W), rhenium (Re), osmium (Os), iridium (Ir), platinum (Pt), gold (Au), and the like.

The term "Ph" as used herein refers to a phenyl group, the term "Me" as used herein refers to a methyl group, the term "Et" as used herein refers to an ethyl group, the term "ter-Bu" or "But" as used herein refers to a tert-butyl group, the term "OMe" as used herein refers to a methoxy group, and "D" refers to deuterium.

The term "biphenyl group" as used herein may refer to "a phenyl group substituted with a phenyl group." For example, the "biphenyl group" may be a substituted phenyl group having a $C_6$-$C_{60}$ aryl group as a substituent.

The term "terphenyl group" as used herein may refer to "a phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

EXAMPLES

Preparation Example 1

DF9 (molecular weight: 739 g/mol, HOMO: −5.34 eV, LUMO: −2.63 eV) and DF10 (molecular weight: 859 g/mol, HOMO: −5.45 eV, LUMO: −2.72 eV) as a dopant were added in an amount (e.g., a total amount) of 1 wt % to a mixed material in which H125 (molecular weight: 532 g/mol, HOMO level: −5.65 eV, LUMO level: −2.94 eV, band gap energy: 2.71 eV) as a first compound and H126 (molecular weight: 791 g/mol, HOMO level: −5.74 eV, LUMO level: −2.39 eV, band gap energy: 3.35 eV) as a second compound are mixed at a weight ratio of 9:1, and the mixed material was added in an amount of 0.01 g to a solvent (1 ml of methyl benzoate), thereby completing the preparation of a composition for manufacturing a light-emitting device. An average molecular weight of the mixed material was 557.9 g/mol.

Preparation Example 2

A composition for manufacturing a light-emitting device was prepared in substantially the same manner as in Preparation Example 1, except that a weight ratio of the first compound and the second compound was changed to 8:2 to thereby prepare a mixed material. An average molecular weight of the mixed material was 583.8 g/mol.

Preparation Example 3

A composition for manufacturing a light-emitting device was prepared in substantially the same manner as in Preparation Example 1, except that a weight ratio of the first compound and the second compound was changed to 7:3 to thereby prepare a mixed material. An average molecular weight of the mixed material was 609.7 g/mol.

Preparation Example 4

A composition for manufacturing a light-emitting device was prepared in substantially the same manner as in Preparation Example 1, except that a weight ratio of the first compound and the second compound was changed to 6:4 to thereby prepare a mixed material. An average molecular weight of the mixed material was 635.6 g/mol.

Preparation Example 5

A composition for manufacturing a light-emitting device was prepared in substantially the same manner as in Preparation Example 1, except that a weight ratio of the first compound and the second compound was changed to 5:5 to thereby prepare a mixed material. An average molecular weight of the mixed material was 661.5 g/mol.

Comparative Preparation Example 1

A composition for manufacturing a light-emitting device was prepared in substantially the same manner as in Preparation Example 1, except that only a first compound was used, without a second compound. An average molecular weight of the first compound was 532 g/mol.

Example 1

As a substrate, a 15 Ω/cm$^2$ ITO glass substrate available from Corning was cut to a size of 50 mm×50 mm×0.7 mm, and sonicated in isopropyl alcohol and pure water each for 30 minutes, thereby completing the manufacture of a transparent electrode. 1 ml of a hole injection layer composition, 1 ml of a hole transport layer composition, and 1 ml of an emission layer composition were formed on the transparent electrode by a solution process by spin coating (condition: 2,500 rpm for the hole injection layer and hole transport layer, 1,500 rpm for the emission layer).

In detail, PEDOT/PSS (5:5) was spin-coated on the washed transparent electrode to thereby form a film having a thickness of 60 nm, which was then baked at 200° C. for 30 minutes, thereby completing the formation of a hole injection layer.

TFB was spin-coated on the hole injection layer to thereby form a film having a thickness of 20 nm, which was then baked at 240° C. for 10 minutes, thereby completing the formation of a hole transport layer.

An emission layer composition was spin-coated on the hole transport layer to thereby form a film having a thickness of 30 nm, which was then baked at 140° C. for 10 minutes, thereby completing the formation of an emission layer.

The composition for manufacturing a light-emitting device prepared in Preparation Example 1 was used as the emission layer composition.

Next, an electron transport material, ET1, was vacuum-deposited on the emission layer to thereby form an electron transport layer having a thickness of 20 nm.

The electron transport layer was dried at 1 torr for 2 minutes and at $10^{-5}$ torr for 10 minutes, and then heated at 200° C. for 30 minutes.

Next, Al was vacuum-deposited on the electron transport layer to thereby form a cathode having a thickness of 100 nm, thereby completing manufacture of a light-emitting device.

The evaporator was a SUNICEL Plus 200 evaporator from Sunic System Co., Ltd.

Example 2

A device was manufactured in substantially the same manner as in Example 1, except that, prior to forming an electron transport layer, a solvent of an electron transport layer composition was spin-coated on the layer structure formed up to the emission layer, and a wash-out process was performed.

Examples 3, 5, 7, and 9 and Comparative Example 1

Devices were manufactured in substantially the same manner as in Example 1, except that compositions for manufacturing a light-emitting device prepared in Preparation Examples 2 to 5 and Comparative Preparation Example 1 were used instead of the composition for manufacturing a light-emitting device prepared in Preparation Example 1.

Examples 4, 6, 8, and 10 and Comparative Example 2

Devices were manufactured in substantially the same manner as in Example 2, except that compositions for manufacturing a light-emitting device prepared in Preparation Examples 2 to 5 and Comparative Preparation Example 1 were used instead of the composition for manufacturing a light-emitting device prepared in Preparation Example 1.

Evaluation Example 1

The driving voltage, luminescence efficiency, and color coordinates of the devices manufactured in Examples 1 to 10 and Comparative Examples 1 and 2 were measured using a Keithley SMU 236 and a luminance meter PR650, and the results are shown in Table 1.

TABLE 1

|  | Driving voltage (V) | Efficiency (cd/A) | CIE_x | CIE_y |
|---|---|---|---|---|
| Example 1 | 5.6 | 3.7 | 0.135 | 0.056 |
| Example 2 | 5.2 | 1.3 | 0.145 | 0.039 |
| Example 3 | 5.7 | 4.2 | 0.130 | 0.063 |
| Example 4 | 5.2 | 2.0 | 0.142 | 0.041 |
| Example 5 | 5.8 | 4.1 | 0.134 | 0.055 |
| Example 6 | 5.4 | 2.0 | 0.141 | 0.043 |
| Example 7 | 6.2 | 4.1 | 0.135 | 0.056 |
| Example 8 | 5.4 | 3.5 | 0.137 | 0.053 |
| Example 9 | 6.6 | 1.4 | 0.131 | 0.068 |
| Example 10 | 6.5 | 1.1 | 0.133 | 0.065 |
| Comparative Example 1 | 5.9 | 4.0 | 0.128 | 0.071 |
| Comparative Example 2 | 6.7 | 0.1 | 0.154 | 0.051 |

Referring to Table 1, when Comparative Examples 1 and 2, in which the second compound was not added, were compared with each other, it may be confirmed that the efficiency decreased sharply (4.0 cd/A→0.1 cd/A) after wash-out, and accordingly, without being bound by any particular theory, it may be understood that the solvent resistance in the Comparative Examples is not good.

In addition, it may be confirmed that as an amount of the second compound added increases (Examples 1 to 8), a reduction in the efficiency according to the presence or absence of the wash-out process decreases, and accordingly, without being bound by any particular theory, it may be understood that the solvent resistance in the Examples is improved.

However, in cases of Examples 9 and 10 where an amount of the first compound added is the same as an amount of the second compound, it may be confirmed that although a reduction in the efficiency according to the presence or absence of the wash-out process is low, efficiency characteristics themselves are not as good as those of other Examples 1 to 8.

Although the composition for manufacturing a light-emitting device has a relatively low molecular weight, a compound with excellent device characteristics and a compound with a relatively large molecular weight are used by mixture, and thus the solvent resistance to other solvents may be improved in a process of manufacturing a light-emitting device.

In addition, because the compound having a large molecular weight has a large band gap, it is possible to suppress or reduce adverse effects on device characteristics.

By using the composition for manufacturing a light-emitting device, a process of forming all layers between the anode and the cathode by a solution process may be possible.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A composition for manufacturing a light-emitting device, the composition comprising:
   a solvent; and
   a first compound and a second compound, each dispersed in the solvent;
   wherein a molecular weight of the first compound is 750 g/mol or less,
   a molecular weight of the second compound is greater than 750 g/mol,
   a lowest unoccupied molecular orbital (LUMO) energy level of the second compound is greater than −2.4 eV,
   a highest occupied molecular orbital (HOMO) energy level of the second compound is less than −5.6 eV, and
   a bandgap energy of the second compound is greater than 3.2 eV, and
   wherein an amount of the first compound is greater than an amount of the second compound.

2. The composition of claim 1, wherein the first compound and the second compound are each a non-dendrimeric compound.

3. The composition of claim 1, wherein an average molecular weight of the first compound and the second compound is 500 g/mol or more.

4. The composition of claim 1, wherein a weight ratio of the first compound to the second compound is from over 5:5 and up to 9:1.

5. The composition of claim 1, further comprising a dopant.

6. The composition of claim 5, wherein a sum of an amount of the first compound and an amount of the second compound is greater than an amount of the dopant.

7. The composition of claim 5, wherein the dopant comprises a phosphorescent dopant, a fluorescent dopant, a delayed fluorescence material, or any combination thereof.

8. The composition of claim 1, wherein the solvent comprises an alcohol-based solvent, an ether-based solvent, an aliphatic hydrocarbon solvent, an aromatic hydrocarbon solvent, or any combination thereof.

9. The composition of claim 1, wherein the solvent comprises n-octane, n-nonane, n-decane, n-undecane, n-dodecane, n-tridecane, n-tetradecane, n-pentadecane, n-hexadecane, 2-methylheptane, 3-methylheptane, 4-methylheptane, 2,2-dimethylhexane, 2,3-dimethylhexane, 2,4-dimethylhexane, 2,5-dimethylhexane, 3,3-dimethylhexane, 3-ethylhexane, 2,2,4-trimethylpentane, 2-methyloctane, 2-methylnonane, 2-methyldecane, 2-methylundecane, 2-methyldodecane, 2-methyltridecane, methylcyclohexane, ethylcyclohexane, 1,1-dimethylcyclohexane, 1,2-dimethylcyclohexane, cycloheptane, methylcycloheptane, bicyclohexyl, decalin, toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, propylanisole, 1-ethylnaphthalene, 2-ethylnaphthalene, 2-ethylbiphenyl, octylbenzene, 1,3-dipropoxybenzene, 4-methoxybenzaldehyde-dimethyl-acetal, 4,4'-difluorodiphenylmethane, diphenylether, 1,2-dimethoxy-4-(1-propenyl)benzene, 2-phenoxytoluene, diphenylmethane, 2-phenylpyridine, dimethyl benzyl ether, 3-phenoxytoluene, 3-phenylpyridine, 2-phenylanisole, 2-phenoxytetrahydrofuran, 1-propyl-4-phenyl benzene, 2-phenoxy-1,4-dimethyl benzene, ethyl-2-naphthyl-ether, dodecylbenzene, 2,2,5-tri-methyl diphenyl ether, dibenzyl-ether, 2,3,5-tri-methyl diphenyl ether, N-methyldiphenylamine, 4-isopropylbiphenyl, α,α-dichlorodiphenyl-methane, 4-(3-phenylpropyl)pyridine, methyl benzoate, ethyl benzoate, n-propyl benzoate, isopropyl benzoate, t-butyl benzoate, benzyl-benzoate, 1,1-bis(3,4-dimethylphenyl)ethane, diethyleneglycol butylmethylether (DEGBME), diethyleneglycol monomethylether (DEGME), diethyleneglycol ethylmethylether (DEGEME), diethyleneglycol dibutylether (DEGDBE), propylene glycol methylether acetate (PGMEA), triethylene glycol monomethylether (TGME), diethyleneglycolmonobutyl ether (DGBE), cyclohexylbenzene, propylene glycol methylether acetate, triethylene glycol monomethylether, diethyleneglycol monobutyl ether, or any combination thereof.

10. A light-emitting device comprising:
    a first electrode;
    a second electrode facing the first electrode, and
    an interlayer between the first electrode and the second electrode,
    wherein the interlayer comprises an emission layer, and
    at least one layer in the interlayer is formed by a solution process utilizing the composition for manufacturing the light-emitting device of claim 1.

11. The light-emitting device of claim 10, wherein the emission layer is formed by a solution process utilizing the composition for manufacturing the light-emitting device.

12. The light-emitting device of claim 10, wherein the emission layer comprises the first compound and the second compound.

13. The light-emitting device of claim 10, wherein the interlayer further comprises a hole transport region between the first electrode and the emission layer, and an electron transport region between the emission layer and the second electrode.

14. The light-emitting device of claim 13, wherein the hole transport region comprises a hole injection layer, a hole transport layer, an emission auxiliary layer, an electron blocking layer, or any combination thereof, and
    the electron transport region comprises a buffer layer, a hole blocking layer, an electron control layer, an electron transport layer, an electron injection layer, or any combination thereof.

15. The light-emitting device of claim 13, wherein the electron transport region comprises an electron transport layer, and the electron transport layer is formed by a solution process.

16. A method of manufacturing a light-emitting device, the light-emitting device comprising a first electrode, a second electrode facing the first electrode, and an interlayer between the first electrode and the second electrode and comprising an emission layer, the method comprising:
    forming the emission layer by a first solution process utilizing the composition for manufacturing the light-emitting device of claim 1.

17. The method of claim 16, wherein the first solution process is at least one selected from spin coating, slot coating, dip coating, bar coating, roll coating, gravure coating, microgravure coating, wire coating, spray coating, inkjet printing, nozzle printing, screen printing, flexo printing, offset printing, and casting.

18. The method of claim 16, further comprising, after the forming of the emission layer, forming an electron transport layer on the emission layer by a second solution process.

19. A method of manufacturing a light-emitting device, the light-emitting device comprising a first electrode, a second electrode facing the first electrode, and an interlayer between the first electrode and the second electrode and comprising an emission layer, the method comprising:

forming the emission layer by a first solution process utilizing a composition for manufacturing the light-emitting device, and after the forming of the emission layer, forming an electron transport layer on the emission layer by a second solution process, wherein the forming of the electron transport layer comprises washing the emission layer out with a solvent utilized in the second solution process, and wherein the composition for manufacturing a light-emitting device comprises:

a solvent; and a first compound and a second compound, each dispersed in the solvent;

wherein a molecular weight of the first compound is 750 g/mol or less, a molecular weight of the second compound is greater than 750 g/mol, a lowest unoccupied molecular orbital (LUMO) energy level of the second compound is greater than −2.4 eV, a highest occupied molecular orbital (HOMO) energy level of the second compound is less than −5.6 eV, and a bandgap energy of the second compound is greater than 3.2 eV.

* * * * *